(12) United States Patent
Tokuhara et al.

(10) Patent No.: US 11,723,225 B2
(45) Date of Patent: Aug. 8, 2023

(54) IMAGING DEVICE AND IMAGING SYSTEM

(71) Applicant: Panasonic Intellectual Property Management Co., Ltd., Osaka (JP)

(72) Inventors: Takeyoshi Tokuhara, Osaka (JP); Sanshiro Shishido, Osaka (JP); Yasuo Miyake, Osaka (JP); Shinichi Machida, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 18/066,675

(22) Filed: Dec. 15, 2022

(65) Prior Publication Data
US 2023/0133421 A1    May 4, 2023

Related U.S. Application Data

(63) Continuation of application No. 17/083,376, filed on Oct. 29, 2020, now Pat. No. 11,563,057, which is a
(Continued)

(30) Foreign Application Priority Data

Nov. 19, 2018  (JP) ................................. 2018-216499

(51) Int. Cl.
H10K 39/32       (2023.01)
H01L 27/146      (2006.01)

(52) U.S. Cl.
CPC ........... *H10K 39/32* (2023.02); *H01L 27/146* (2013.01); *H01L 27/14669* (2013.01)

(58) Field of Classification Search
CPC ............. H01L 27/146; H01L 27/14601; H01L 27/14627; H01L 27/14665; H01L 27/14669; H01L 27/1467; H10K 39/32
See application file for complete search history.

(56) References Cited

U.S. PATENT DOCUMENTS

2009/0072122 A1   3/2009  Tada et al.
2011/0284980 A1   11/2011 Sakoh et al.
(Continued)

FOREIGN PATENT DOCUMENTS

JP   2008-218787   9/2008
JP   2009-038157   2/2009
(Continued)

OTHER PUBLICATIONS

International Search Report of PCT application No. PCT/JP2019/041830 dated Jan. 21, 2020.
(Continued)

*Primary Examiner* — Robert G Bachner
*Assistant Examiner* — Molly K Reida
(74) *Attorney, Agent, or Firm* — McDermott Will & Emery LLP

(57) ABSTRACT

An imaging device including a semiconductor substrate including a first surface that receives light from outside, and a second surface opposite to the first surface; a first transistor located on the second surface; and a photoelectric converter that faces the second surface and that receives light transmitted through the semiconductor substrate. The semiconductor substrate is a silicon substrate or a silicon compound substrate, and the photoelectric converter includes a first electrode electrically connected to the first transistor, a second electrode, and a photoelectric conversion layer that is located between the first electrode and the second electrode and that contains a material which absorbs light having a first wavelength longer than or equal to 1.1 μm, and the material has a quantum nanostructure.

20 Claims, 34 Drawing Sheets

Related U.S. Application Data continuation of application No. PCT/JP2019/041830, filed on Oct. 25, 2019.

(56) References Cited

U.S. PATENT DOCUMENTS

| | | |
|---|---|---|
| 2012/0085890 A1 | 4/2012 | Kurokawa |
| 2012/0204960 A1 | 8/2012 | Kato et al. |
| 2013/0089237 A1 | 4/2013 | Sargent et al. |
| 2015/0048317 A1 | 2/2015 | Sasaki |
| 2018/0047788 A1 | 2/2018 | Nozawa |

FOREIGN PATENT DOCUMENTS

| | | |
|---|---|---|
| JP | 2009-071057 | 4/2009 |
| JP | 2011-119694 | 6/2011 |
| JP | 2011-243753 | 12/2011 |
| JP | 2012-099797 | 5/2012 |
| JP | 2012-114155 | 6/2012 |
| JP | 2015-037121 | 2/2015 |
| JP | 2016-067034 | 4/2016 |
| JP | 2017-188917 | 10/2017 |
| JP | 2018-181957 | 11/2018 |

OTHER PUBLICATIONS

Notice of Allowance dated Oct. 31, 2022 issued in U.S. Appl. No. 17/083,376.

IMAGING DEVICE AND IMAGING SYSTEM

CROSS-REFERENCE TO RELATED APPLICATIONS

This application is a continuation of U.S. patent application Ser. No. 17/083,376, filed on Oct. 29, 2020, which is a continuation of International Patent Application No. PCT/JP2019/041830, filed on Oct. 25, 2019, which claims the benefit of foreign priority of Japanese patent application No. 2018-216499 filed on Nov. 19, 2018, the contents all of which are incorporated herein by reference.

BACKGROUND

1. Technical Field

The present disclosure relates to imaging devices and imaging systems.

2. Description of the Related Art

In the field of light sensors, there is a demand for performing sensing in a limited wavelength region. In such an application, it is common practice to capture images based on a desired wavelength by disposing a wavelength-limiting optical filter in front of an imaging unit. For example, the specification of U.S. Patent Application Publication No. 2013/0089237 discloses a camera module in which an optical filter is disposed above an image sensor.

In the technique described in the specification of U.S. Patent Application Publication No. 2013/0089237, imaging to be performed is switched between imaging in a visible region and imaging in an infrared region by disposing the optical filter. As illustrated in FIG. 10 of the specification of U.S. Patent Application Publication No. 2013/0089237, a band pass filter may be used for filtering a particular wavelength component. Here, as the band pass filter, an interference-type optical filter is generally used. In this case, such an optical filter has a high dependence on an incident angle of light and therefore is unsuitable for image capturing at a wide angle.

On the other hand, Japanese Unexamined Patent Application Publication No. 2012-099797 discloses a photodetector having a multilayer structure including a first photodiode formed of amorphous silicon and a second photodiode formed in the form of a layer of crystalline silicon such as polycrystalline silicon. The first photodiode is located above the second photodiode and detects visible light, while the second photodiode detects infrared light transmitted through the first photodiode. In other words, the first photodiode in this photodetector also functions as an optical filter for reducing visible light incident on the second photodiode.

Meanwhile, Japanese Unexamined Patent Application Publication No. 2015-037121 discloses a solid imaging device in which second and third photoelectric converters are provided respectively on a front surface and a back surface of a single crystal Si substrate in which a first photoelectric converter is formed. The third photoelectric converter includes at part thereof an organic layer formed of quinacridone, while the second photoelectric converter includes at part thereof a silicon germanium layer. These photoelectric converters are stacked in the order of the third photoelectric converter, the first photoelectric converter, and the second photoelectric converter from the light incident side. This multilayer structure makes it possible to individually obtain a signal relating to a green wavelength region component, a signal relating to a blue wavelength region component, and a signal relating to a red wavelength region component in incident light.

SUMMARY

In one general aspect, the techniques disclosed here feature an imaging device including a semiconductor substrate including a first surface that receives light from outside, and a second surface opposite to the first surface; a first transistor located on the second surface; and a photoelectric converter that faces the second surface and that receives light transmitted through the semiconductor substrate. The semiconductor substrate is a silicon substrate or a silicon compound substrate, and the photoelectric converter includes a first electrode electrically connected to the first transistor, a second electrode, and a photoelectric conversion layer that is located between the first electrode and the second electrode and that contains a material which absorbs light having a first wavelength longer than or equal to 1.1 μm, and the material has a quantum nanostructure.

It should be noted that general or specific embodiments may be implemented as an element, a device, an apparatus, a system, an integrated circuit, a method, or any combination of computer programs.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
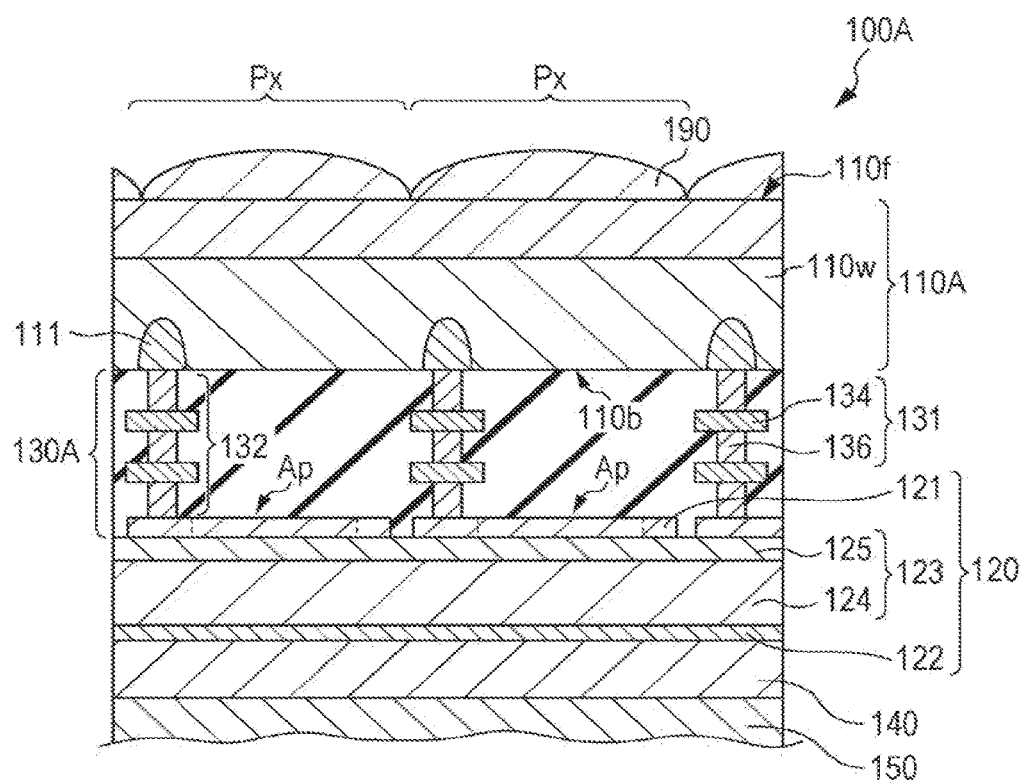
FIG. 1 is a schematic sectional view illustrating a device structure of pixels of an imaging device according to a first embodiment of the present disclosure.

An outline of an embodiment of the present disclosure is as follows.

[Item 1]

An imaging device according to an item 1 of the present disclosure includes:

a semiconductor substrate including a first surface that receives light from outside, and a second surface opposite to the first surface;

a first transistor located on the second surface; and a photoelectric converter that faces the second surface and that receives light transmitted through the semiconductor substrate, in which the semiconductor substrate is a silicon substrate or a silicon compound substrate, the photoelectric converter includes a first electrode electrically connected to the first transistor, a second electrode, and a photoelectric conversion layer that is located between the first electrode and the second electrode and that contains a material which absorbs light having a first wavelength longer than or equal to 1.1 µm, the first electrode is located between the second surface and the photoelectric conversion layer, and a spectral sensitivity of the material in a wavelength region of longer than or equal to 1.0 µm and shorter than 1.1 µm is within a range of more than or equal to 0% and less than or equal to 5% of the maximum value of a spectral sensitivity of the material in a wavelength region of longer than or equal to 1.1 μm.

According to the structure in the item 1, since light having a wavelength shorter than 1.1 μm is absorbed by the semiconductor substrate, a component transmitted through the semiconductor substrate and having a wavelength longer than or equal to 1.1 μm enters the photoelectric converter. Since the photoelectric conversion layer may have spectral sensitivity characteristics demonstrating an absorption peak on a longer wavelength side than the wavelength of 1.1 μm, the imaging device is able to perform near-infrared narrow-band imaging without needing a band pass filter for a narrow band. In addition, having an ability to reduce noise due to light in a wavelength region of longer than or equal to 1.0 μm and shorter than 1.1 μm, the imaging device is particularly advantageous for narrow-band imaging in an infrared region.

[Item 2]

In the imaging device according to item 1, the material may have a quantum nanostructure.

With the structure in item 2, the photoelectric conversion film can be configured to demonstrate almost no absorption of the wavelength region of longer than or equal to 1000 nm and shorter than 1100 nm, which makes it possible to achieve an imaging device having a higher signal-to-noise ratio (SNR) for an infrared narrow band in particular.

[Item 3]

In the imaging device according to item 2, the material may be carbon nanotubes.

With the structure in item 3, the peak of the spectral sensitivity curve of the photoelectric conversion layer has a sharp shape due to a discrete density of states, and therefore it is possible to achieve a pixel having a specifically high sensitivity for a particular wavelength.

[Item 4]

In the imaging device according to item 2, the material may contain at least one selected from the group consisting of a Group III element, a Group IV element, a Group V element, and a Group VI element.

With the structure in item 4, the peak of the spectral sensitivity curve of the photoelectric conversion layer has a sharp shape due to a discrete density of states, and therefore it is possible to achieve a pixel having a specifically high sensitivity for a particular wavelength.

[Item 5]

In the imaging device according to any one of items 2 to 4, the material may absorb light having a second wavelength shorter than 1.1 μm, and the semiconductor substrate may absorb the light having the second wavelength.

With the structure in item 5, since the semiconductor substrate absorbs the light having the second wavelength, the sensitivity for the second wavelength can be effectively eliminated and accordingly be prevented from appearing as the sensitivity of the imaging device.

[Item 6]

In the imaging device according to any one of items 1 to 5, the semiconductor substrate may have a thickness of greater than or equal to 30 μm and less than or equal to 800 μm.

With the structure in item 6, a component having a wavelength shorter than 1.1 μm can be sufficiently attenuated by absorption in the semiconductor substrate.

[Item 7]

The imaging device according to any one of items 1 to 6 may further include a microlens facing the first surface.

[Item 8]

The imaging device according to item 7 may further include a conductive structure that is located between the photoelectric converter and the semiconductor substrate, and that electrically connects the first electrode to the first transistor, and a connecting portion between the first electrode and the conductive structure may be located outside an outer edge of the microlens when viewed in a direction normal to the first surface.

With the structure in item 8, since the connecting portion is located outside the outer rim of the microlens, the light blocking by the conductive structure can be avoided.

[Item 9]

The imaging device according to any one of items 1 to 8 may further include an insulating layer that is located between the photoelectric converter and the semiconductor substrate and that includes a waveguide structure.

With the structure in item 9, infrared light transmitted through the semiconductor substrate can be efficiently guided to the photoelectric converter.

[Item 10]

In the imaging device according to any one of items 1 to 9, the first electrode may have a transmittance of more than or equal to 80% for the light having the first wavelength.

With the structure in item 10, there is no need to provide an aperture, for passing through light, to the first electrode, so that a higher aperture ratio can be achieved easily.

[Item 11]

In the imaging device according to any one of items 1 to 10, the second electrode may have a reflectance of more than or equal to 80% for the light having the first wavelength.

With the structure in item 11, since light having passed through the photoelectric conversion layer can be reflected by the second electrode toward the semiconductor substrate, more light can be made to contribute to photoelectric conversion. In short, the exhibition of higher sensitivity can be expected.

[Item 12]

The imaging device according to any one of items 1 to 11 may further include a sealing film that covers the photoelectric converter.

The structure in item 12 is capable of producing an effect of preventing an oxygen from entering the photoelectric converter.

[Item 13]

The imaging device according to any one of items 1 to 12 may further include a pixel and the pixel may include the photoelectric converter and the first transistor.

[Item 14]

The imaging device according to item 13 may further include one or more photodiodes that are disposed in the semiconductor substrate and that include a first photodiode, and the pixel may further include the first photodiode.

With the structure in item 14, a component in a visible region in incident light can be photoelectrically converted by the first photodiode.

[Item 15]

The imaging device according to item 14 may further include a second transistor that is located on the second surface and that is electrically connected to the first photodiode.

With the structure in item 15, charges generated by the first photodiode are read by the second transistor, and thereby information on the intensity of the component in the visible region in the incident light can also be obtained.

[Item 16]

In the imaging device according to item 14 or 15, the one or more photodiodes may include a plurality of photodiodes and the pixel may include the plurality of photodiodes.

[Item 17]

The imaging device according to any one of items 13 to 16 may further include a color filter that faces the first surface, and the color filter may transmit substantially no light in a wavelength region of longer than or equal to 0.75 µm and shorter than 1.1 µm.

The structure in item 17 is capable of suppressing generation of unnecessary charges due to photoelectric conversion of infrared light by the first photodiode, and therefore preventing the white balance from being lost.

[Item 18]

The imaging device according to any one of items 1 to 16 may further include a band stop filter that faces the first surface and that transmits substantially no light in a wavelength region of longer than or equal to 0.75 µm and shorter than 1.1 µm.

The structure in item 18 is capable of suppressing generation of unnecessary charges due to photoelectric conversion of infrared light by the first photodiode, and therefore preventing the white balance from being lost.

[Item 19]

The imaging device according to any one of items 1 to 12 may further include a plurality of pixels, each of the plurality of pixels may include the photoelectric converter and the first transistor, and the photoelectric conversion layer included in the plurality of pixels may be a continuous single layer.

[Item 20]

An imaging system according an item 20 of the present disclosure includes the imaging device according to any one of items 1 to 19, and a light source that emits light in a wavelength region of longer than or equal to 1.1 µm.

On an occasion where, for example, nightfall approaches or the like, the structure in item 20 performs imaging while causing the light source to emit infrared light and thereby is capable of more surely obtaining a bright image based on infrared light.

Hereinafter, embodiments of the present disclosure will be described in detail with reference to the drawings. Note that each of the embodiments described below illustrates a general or specific example. The numeric values, shapes, materials, constituent elements, layout and connection forms of the constituent elements, steps, the order of the steps, and so on described in the following embodiments are just examples and are not intended to limit the present disclosure. Any two or more of the various embodiments described in the present description may be combined with each other as long as no contradiction arises. Among the constituent elements described in the following embodiments, the constituent elements not described in the independent claim specifying the highest concept are described as optional constituent elements. In the following description, the same reference sign denotes constituent elements having substantially the same function, and the explanation thereof is omitted in some cases. In addition, some elements are omitted from illustration to avoid excessive complication of the drawings.

First Embodiment

FIG. 1 illustrates a device structure of pixels in an imaging device according to a first embodiment of the present disclosure. FIG. 1 schematically illustrates a cross section of a part taken from an imaging device 100A according to the first embodiment of the present disclosure. As illustrated, the imaging device 100A includes multiple pixels Px two-dimensionally disposed, for example. Here, the number and layout of the pixels Px are not limited to the example illustrated in FIG. 1 but may be any desired ones. If an imaging device includes at least one pixel Px, the imaging device can be used as a photodetector element. If the pixels Px are disposed one-dimensionally, the imaging device 100A may be used as, for example, a line sensor.

The imaging device 100A mainly includes a semiconductor substrate 110A in which a well 110w is formed, and a photoelectric converter 120. The semiconductor substrate 110A includes a first surface 110f that is a light incident surface, and a second surface 110b located opposite to the first surface 110f, and the photoelectric converter 120 is located at the second surface 110b side of the semiconductor substrate 110A as schematically illustrated in FIG. 1. An insulating layer 130A is located between the semiconductor substrate 110A and the photoelectric converter 120, and the photoelectric converter 120 is disposed on the insulating layer 130A.

The insulating layer 130A typically has a multilayer structure including multiple insulating interlayers. Each of the layers constituting the insulating layer 130A is formed of, for example, silicon dioxide. The insulating layer 130A internally includes a multilayer wire 131. The multilayer wire 131 is formed of, for example, Cu or the like and includes multiple wiring layers 134, vias 136 that connect wires in the different layers to each other, and so on.

As illustrated in FIG. 1, the photoelectric converter 120 includes multiple pixel electrodes 121, a counter electrode 122, and a photoelectric conversion layer 123 sandwiched between the counter electrode 122 and the multiple pixel electrodes 121. In the structure illustrated in FIG. 1, the counter electrode 122 is provided in the form of a single electrode continuous over the multiple pixels Px in the photoelectric converter 120, and the photoelectric conversion layer 123 is also provided in the form of a single layer continuous over the multiple pixels Px as well. In contrast, one pixel electrode 121 is provided corresponding to each of the pixels Px. In other words, each pixel Px includes the pixel electrode 121, a part of the counter electrode 122, and a part of the photoelectric conversion layer 123. In the example illustrated in FIG. 1, multiple microlenses 190 are disposed at the first surface 110f side of the semiconductor substrate 110A so as to correspond to the respective pixels Px.

Each of the pixels Px further includes a part of the aforementioned semiconductor substrate 110A. In the embodiment of the present disclosure, a substrate mainly containing silicon is used as the semiconductor substrate 110A. Here, "mainly containing silicon" means to exclude the case where silicon is contained as a dopant. Examples of the substrate mainly containing silicon are substrates each containing silicon or a silicon compound as a main component, that is, a Si substrate, a so-called SiGe substrate containing SiGe mixed crystals, and so forth.

As schematically illustrated in FIG. 1, multiple first transistors 111 are formed in the semiconductor substrate 110A. These first transistors 111 are typically signal detection transistors each formed in the form of an electric field-effect transistor (FET) on the second surface 110b side of the semiconductor substrate 110A. Each of the multiple first transistors 111 forms, for example, a source follower, and thereby outputs an image signal. In the following description, a P-type Si substrate is described as an example of the semiconductor substrate 110A. In this case, the multiple first transistors 111 are typically N-channel MOSFETs.

Each of the pixels Px includes the aforementioned first transistor 111. The first transistor 111 in each pixel Px has an electric connection with the corresponding pixel electrode 121 of the photoelectric converter 120. In this example, the first transistor 111 is electrically connected to the corresponding pixel electrode 121 via a conductive structure 132 located between the semiconductor substrate 110A and the photoelectric converter 120. The conductive structure 132 is a structure composed of a part of the aforementioned multilayer wire 131 including parts of the wiring layers 134 and the vias 136. In the semiconductor substrate 110A, an element isolation region that electrically isolates the first transistor 111 for each pixel Px is also formed although not illustrated in FIG. 1.

The pixel electrode 121 provided in the photoelectric converter 120 for each pixel Px may be formed of any of Al, Cu, Ti, TiN, Ta, TaN, Mo, Ru, Pt, and so on. In this example, an aperture Ap is formed at a center portion of the pixel electrode 121 such that light can pass through the pixel electrode 121 to the photoelectric conversion layer 123. As described above, the conductive structure 132 that electrically connects the pixel electrode 121 of each pixel Px to the corresponding first transistor 111 is formed of a material that basically blocks light such as Cu. For this reason, the conductive structure 132 is disposed at a position not covering this aperture Ap when viewed in a direction normal to the semiconductor substrate 110A. Similarly, the first transistor 111 is also typically disposed at a position not covering this aperture Ap.

Instead, the pixel electrode 121 may be formed of a material that transmits infrared rays such as ITO, as described later. Also in this case, the conductive structure 132 is disposed at a position where the conductive structure 132 does not block the progress of light traveling toward the photoelectric conversion layer 123 through the semiconductor substrate 110A, for example, at a position off the center of the pixel Px. Note that, in the present description, all electromagnetic waves including infrared rays and ultraviolet rays are referred to as "light" for convenience. The pixel electrode 121 is located between the photoelectric conversion layer 123 and the second surface 110b of the semiconductor substrate 110A.

The counter electrode 122 of the photoelectric converter 120 is located father from the semiconductor substrate 110A than the pixel electrodes 121 are. In other words, the counter electrode 122 is located opposite to the pixel electrodes 121 across the photoelectric conversion layer 123.

In the structure illustrated in FIG. 1, the photoelectric conversion layer 123 includes a photoelectric conversion film 124 and an electron blocking layer 125. The electron blocking layer 125 is disposed between the photoelectric conversion film 124 and the multiple pixel electrodes 121. The photoelectric conversion layer 123 receives incident light to generate positive and negative charge pairs in the photoelectric conversion layer 123. For example, when a predetermined voltage is applied to the counter electrode 122 to make the potential of the counter electrode 122 higher than the potential of the pixel electrode 121, the pixel electrode 121 can collect the positive charge of the charge pair.

In the embodiment of the present disclosure, a material that absorbs light with a first wavelength longer than or equal to 1.1 µm is selected as a material for the photoelectric conversion film 124. As described in detail later, the photoelectric conversion film 124 contains a material that exhibits quantum confinement, such as carbon nanotubes or quantum dots. The material such as carbon nanotubes or quantum dots has characteristics demonstrating an absorption peak specific to each particular wavelength. Therefore, the photoelectric conversion film formed using such a material as a photoelectric conversion material demonstrates spectral sensitivity characteristics having sharp absorption peaks, unlike broad absorption characteristics demonstrated by a device formed in semiconductor crystals such as an embedded photodiode.

However, even if carbon nanotubes or quantum dots with discrete absorption peaks are used as a main photoelectric conversion material to be involved in the generation of charges for use as signal charges, an absorption peak due to a resonance corresponding to higher energy may exist in the wavelength region of shorter than 1.1 µm. In addition, when the photoelectric conversion layer contains an acceptor or a donor for charge separation, light having a wavelength shorter than 1.1 µm may be absorbed by the material for charge separation. Such unintended absorption in the wavelength region of shorter than 1.1 µm can be a factor that lowers the SNR in the case of performing narrow-band imaging in the wavelength region of longer than or equal to 1.1 µm.

However, in the structure illustrated in FIG. 1, the semiconductor substrate 110A is interposed between the photoelectric converter 120 and the microlenses 190. The first surface 110f of the semiconductor substrate 110A constitutes a light-receiving surface that receives light from outside, and therefore the photoelectric conversion layer 123 receives light transmitted through the semiconductor substrate 110A. As is well known, silicon absorbs light having a wavelength shorter than 1.1 µm corresponding to its band gap and transmits light having a wavelength longer than or equal to 1.1 µm. Therefore, the semiconductor substrate 110A functions as a long pass filter, so that the photoelectric conversion layer 123 receives a component with the wavelength longer than or equal to 1.1 µm transmitted through the semiconductor substrate 110A out of the light incident on the first surface 110f of the semiconductor substrate 110A.

Furthermore, as described above, the photoelectric conversion layer 123 contains a material that exhibits quantum confinement, and therefore has spectral sensitivity characteristics that demonstrate a sharp absorption peak on a longer wavelength side than the wavelength of 1.1 µm, which is equivalent to the cut-on wavelength of the long pass filter. Therefore, when light is incident on the photoelectric conversion layer 123 via the semiconductor substrate 110A, it is possible to obtain spectral sensitivity characteristics that specifically absorb light having a certain wavelength of more than or equal to 1.1 µm. In other words, it is possible to perform imaging for light with a specific wavelength, for example, in the near infrared region, without needing a narrow-band pass filter.

Here, in the technique described above in Japanese Unexamined Patent Application Publication No. 2012-099797, the first photodiode formed of amorphous silicon also functions as the optical filter. However, the silicon in the amorphous form does not demonstrate sufficient absorption in a wavelength region of 700 nm to 800 nm. More specifically, in narrow-band imaging in a wavelength region of, for example, longer than or equal to 900 nm, amorphous silicon hardly functions as a filter that cuts infrared light. As a result, even light in a wavelength region of 700 nm to 800 nm, which is not necessary for narrow-band imaging, is photoelectrically converted, leading to an increase in noise. Moreover, in the technique described in Japanese Unexamined Patent Application Publication No. 2012-099797, the second photodiode for detecting infrared light is formed in the form of a crystalline silicon layer. The crystalline silicon absorbs light up to a wavelength region of about 1100 nm. For this reason, when the crystalline silicon is used for narrow-band imaging in the wavelength region of longer than or equal to 900 nm, light with a wavelength longer than the target wavelength is also photoelectrically converted. In other words, such a broad sensitivity covering even a longer wavelength side adversely works and leads to an increase in noise.

In contrast, in the embodiment of the present disclosure, although light is made incident on the photoelectric conversion layer via the semiconductor substrate mainly containing silicon, a material that exhibits quantum confinement is used as the material for the photoelectric conversion film. In this case, a material that demonstrates almost no absorption in a wavelength region of, for example, longer than or equal to 1000 nm and shorter than 1100 nm can be selected as the material for the photoelectric conversion film. Thus, even if light having a wavelength longer than or equal to 1000 nm and shorter than 1100 nm is incident on the photoelectric conversion film via the semiconductor substrate, it is possible to avoid the generation of noise due to such a component. In other words, it is possible to provide an imaging device achieving a high SNR particularly for an infrared narrow band.

Hereinafter, detailed description will be given of the device structure of the pixels Px and the structure of the photoelectric conversion layer 123.

Figure 2:
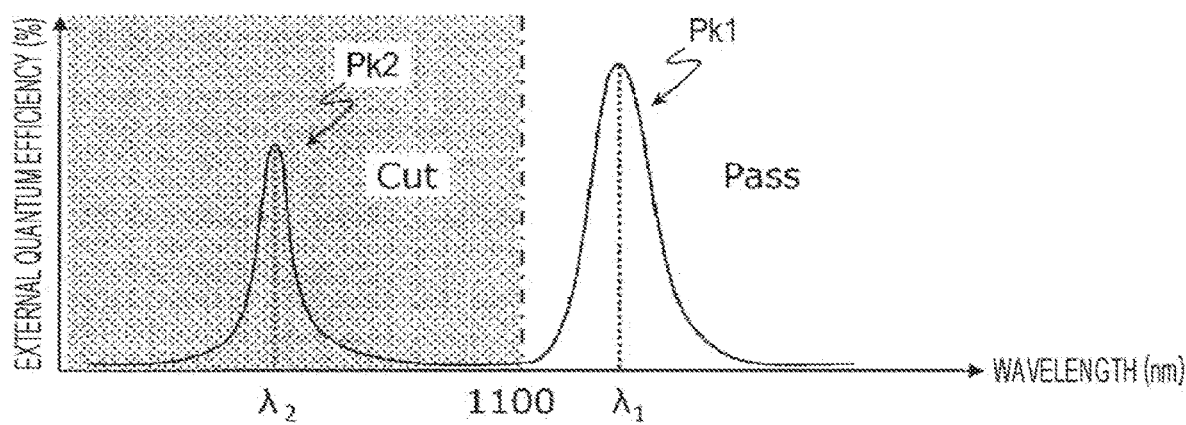
FIG. 2 is a diagram illustrating an exemplary spectral sensitivity curve regarding a main photoelectric conversion material contained in a photoelectric conversion layer.

FIG. 2 presents an exemplary spectral sensitivity curve regarding the main photoelectric conversion material contained in the photoelectric conversion layer 123. In the example presented in FIG. 2, the spectral sensitivity curve of the photoelectric conversion layer 123 has a first peak Pk1 at a first wavelength $\lambda_1$ that is a wavelength longer than or equal to 1.1 μm. The first wavelength $\lambda_1$ is a wavelength within a range of, for example, longer than or equal to 1.1 μm and shorter than or equal to 2 μm. The peak in the spectral sensitivity curve, in other words, the sensitivity peak is synonymous with the absorption peak which is the local maximum value in the absorption spectrum. The first peak Pk1 is one of the peaks appearing in the spectral sensitivity curve, and is specified as the sensitivity peak appearing in the wavelength region of longer than or equal to 1.1 μm.

The first peak Pk1 is relatively sharp, and the full width at half maximum FWHM of the first peak Pk1 is typically shorter than or equal to 200 nm. In the embodiment of the present disclosure, the main photoelectric conversion material to be involved in the generation of charges for use as signal charges is such that the spectral sensitivity in the wavelength region of longer than or equal to 1.0 μm and shorter than 1.1 μm may be within a range of more than or equal to 0% and less than or equal to 5% of the maximum value of the spectral sensitivity in the wavelength region of longer than or equal to 1.1 μm. The above range of the spectral sensitivity in the wavelength region of longer than or equal to 1.0 μm and shorter than 1.1 μm in the main photoelectric conversion material to be involved in the generation of signal charges is advantageous particularly for narrow-band imaging in the infrared region because noise due to light in the wavelength region of longer than or equal to 1.0 μm and shorter than 1.1 μm can be reduced. A typical example of the material demonstrating such spectral sensitivity characteristics is a material that exhibits a quantum confinement effect such as carbon nanotubes or quantum dots. The above-described first peak Pk1 may be an absorption peak corresponding to the E11 transition of carbon nanotubes, for example. Also in the case where quantum dots are used as the photoelectric conversion material for the photoelectric conversion film 124, similar spectral sensitivity characteristics can be obtained because the density of states is discrete as in the case of carbon nanotubes.

In the case where a material that can exhibit quantum confinement is used as the material for the photoelectric conversion film 124, the photoelectric conversion layer 123 can easily achieve a relatively low spectral sensitivity of about 50% or less, in particular, on a longer wavelength side than the first wavelength $\lambda_1$ at which the first peak Pk1 appears. In other words, use of a material that can exhibit quantum confinement as the photoelectric conversion material for the photoelectric conversion film 124 brings about an advantage of no needing a filter that cuts light on the longer wavelength side than the first wavelength $\lambda_1$. Focusing on the shorter wavelength side than the first wavelength $\lambda_1$, the spectral sensitivity of the photoelectric conversion layer 123 as a whole may not decrease as much as in the region on the longer wavelength side than the first wavelength $\lambda_1$ due to the influence of the second optical transition or the absorption by the acceptor or donor in the photoelectric conversion layer and the absorption in the ultraviolet region by the electron blocking layer 125. On the shorter wavelength side than the first wavelength $\lambda_1$, it is possible to produce a region having a relatively low spectral sensitivity, more specifically, a spectral sensitivity lower than the first peak Pk1.

The spectral sensitivity curve particularly regarding the material to be involved in the generation of signal charges in the photoelectric conversion layer 123 may have multiple peaks including the first peak Pk1. In the example presented in FIG. 2, the spectral sensitivity curve has a second peak Pk2 at a second wavelength $\lambda_2$ in addition to the first peak Pk1. The second wavelength $\lambda_2$ is, for example, a wavelength corresponding to the second optical transition. In this case, the first peak Pk1 corresponds to the first optical transition of the material to be involved in the generation of signal charges, and is located at the longest wavelength position among the multiple peaks. In other words, the second peak Pk2 is a second absorption peak among the multiple peaks when counted from the long wavelength side. Here, the first optical transition is the optical transition at the lowest energy allowed in the selection rule of the optical transition, and the second optical transition is the optical transition at the second lowest energy.

As schematically presented in FIG. 2, the second wavelength $\lambda_2$ at which the second peak Pk2 appears may be shorter than 1.1 μm. Here, in the embodiment of the present disclosure, light transmitted through the semiconductor substrate mainly containing silicon, typically a Si substrate, is incident on the photoelectric conversion layer 123. In addition, as described above, the silicon absorbs light having a wavelength shorter than 1.1 μm. For this reason, the light having the second wavelength $\lambda_2$ that is shorter than 1.1 μm in the light incident on the imaging device is attenuated while passing through the semiconductor substrate, and scarcely reaches the photoelectric conversion layer 123. Even when the material for the photoelectric conversion film 124 has an absorption peak at the second wavelength $\lambda_2$, components at and around the second wavelength $\lambda_2$ are blocked by the semiconductor substrate and do not contribute to the generation of signal charges through photoelectric conversion. Therefore, it is possible to selectively obtain a low-noise image signal based on the component having the first wavelength $\lambda_1$ in the incident light.

Figure 3:
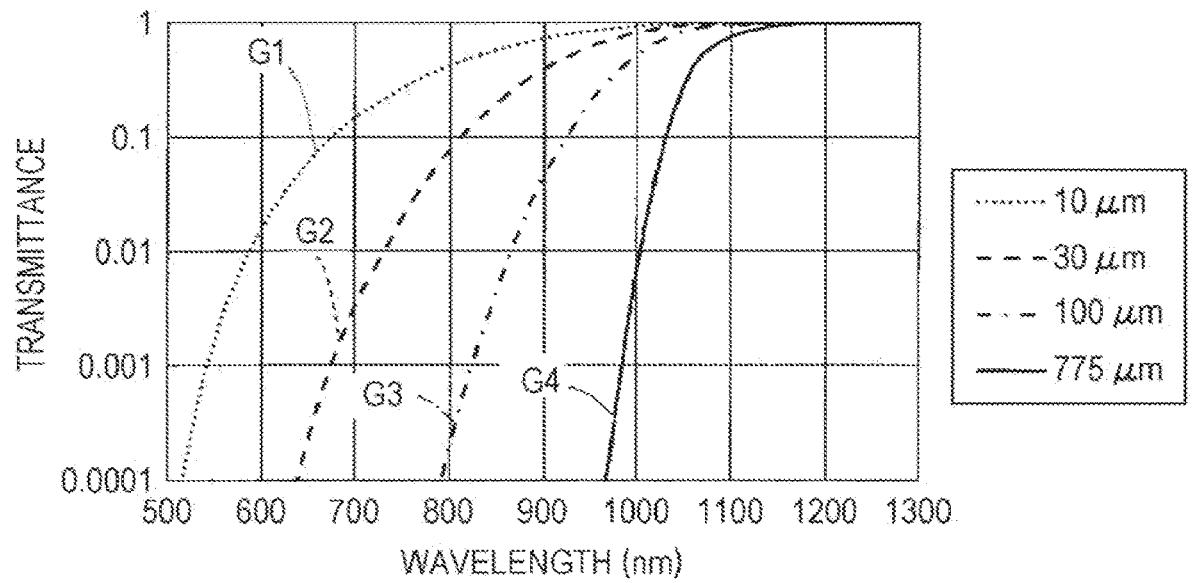
FIG. 3 is a diagram illustrating a relationship between a wavelength and a transmittance in a Si substrate.

FIG. 3 presents a relationship between the wavelength and the transmittance in a Si substrate. In FIG. 3, curves G1, G2, G3, and G4 present relationships between the wavelength and the transmittance in the cases where the thicknesses of the Si substrates are 10 µm, 30 µm, 100 µm, and 775 µm, respectively. From FIG. 3, it can be seen that the Si substrate having a thickness of about 30 µm or more can demonstrate a sufficient filtering function for light having a wavelength shorter than 1.1 µm. In addition, it can also be seen that even when the Si substrate has a thickness of greater than or equal to 30 µm, the Si substrate transmits nearly 100% of light having a wavelength of, for example, 1130 nm.

From the viewpoint of sufficiently attenuating the component having the wavelength shorter than 1.1 µm, the semiconductor substrate 110A has a thickness of, for example, greater than or equal to 30 µm. The thickness of the semiconductor substrate 110A is not particularly limited, but industrial Si substrates have a thickness in the range of 725±20 µm for 8 inches and 775±20 µm for 12 inches. Therefore, the semiconductor substrate 110A may also have a thickness of less than or equal to 800 µm. As described above, the insulating layer 130A is formed of a silicon oxide such as silicon dioxide, a silicon nitride such as silicon nitride, or the like. Even having a thickness of about 2 µm, these materials may demonstrate a transmittance of more than or equal to 90% for light in the wavelength region of longer than or equal to 1 µm.

Here, refer to FIG. 1 again. As schematically illustrated in FIG. 1, the pixel electrodes 121 of the photoelectric converter 120 are located between the semiconductor substrate 110A and the photoelectric conversion film 124 of the photoelectric converter 120. In the case where the pixel electrodes 121 are formed of a material that does not transmit infrared rays such as TiN, light transmitted through the semiconductor substrate 110A is blocked by the pixel electrodes 121 if the photoelectric conversion film 124 is covered with the pixel electrodes 121. For this reason, in this example, the aperture Ap is provided in each pixel electrode 121.

Figure 4:
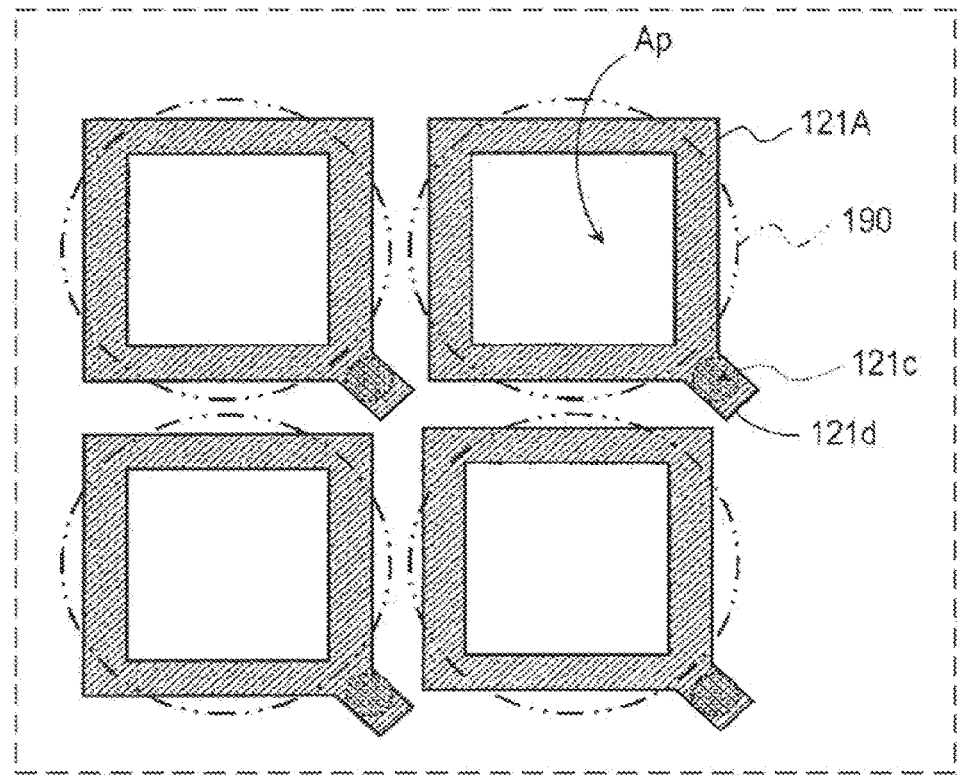
FIG. 4 is a schematic plan view illustrating an example of a pixel electrode shape.
Figure 5:
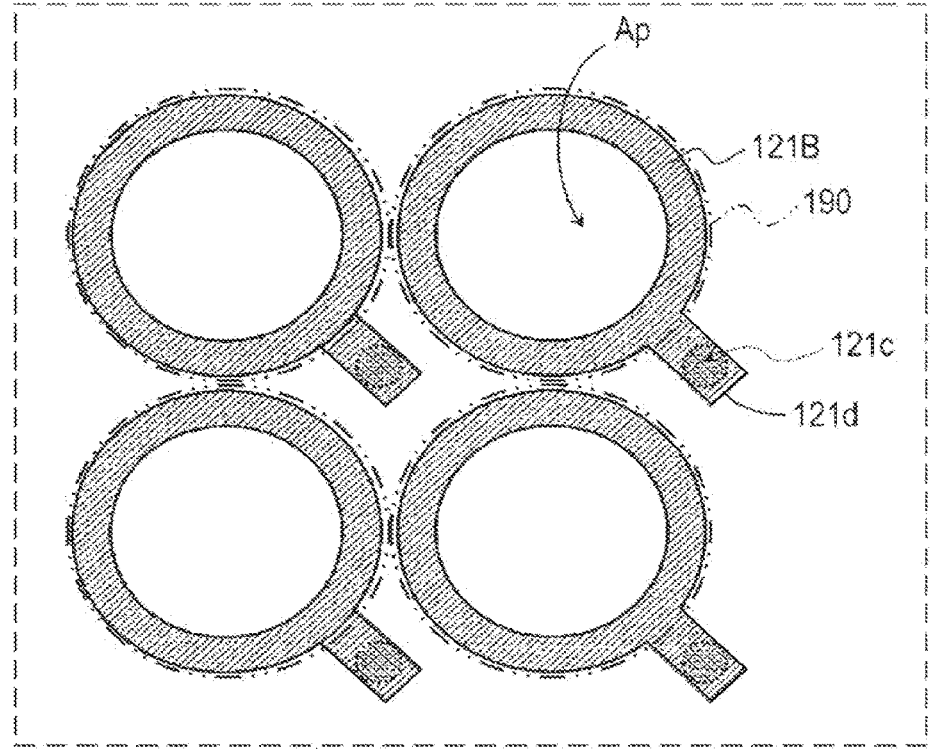
FIG. 5 is a schematic plan view illustrating another example of a pixel electrode shape.

FIGS. 4 and 5 illustrate examples of the shapes of the pixel electrodes 121. FIGS. 4 and 5 schematically illustrate the examples of the layout of the pixel electrodes 121 and the shapes of the respective pixel electrodes 121 when viewed in the direction normal to the second surface 110b of the semiconductor substrate 110A. In FIGS. 4 and 5, the positions of the outer rims of the microlenses disposed on the first surface 110f side of the semiconductor substrate 110A corresponding to the respective pixels Px are also depicted by chain double-dashed lines.

Each pixel electrode 121A illustrated in FIG. 4 has a roughly rectangular outer shape, and has a rectangular aperture Ap in the center. In such a structure, the ratio of the area of the aperture Ap to the area of the pixel Px in plan view determines the aperture ratio of the pixel Px. As described in reference to FIG. 1, the pixel electrode 121A of each pixel Px has a connection with the conductive structure 132 electrically connected to the first transistor 111. In each pixel Px, a connecting portion between the pixel electrode and the conductive structure 132 is located outside the outer rim of the microlens 190. The conductive structure 132 typically includes the via 136 extending in the direction normal to the semiconductor substrate 110A between the semiconductor substrate 110A and the photoelectric converter 120. Thus, when the connecting portion of the conductive structure 132 connected to the pixel electrode in particular is located outside the outer rim of the microlens 190, it is possible to avoid the blocking of light by the conductive structure 132.

For example, when the pixel electrode has a rectangular outer shape, the connecting portion between the pixel electrode and the conductive structure 132 may be provided at a position in any one of the four corners of the rectangular shape. In this example, the pixel electrode 121A includes an extended portion 121d that extends toward the outer edge of the pixel Px, and a connecting portion 121c between the pixel electrode 121A and the conductive structure 132 is provided in a region on the extended portion 121d. As schematically illustrated in FIG. 4, the connecting portion 121c is formed outside the outer rim of the microlens 190.

Each pixel electrode 121B illustrated in FIG. 5 has a roughly annular shape with an aperture Ap provided in the center. Also in this example, the connecting portion 121c is located outside the outer rim of the microlens 190. Needless to say, the shape and the layout of the pixel electrodes 121 are not limited to the examples illustrated in FIGS. 4 and 5. The shape of the pixel electrode 121 may be a polygonal shape such as a triangle or hexagon, and the outer shape of the pixel electrode 121 and the shape of the aperture Ap may not necessarily have to be the same. However, from the viewpoint of preventing only a part of the pixel electrode from concentrically collecting charges generated by photoelectric conversion, it is advantageous that the pixel electrode 121 has a highly symmetrical shape. The multiple pixel electrodes 121 may be disposed in a triangular lattice layout.

Figure 6:
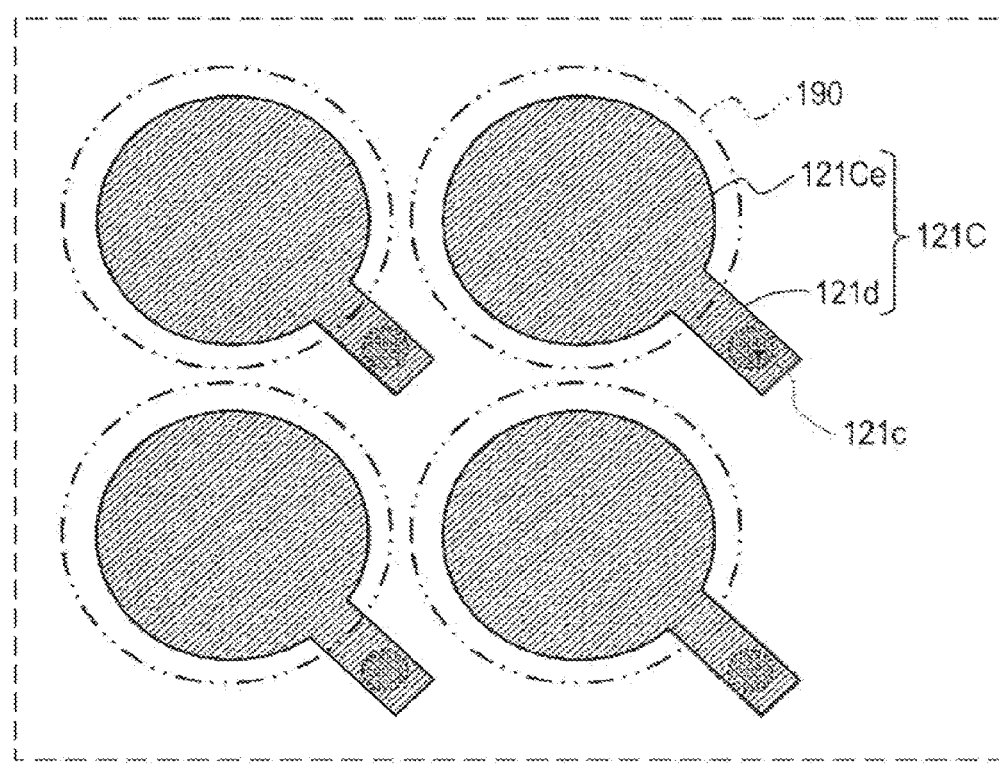
FIG. 6 is a schematic plan view illustrating still another example of a pixel electrode shape.
Figure 7:
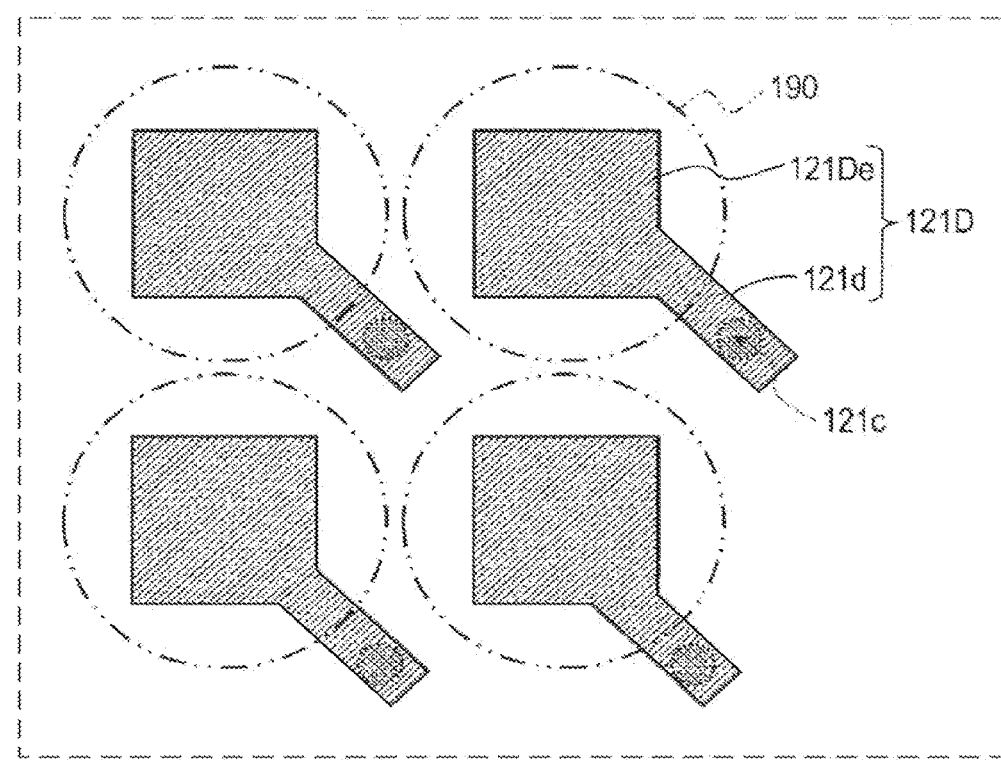
FIG. 7 is a schematic plan view illustrating still another example of a pixel electrode shape.
Figure 8:
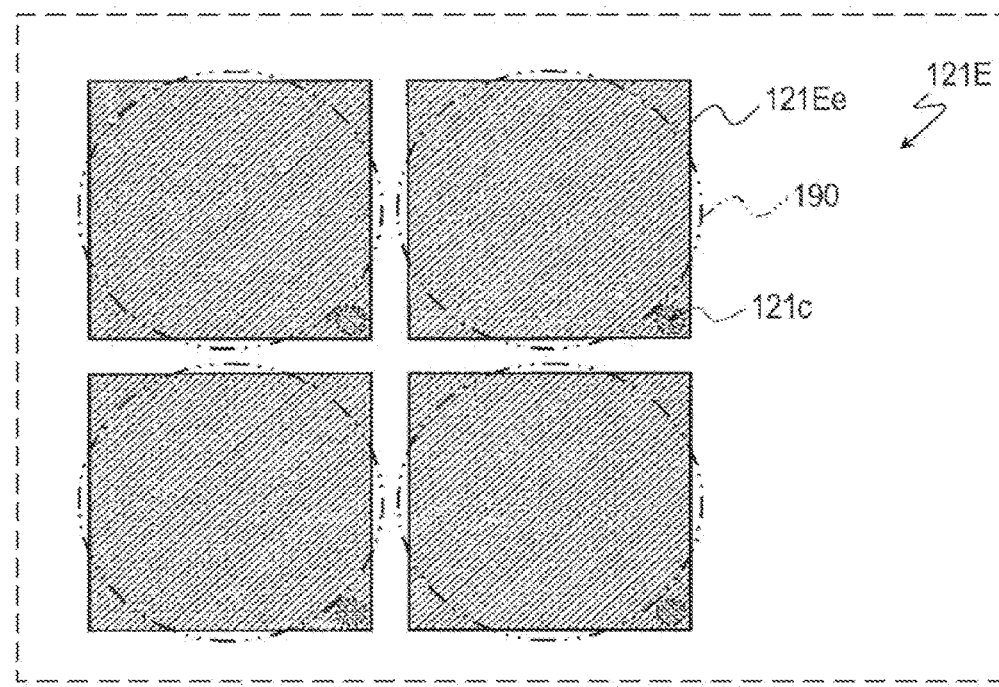
FIG. 8 is a schematic plan view illustrating still another example of a pixel electrode shape.

In the case where the pixel electrode 121 is formed of a material that transmits light in the infrared region, the aperture Ap does not have be provided in the pixel electrode 121. FIGS. 6 to 8 illustrate other examples of the shapes of the pixel electrodes 121. Each pixel electrode 121C illustrated in FIG. 6 includes a disk-shaped electrode portion 121Ce and an extended portion 121d extending from the electrode portion 121Ce. Each pixel electrode 121D illustrated in FIG. 7 includes a rectangular electrode portion 121De and an extended portion 121d extending from the electrode portion 121De. In these examples, the connecting portion 121c is disposed in a region on the extended portion 121d.

Each pixel electrode 121E illustrated in FIG. 8 includes a rectangular electrode portion 121Ee but does not include an extended portion 121d. As compared with the pixel electrode 121D illustrated in FIG. 7, the electrode portion 121Ee of the pixel electrode 121E has a larger area than the electrode portion 121De of the pixel electrode 121D has. In the structure illustrated in FIG. 8, the four corners of the rectangular electrode portion 121Ee are located outside the outer rim of the microlens 190, and the connecting portion 121c is provided at a position on one of the corners of the electrode portion 121Ee. In the case where the pixel electrode 121 is formed of a material that transmits light in the infrared region, the ratio of the area of the pixel electrode 121 to the area of the pixel Px in plan view determines the aperture ratio of the pixel Px. Thus, it is advantageous to make the area of the electrode portion as large as possible from the viewpoint of improving the SNR. When the material that transmits light in the infrared region is applied to the material for the pixel electrode 121, the aperture Ap for passing through light does not have to be provided, so that a higher aperture ratio can be obtained easily.

Each of the aforementioned electrode portions 121Ce, 121De, and 120Ee has a transmittance of, for example, higher than or equal to 80% for light having a wavelength longer than or equal to 1.1 µm, for example, light having the first wavelength $\lambda_1$. Examples of the materials that transmit light in the infrared region are transparent conducting oxides (TCO) represented by ITO and ZnO. For example, in the case where the pixel electrode 121 is formed in the form of an ITO film, the transmittance of the pixel electrode 121 for infrared light can be adjusted by adjustment of the carrier density. When the carrier density is decreased, an ITO film demonstrating a transmittance of about 80% for light having a wavelength of, for example, 1500 nm can be obtained. Instead, when ZnO is formed into a thin film having a thickness of about 200 nm, for example, a transmittance of higher than or equal to 90% for light having a wavelength of 1500 nm can be obtained. In the present description, "transparent" means to transmit at least part of light in a wavelength range to be detected, and does not mean that it is essential to transmit light over the entire wavelength range of visible light.

On the other hand, the counter electrode 122 is not required to have a transmittance for light incident on the photoelectric converter 120. The counter electrode 122 may be formed of a metal such as Al, TiN, or Ag. The counter electrode 122 may be formed of a material that reflects light incident on the photoelectric converter 120. The counter electrode 122 may have a reflectance of higher than or equal to 80% for light having the first wavelength $\lambda_1$ longer than or equal to 1.1 µm. Examples of a material for the counter electrode 122 demonstrating a reflectance of higher than or equal to 80% for light having a wavelength longer than or equal to 1.1 µm are Al and Au. The Al film and the Au film demonstrate a reflectance of about 90% for light having a wavelength longer than or equal to 1.1 µm at normal incidence. When the counter electrode 122 demonstrates a high reflectance of, for example, higher than or equal to 80% for light having a wavelength longer than or equal to 1.1 µm, in particular, having the first wavelength Xi, the light having passed through the photoelectric conversion layer 123 can be reflected to the semiconductor substrate 110A by the counter electrode 122, so that a larger amount of light may contribute to the photoelectric conversion. In short, the exhibition of a higher sensitivity can be expected.

In the structure illustrated in FIG. 1, the surface of the photoelectric converter 120 on the opposite side to the semiconductor substrate 110A, that is, the surface on the counter electrode 122 side is covered with a sealing film 140. The sealing film 140 is formed of, for example, $Al_2O_3$, SiN, SiON (silicon oxynitride), glass, or the like, and typically has a thickness of greater than or equal to 500 nm. When the surface of the photoelectric converter 120 is covered with the sealing film 140, it is possible to produce an effect of preventing oxygen from entering the photoelectric converter 120, in particular, the photoelectric conversion film 124.

The sealing film 140 may be a film obtained by depositing a metal such as Au, Pt, Ti, TiN, or Al in a thickness of, for example, greater than or equal to 200 nm. Containing a metal, the sealing film 140 can suppress not only the penetration of moisture into the photoelectric converter 120 but also the generation of noise due to the incidence of light from the counter electrode 122 side and the generation of noise due to heat by radiation. The sealing film 140 may be formed by depositing SiON, a metal, and SiON in this order on the counter electrode 122.

In the example illustrated in FIG. 1, the imaging device 100A includes a supporting substrate 150 that supports the structure including the semiconductor substrate 110A, the insulating layer 130A, the photoelectric converter 120, and the sealing film 140 described above. Here, the supporting substrate 150 is not an essential element, but is provided in the imaging device 100A as needed. For example, when the semiconductor substrate 110A has a thickness sufficient to support the structure, the supporting substrate 150 may be omitted.

When the supporting substrate 150 is provided in the imaging device and the photoelectric conversion layer 123 is interposed between the insulating layer 130A and the supporting substrate 150 as in the example illustrated in FIG. 1, the photoelectric conversion layer 123 can be disposed closer to the center in the thickness direction of the pixel Px in the cross sectional view. With such disposition of the photoelectric conversion layer 123, stress applied to the photoelectric conversion layer 123 from the insulating layer 130A can be canceled out by stress applied to the photoelectric conversion layer 123 from the supporting substrate 150. A material for the supporting substrate 150 is not particularly limited, but a Si substrate, a silicon oxide film, a silicon nitride film, or a polymer film may be used as the supporting substrate 150.

Figure 9:
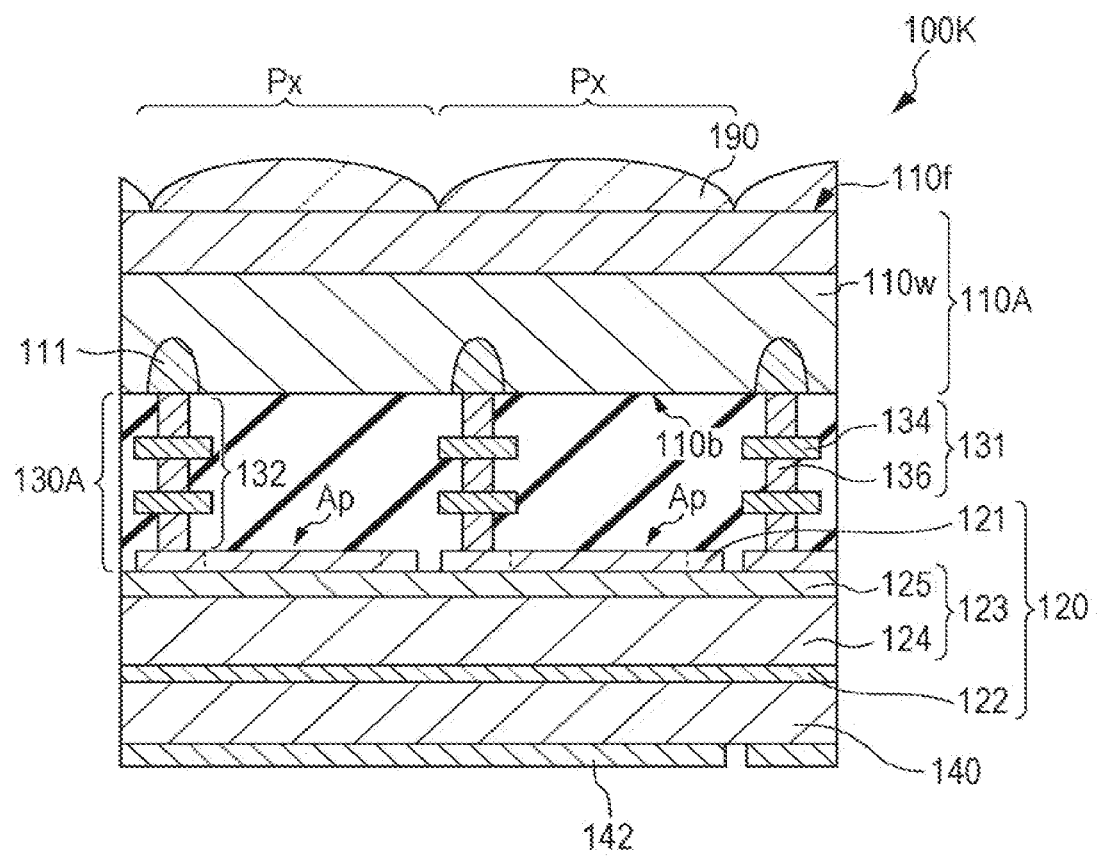
FIG. 9 is a schematic sectional view illustrating a modification example of the imaging device according to the first embodiment of the present disclosure.

FIG. 9 schematically illustrates a modification example of the imaging device according to the first embodiment of the present disclosure. As compared with the imaging device 100A described in reference to FIG. 1, an imaging device 100K illustrated in FIG. 9 includes a Peltier element 142 disposed on the sealing film 140. When the Peltier element 142 is disposed on the sealing film 140 and the photoelectric converter 120 is cooled by the Peltier element 142 during the operation of the imaging device 100K, the generation of carriers due to thermal excitation can be suppressed. As a result, the generation of dark current that may cause noise can be suppressed. In this example, the photoelectric converter can be cooled from a position closer to the photoelectric converter than in the case of a general cooling-type infrared image sensor, and therefore the photoelectric converter can be cooled more efficiently. As illustrated, the Peltier element 142 is provided for some of the multiple pixels Px.

Figure 10:
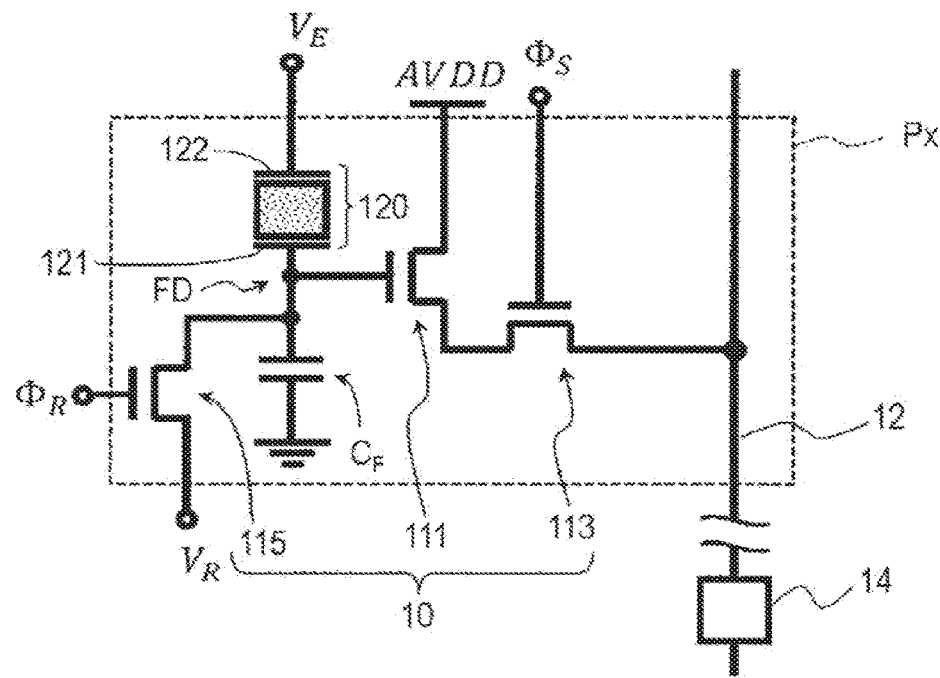
FIG. 10 is a diagram schematically illustrating an exemplary circuit configuration of each pixel.

FIG. 10 illustrates a typical example of a circuit configuration of each pixel Px. As schematically illustrated in FIG. 10, the pixel Px mainly includes the photoelectric converter 120 and a detection circuit 10 including the aforementioned first transistor 111. In this example, the detection circuit 10 includes a selection transistor 113 and a reset transistor 115 in addition to the first transistor 111 as a signal detection transistor. The selection transistor 113 and the reset transistor 115 are typically N-channel MOSFETs formed in the second surface 110b of the semiconductor substrate 110A as is the case with the first transistor 111.

As schematically illustrated in FIG. 10, the counter electrode 122 of the photoelectric converter 120 is connected to a voltage supply circuit not illustrated in FIG. 10, and thereby is configured to be capable of receiving a predetermined voltage VE applied during operation. On the other hand, the pixel electrode 121 of the photoelectric converter 120 is connected to the gate of the first transistor 111. During operation, the drain of the first transistor 111 is supplied with a power supply voltage AVDD from a power supply not illustrated in FIG. 10, and thereby the first transistor 111 functions as a source follower that outputs a signal depending on the potential at a floating diffusion node FD. Here, the floating diffusion node FD is a node that electrically connects the photoelectric converter 120 and the first transistor 111 to each other. The floating diffusion node FD includes, at a portion thereof, the aforementioned conductive structure 132 and any one of the source region and the drain region of the reset transistor 115. Here, in FIG. 10, a capacity of the floating diffusion node FD is depicted in the form of a capacity element $C_F$.

The selection transistor 113 is connected between the source of the first transistor 111 and the corresponding one of multiple output signal lines 12 provided to respective columns of multiple pixels Px. The gate of the selection transistor 113 is connected to a vertical scanning circuit not illustrated through an address control line, and a potential $\Phi_S$ at the address control line is controlled for on/off control of the selection transistor 113. Typically, a column signal processing circuit 14 including an analog-digital conversion circuit is connected to the output signal line 12. The analog-digital conversion circuit may be a circuit formed in the semiconductor substrate 110A. The column signal processing circuit 14 may further include a circuit that performs noise suppression signal processing typified by correlated double sampling.

In this example, the detection circuit 10 includes the reset transistor 115. One of the source and the drain of the reset transistor 115 has a connection with the floating diffusion node FD. The other one of the source and the drain of the reset transistor 115 is connected to a reset voltage source not illustrated in FIG. 10, and thereby is supplied with a pre-determined reset voltage $V_R$ during operation of the imaging device. The gate of the reset transistor 115 is connected to, for example, the vertical scanning circuit through a reset control line. The vertical scanning circuit performs on/off control of the reset transistor 115 by controlling a potential OR at the reset control line.

As can be understood from the above, the principle of signal detection in the imaging devices 100A and 100K can be almost the same as the principle in a so-called stacked type imaging device. Examples of the basic structure and operation of the stacked type imaging device are described in, for example, Japanese Unexamined Patent Application Publication No. 2017-188917. For reference, the entire content disclosed in Japanese Unexamined Patent Application Publication No. 2017-188917 is incorporated in the present description.

Next, the structure of the photoelectric conversion layer 123 is described in more detail. As can be understood from the above description in reference to FIG. 2, the photoelectric conversion layer 123 is capable of absorbing light with the first wavelength $\lambda_1$ longer than or equal to 1.1 μm. Here, the expression that a photoelectric conversion layer "absorbs" light with a certain wavelength does not necessarily mean that the photoelectric conversion layer has an absorptance of 100% for the light with that wavelength.

In the structures illustrated in FIGS. 1 and 9, the photoelectric conversion layer 123 includes the electron blocking layer 125 and the photoelectric conversion film 124. The electron blocking layer 125 is formed of, for example, a metal oxide such as NiO or an organic material such as TAPC represented by the following formula (1).

[Chem. 1]

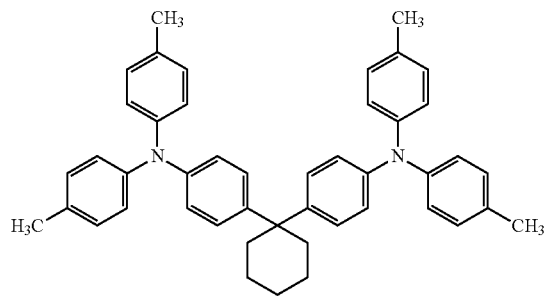

(1)

The photoelectric conversion film 124 contains a material having quantum nanostructures having a quantum confinement effect. The quantum nanostructure refers to a structure that exhibits a quantum size effect one-dimensionally, two-dimensionally, or three-dimensionally. An example of a material having quantum nanostructures is carbon nanotubes. The carbon nanotube has a structure like a rolled graphene, and has a seamless substantially-cylindrical shape with a diameter in a nanometer range. The structure with one cylinder is called a single-walled carbon nanotube, and the structure with multiple cylinders nested is called a multi-walled carbon nanotube. Many of the electronic and optical properties of the single-walled carbon nanotubes are determined by the chirality specified by the chiral indexes, and the single-walled carbon nanotubes exhibit metallic or semi-conducting properties depending on the chirality.

The energy of electrons in the single-walled carbon nanotube is specified only by the wavenumber in the axial direction of the tube due to the periodicity attributed to the cylindrical shape of the tube. That is, the state of electrons in the single-walled carbon nanotube is one-dimensional. The band structure of the single-walled carbon nanotube is unique in that energy levels (subbands) at which the density of states diverges discretely appear. Such singularities in the density of states are called Van Hove singularities.

The absorption spectrum of the single-walled carbon nanotubes demonstrates a sharp peak at the wavelength corresponding to the energy between these subbands. In the carbon nanotubes, the first optical transition between sub-bands counted from the Fermi level is the first optical transition, and the second optical transition between sub-bands counted from the Fermi level is the second optical transition. The second peak Pk2 described in reference to FIG. 2 may be an absorption peak corresponding to the E22 transition that is the second optical transition.

The single-walled carbon nanotubes have degrees of freedom called the chirality, and demonstrate resonance absorption at wavelengths that vary depending on the chirality as illustrated in Table 1. For example, semiconductor-type carbon nanotubes having the chiral indexes (9, 8) demonstrate resonance absorption at wavelengths around 800 nanometers and around 1.41 micrometers. Semiconductor-type carbon nanotubes having the chiral indexes (7, 6) demonstrate resonance absorption at wavelengths around 650 nanometers and around 1.13 micrometers. Here, the values of the wavelengths presented in Table 1 are merely examples, and an error on the order of 50 nanometers may occur between these values and their actually measured values.

TABLE 1

| Chirality | (7, 6) | (8, 7) | (9, 8) |
| --- | --- | --- | --- |
| Wavelength corresponding to first optical transition (equivalent to E11 transition) | 1130 nm | 1280 nm | 1410 nm |
| Wavelength corresponding to second optical transition (equivalent to E22 transition) | 650 nm | 730 nm | 800 nm |

A Si substrate having a thickness of greater than or equal to 30 μm transmits almost 100% of light with a wavelength of 1.41 micrometers at which the semiconductor-type carbon nanotubes having the chiral indexes (9, 8) demonstrate resonance absorption, but transmits only less than or equal to 0.1% of light with a wavelength around 800 nanometers corresponding to the second optical transition. Meanwhile, the Si substrate having the thickness of greater than or equal to 30 μm transmits almost 100% of light with a wavelength of 1.13 micrometers at which the semiconductor-type carbon nanotubes having the chiral indexes (7, 6) demonstrate resonance absorption, but transmits only less than or equal to 0.1% of light with a wavelength around 650 nanometers corresponding to the second optical transition.

The semiconductor-type carbon nanotubes having the chiralities presented as examples in Table 1 demonstrate almost no absorption of light in a wavelength region of around 1000 nm at which the transmittance of the silicon sharply decreases. Thus, when the photoelectric conversion film 124 is formed by using single-walled carbon nanotubes having the chirality depending on the wavelength of light to be detected, for example, it is possible to obtain pixels having high sensitivity specific to the particular wavelength. The carbon nanotubes are a photoelectric conversion material advantageous to exhibit specifically high sensitivity at a particular wavelength because a sharp absorption peak can be obtained more easily than in the case of quantum dots to be described later. The photoelectric conversion film 124 may contain multiple kinds of carbon nanotubes with different chiralities.

As the quantum nanostructures, it is also possible to apply nanorods, nanowires, crystals or superlattices with quantum wells, or quantum dots. As a raw material for forming the quantum nanostructures such as nanorods, nanowires, crystals or superlattices with quantum wells, and quantum dots, it is possible to select a V group semiconductor such as Si or Ge, a IV-VI group semiconductor such as PbS, PbSe, or PbTe, a III-V group semiconductor such as InAs or InSb, or a ternary mixed crystal such as HgCdTe or PbSnTe. A metal may also be applied as a raw material for forming quantum nanostructures such as quantum dots.

The nanorods or nanowires having a diameter of about several tens of nanometers or less and a length of several hundreds of nanometers or more demonstrate a one-dimensional quantum confinement effect. The diameter of the nanorods and nanowires varies depending on a raw material used, and is smaller than or equal to 18 nanometers in the case of PbS, smaller than or equal to 29 nanometers in the case of InAs, or smaller than or equal to 61 nanometers in the case of InSb. The length of nanorods and nanowires may have a larger value than that of the Bohr radius of a raw material used.

The crystals or superlattices with quantum wells demonstrate a two-dimensional quantum confinement effect. The layer thickness of crystals and the layer thickness of superlattices with quantum wells are adjusted to values equal to or smaller than the Bohr radius of a raw material used. The quantum dots demonstrate a three-dimensional quantum confinement effect. The quantum dot is a nanocrystal having a diameter of about 2 to 10 nanometers and is composed of about several tens of atoms. The surface of the quantum dot may be modified with a dispersant or a ligand. The quantum dot may be a quantum dot having a perovskite structure represented by a chemical formula $APbX_3$. Here, in the chemical formula $APbX_3$, A represents one selected from the group consisting of cesium, methyl ammonium, and formamidinium, and X represents chlorine, bromine, or iodine.

Figure 11:
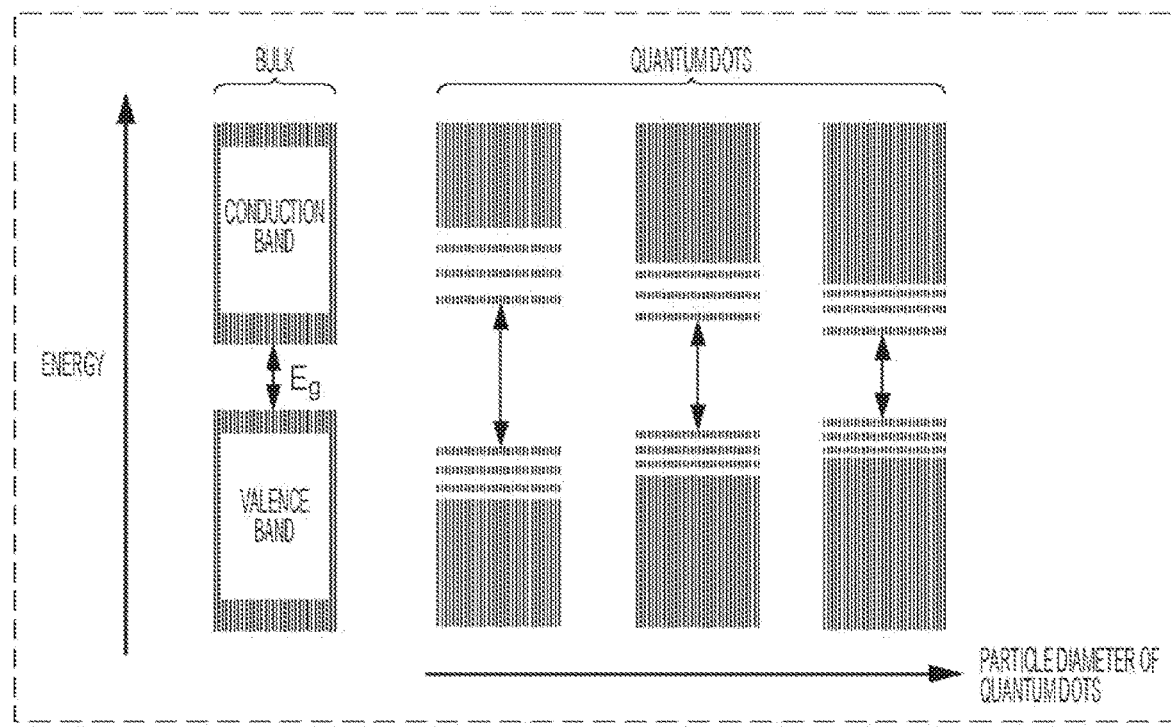
FIG. 11 is a diagram illustrating both an example of energy bands for a material in the form of a bulk, and an example of energy bands for a material in the form of quantum dots.

When the particle diameter of particles is equal to or smaller than approximately the Bohr radius of excitons, the excitons and electrons are confined in spaces three-dimensionally, and the density of states is discrete unlike in the case of bulk. In addition, as the particle diameter becomes smaller, this quantum confinement effect increases and accordingly a gap is enlarged as schematically illustrated in FIG. 11. Therefore, even if the same raw material is used, the form of quantum dots can achieve a larger energy gap than the energy gap in the bulk and the energy gap can be adjusted according to the particle diameter of the quantum dots.

In the quantum dots, the width of the absorption peak at the first optical transition may vary largely depending on a raw material and the particle diameter thereof. Therefore, when quantum dots are selected as a photoelectric conversion material for constituting the photoelectric conversion film 124, for example, the wavelength at which the photoelectric conversion film 124 specifically demonstrates absorption can be preset by adjusting a raw material and the particle diameter thereof.

Figure 12:
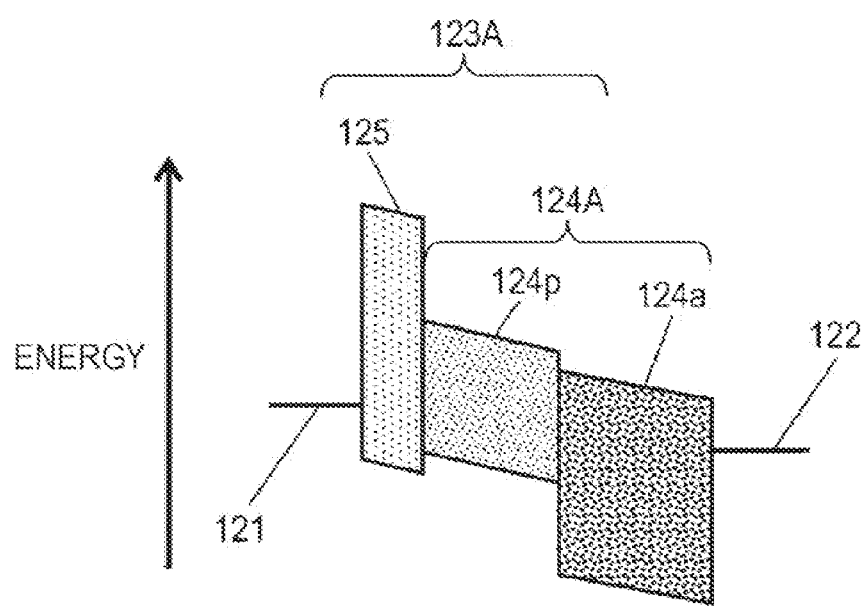
FIG. 12 is an exemplary energy diagram for a photoelectric converter.

Note that the photoelectric conversion film 124 may contain an organic compound as an acceptor or an organic compound as a donor in addition to the material with the quantum confinement effect. FIG. 12 presents an exemplary energy diagram regarding the photoelectric converter. The example illustrated in FIG. 12 depicts a structure in the case where positive charges among positive and negative charges generated by photoelectric conversion are collected by the pixel electrode 121.

In FIG. 12, a thick horizontal line to the left of three rectangles represents the Fermi level of the pixel electrode 121, and a thick horizontal line to the right of the three rectangles represents the Fermi level of the counter electrode 122. In the leftmost rectangle of the three rectangles consecutively arranged in FIG. 12, the bottom side represents an energy level of the highest occupied molecular orbital (HOMO) of the electron blocking layer 125, and the side opposite to the bottom side represents an energy level of the lowest unoccupied molecular orbital (LUMO) thereof. In the structure illustrated in FIG. 12, a photoelectric conversion layer 123A includes a photoelectric conversion film 124A including a first layer 124p and a second layer 124a. The center rectangle and the right rectangle in FIG. 12 schematically represent the heights of the energy levels of the HOMO and the LUMO of the first layer 124p and the second layer 124a in the photoelectric conversion film 124A.

The first layer 124p in the photoelectric conversion film 124A is a layer mainly containing a material that specifically absorbs light with the first wavelength $\lambda_1$ and is substantially formed of a material with a quantum confinement effect. On the other hand, the second layer 124a in the photoelectric conversion film 124A is a layer mainly containing an acceptor organic compound and has a function to suppress deactivation of excitons due to recombination. As the acceptor organic compound, it is possible to use any organic compound as long as the organic compound has electronaccepting properties. Representative examples of the acceptor organic compound are $C_{60}$ fullerene represented by the following formula (2) and phenyl $C_{61}$ butyric acid methyl ester (PCBM) represented by the following formula (3). The values of ionization potential and electron affinity of the $C_{60}$ fullerene are about 6.4 eV and 4.0 eV, respectively. The values of ionization potential and electron affinity of the PCBM are about 6.1 eV and 3.7 eV, respectively.

[Chem. 2]

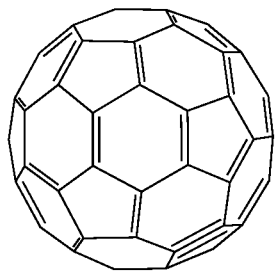

(2)

[Chem. 3]

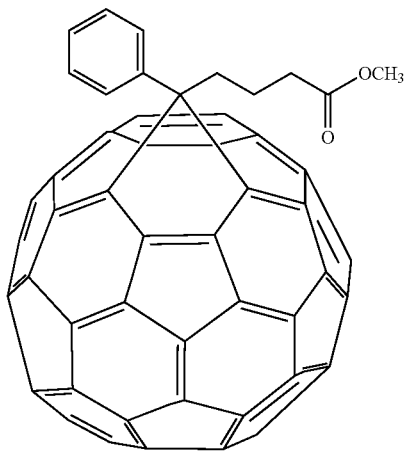

(3)

Figure 13:
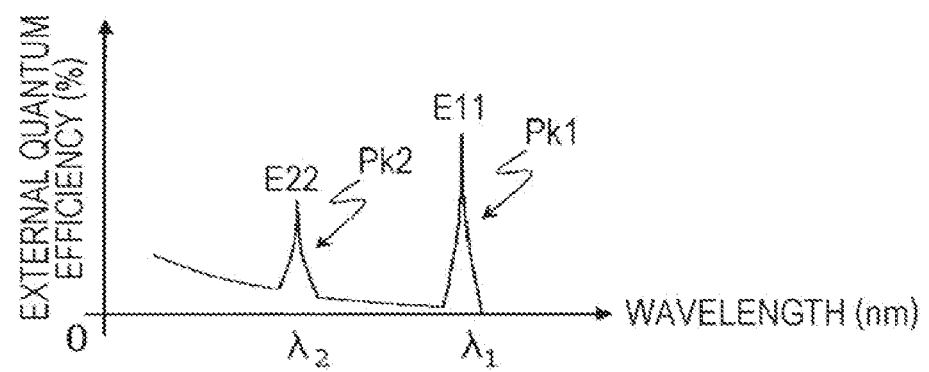
FIG. 13 is a diagram schematically illustrating a typical spectral sensitivity curve for a first layer of a photoelectric conversion film illustrated in FIG. 12.

The first layer 124p in the photoelectric conversion film 124A generates charge pairs by absorbing light in the infrared region and thereby contributes to the generation of signal charges based on the intensity of the light in the infrared region. FIG. 13 schematically presents a typical spectral sensitivity curve of the first layer 124p in the photoelectric conversion film 124A.

Figure 14:
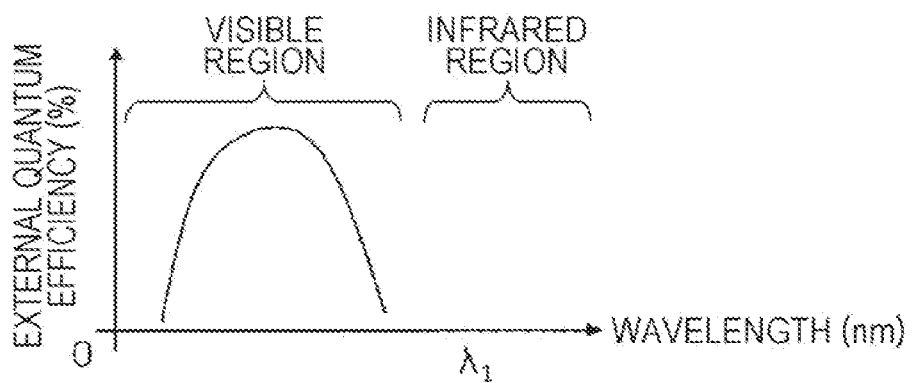
FIG. 14 is a diagram schematically illustrating an example of a spectral sensitivity curve for a second layer of the photoelectric conversion film illustrated in FIG. 12.

On the other hand, FIG. 14 schematically presents an example of a spectral sensitivity curve of the second layer 124a in the photoelectric conversion film 124A. The fullerene and the PCBM do not demonstrate absorption in the infrared region, and the second layer 124a formed of such a material has no sensitivity in the infrared region. Instead, as can be seen from FIG. 14, the second layer 124a may have a sensitivity for visible light. The charges generated by the second layer 124a and collected by the pixel electrode 121 may cause noise.

Figure 15:
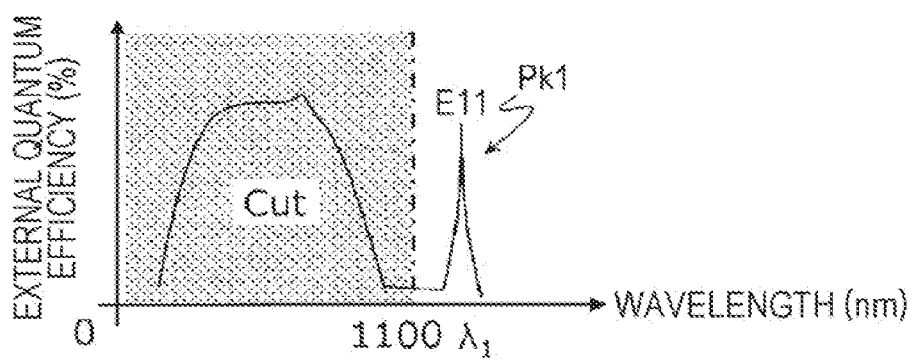
FIG. 15 is a diagram schematically illustrating a spectral sensitivity curve for the photoelectric conversion film illustrated in FIG. 12.

FIG. 15 schematically presents a spectral sensitivity curve of the photoelectric conversion film 124A including the first layer 124p and the second layer 124a. When the photoelectric conversion film contains a first material with a quantum confinement effect and a second material different from the first material, such for example as an organic compound as an acceptor or an organic compound as a donor, the spectral sensitivity characteristics of the photoelectric conversion film are a synthesis of the spectral sensitivity characteristics of the first material and the spectral sensitivity characteristics of the second material as schematically presented in FIG. 15. For example, the organic compound as an acceptor or the organic compound as a donor typically does not absorb light with a wavelength longer than 0.9 μm. In this example, the absorption by the second material is in a wavelength region of shorter than 1.1 μm at which the semiconductor substrate 110A demonstrates absorption. Therefore, even if the photoelectric conversion film contains a second material, such as fullerene and PCBM, other than the material that contributes to photoelectric conversion in the infrared region, light absorption by the second material does not appear in the effective sensitivity of the photoelectric converter 120.

In this way, in the embodiment of the present disclosure, the photoelectric conversion film may further contain a second material such as an acceptor, a donor, or a dispersant in addition to the first material with the quantum confinement effect. Here, although FIG. 12 illustrates the photoelectric conversion film 124A having the multilayer structure of the first layer 124p and the second layer 124a, the photoelectric conversion film may be formed in the form of a bulk heterojunction structure layer in which the first material with the quantum confinement effect and the second material different from the first material are mixed. Also in this case, the light absorption by the second material does not appear in the effective sensitivity of the photoelectric converter 120 as is the case with the above example. The bulk heterojunction structure is described in detail in Japanese Patent No. 5553727. For reference, the entire content disclosed in Japanese Patent No. 5553727 is incorporated in the present description. A hole blocking layer may be further disposed between the photoelectric conversion film and the counter electrode 122.

Since the density of states is discrete in carbon nanotubes and quantum dots, the spectral sensitivity curve of the photoelectric conversion layer formed of any of these materials has peaks in sharp shapes, and a clear valley appears between two peaks. Two adjacent peaks are separated by a wavelength equivalent to a difference between a wavelength corresponding to the energy gap size at a certain optical transition (for example, the E22 transition) and a wavelength corresponding to the energy gap size at a different optical transition (for example, the E11 transition). For this reason, when a valley portion with relatively low sensitivity between the peaks is located at 1.1 μm that is a wavelength at which the transmittance of the silicon sharply decreases, the sensitivity due to absorption peaks other than the first peak Pk1 can be substantially eliminated. Thus, the imaging devices 100A and 100K do not effectively demonstrate the sensitivity at the second wavelength $\lambda_2$ corresponding to the second peak Pk2.

As described above, even if the material of the photoelectric conversion film 124 has multiple absorption peaks, the positions of peaks other than the first peak Pk1 are adjusted to a wavelength region of shorter than 1.1 μm, so that the sensitivity at the wavelengths corresponding to these absorption peaks can be effectively eliminated and thus prevented from appearing in the sensitivity of the imaging device. In the example illustrated in FIG. 2, the first peak Pk1 is higher than the second peak Pk2. However, these peaks are just examples, and it does not matter that the second peak Pk2 is higher than the first peak Pk1.

Meanwhile, focusing on a longer wavelength side than the first wavelength $\lambda_1$, the imaging devices 100A and 100K do not effectively demonstrate the sensitivity for light with a wavelength exceeding a certain wavelength $\lambda_d$ that is longer than the first wavelength $\lambda_1$ because the first peak Pk1 has a sharp shape. Here, the wavelength $\lambda_d$ is a wavelength determined by the spectral sensitivity characteristics of the main photoelectric conversion material contained in the photoelectric conversion layer 123.

In other words, the imaging devices in the embodiment of the present disclosure selectively have the sensitivity in a particular wavelength region including the first wavelength $\lambda_1$. In this way, according to the embodiment of the present disclosure, the main photoelectric conversion material to be involved in the generation of charges for use as signal charges, in particular, among the materials constituting the photoelectric conversion film that receives light transmitted through the semiconductor substrate has a sharp absorption peak, so that narrow-band imaging can be achieved without needing an optical filter such as a band pass filter. In particular, without employing filtering using interference, the imaging device is enabled to exhibit a preset filtering function even for oblique light.

(Exemplary Method of Manufacturing Imaging Device 100A)

Figure 16:
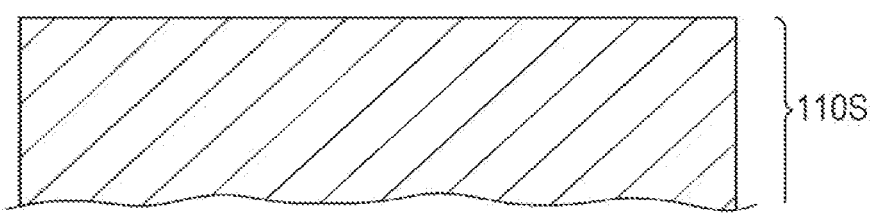
FIG. 16 is a schematic sectional view for explaining an exemplary method of manufacturing an imaging device according to the first embodiment of the present disclosure.

Here, in reference to FIGS. 16 to 21, description will be given of an exemplary method of manufacturing the imaging device 100A illustrated in FIG. 1. First, as illustrated in FIG. 16, a semiconductor substrate 110S mainly containing silicon is prepared. Here, an example is described in which a P-type Si substrate is used as the semiconductor substrate 110S.

Figure 17:
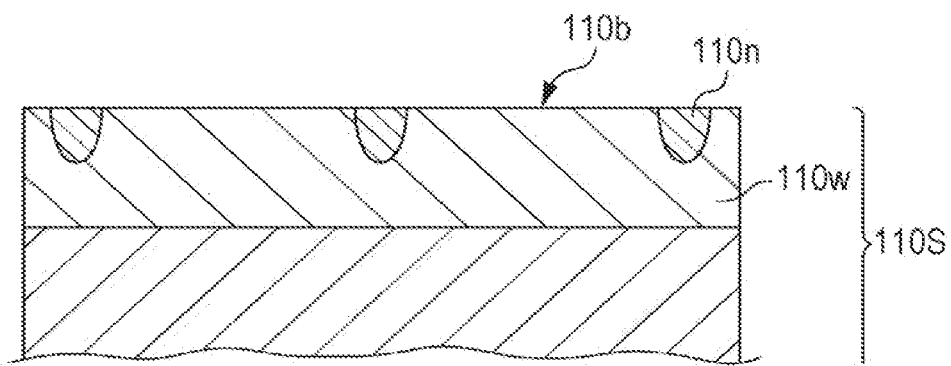
FIG. 17 is a schematic sectional view for explaining the exemplary method of manufacturing an imaging device according to the first embodiment of the present disclosure.

Next, by ion implantation from the second surface 110b side, which is one of the main surfaces of the semiconductor substrate 110S, a well 110w, N-type impurity regions 110n as the source regions or the drain regions of the transistors, an element isolation region, and so on are formed on the second surface 110b side as schematically illustrated in FIG. 17. Subsequently, the gate electrodes of the first transistor 111, the selection transistor 113, and the reset transistor 115 constituting the detection circuit 10 are disposed on predetermined areas of the second surface 110b. In FIG. 17, the illustration of these gate electrodes is omitted for the purpose of avoiding the complication of the drawing.

Figure 18:
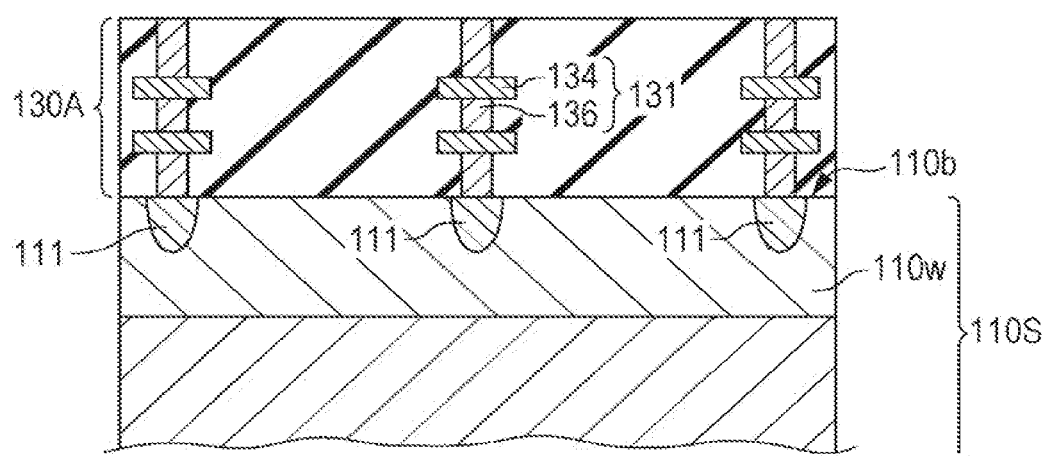
FIG. 18 is a schematic sectional view for explaining the exemplary method of manufacturing an imaging device according to the first embodiment of the present disclosure.

Then, as illustrated in FIG. 18, the insulating layer 130A covering the second surface 110b of the semiconductor substrate 110S is formed. The insulating film is formed by, for example, chemical vapor deposition (CVD). Typically, an insulating material such as silicon dioxide or silicon nitride is deposited in multiple steps and the multilayer wire 131 including the address control lines, the reset control lines, and the output signal lines 12 described above is formed inside the insulating layer 130A by applying a Damascene process. In this process, contacts with circuits on the semiconductor substrate 110S are also formed by patterning the insulating film.

Figure 19:
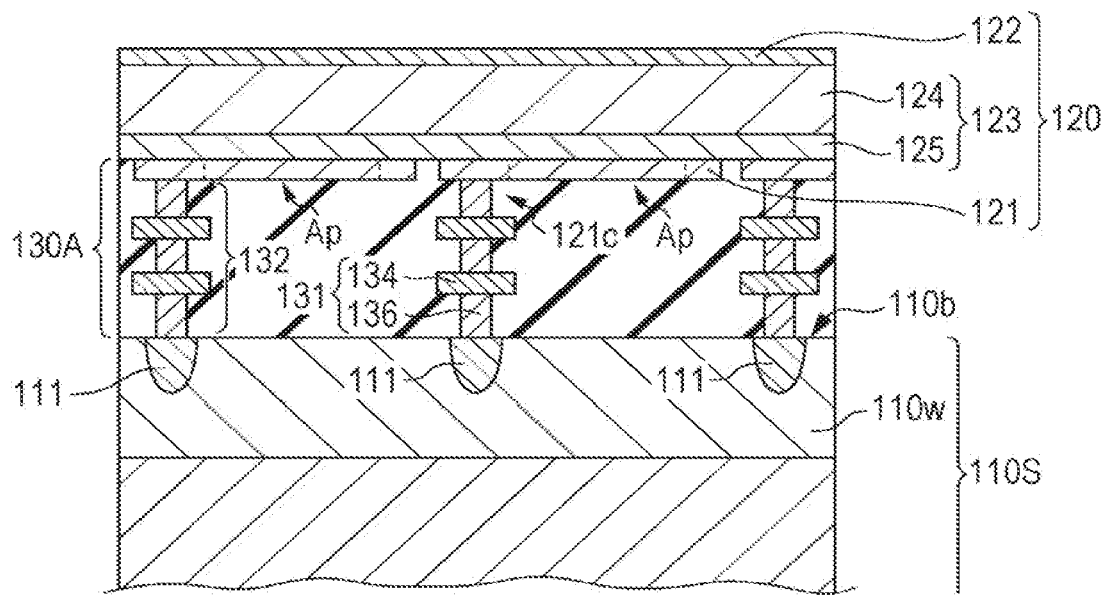
FIG. 19 is a schematic sectional view for explaining the exemplary method of manufacturing an imaging device according to the first embodiment of the present disclosure.

Then, as schematically illustrated in FIG. 19, the photoelectric converter 120 is disposed on the insulating layer 130A. In this example, the pixel electrodes 121 are formed near the upper surface of the insulating layer 130A such that the pixel electrodes 121 are embedded in the insulating layer 130A, and are connected to the conductive structures 132. Thus, the photoelectric converter 120 includes the pixel electrodes 121 having connections with the conductive structures 132.

The photoelectric converter 120 can be formed in the same manner as the photoelectric converter in the stacked-type imaging device, and any known semiconductor process can be applied to the formation of the photoelectric converter 120. According to the embodiment of the present disclosure, the photoelectric converter 120 is disposed on the insulating layer 130A covering the semiconductor substrate. For this reason, unlike CMOS image sensors in the related art, a material different from a semiconductor such as the silicon constituting the semiconductor substrate can be selected as a material for the photoelectric conversion film 124. Thus, it is possible to achieve imaging at a desired wavelength irrespective of the absorption characteristics of the material for the semiconductor substrate that supports the photoelectric converter 120.

Figure 20:
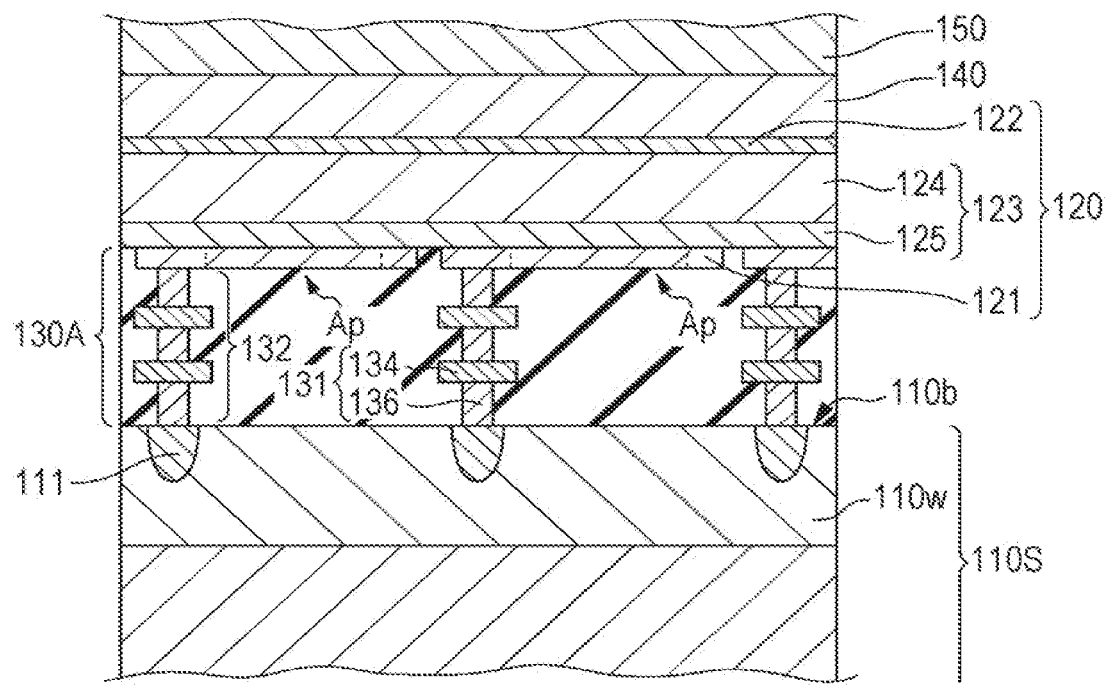
FIG. 20 is a schematic sectional view for explaining the exemplary method of manufacturing an imaging device according to the first embodiment of the present disclosure.

Here, as illustrated in FIG. 20, the sealing film 140 is subsequently formed on the counter electrode 122 of the photoelectric converter 120. Any of chemical vapor deposition and physical vapor deposition can be applied to the formation of the sealing film 140. In this example, the supporting substrate 150 is further bonded on the sealing film 140.

Figure 21:
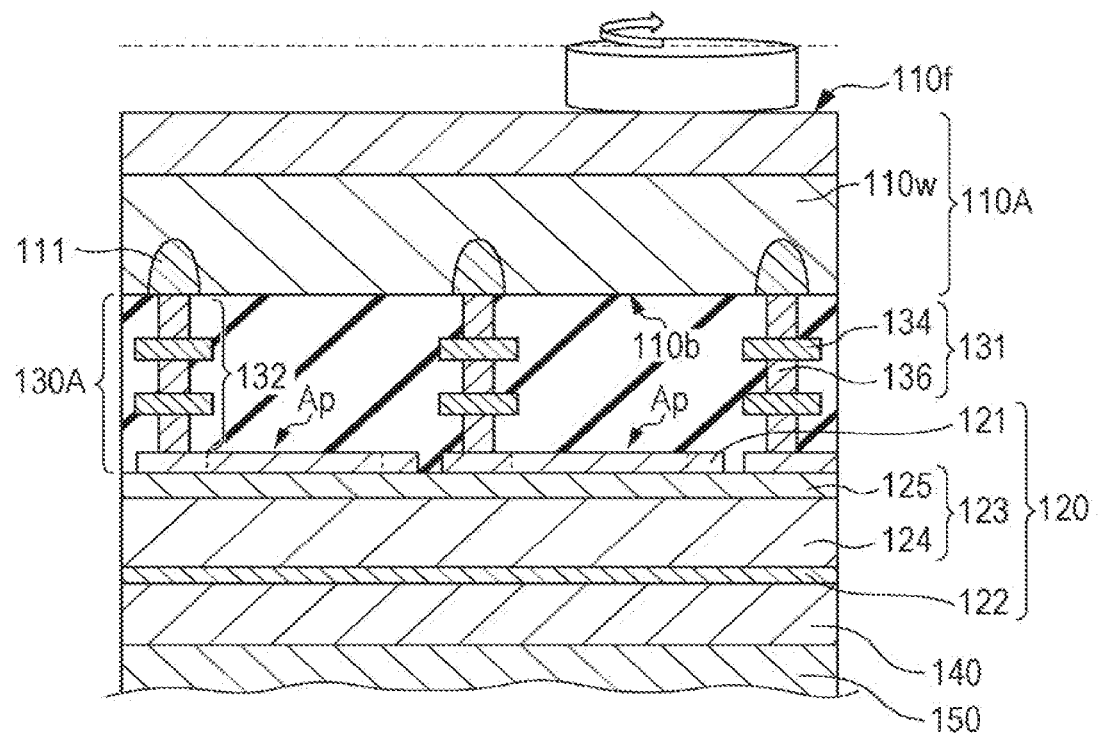
FIG. 21 is a schematic sectional view for explaining the exemplary method of manufacturing an imaging device according to the first embodiment of the present disclosure.

After that, typically, the thickness of the semiconductor substrate 110S is reduced. For example, as schematically illustrated in FIG. 21, the semiconductor substrate 110A including the first surface 110f and the second surface 110b is obtained by grinding or polishing the semiconductor substrate 110S from the main surface side opposite to the second surface 110b. Thereafter, the microlenses 190 are disposed on the first surface 110f side of the semiconductor substrate 110A. A protective layer for smoothing may be interposed between the microlenses 190 and the first surface 110f of the semiconductor substrate 110A. The imaging device 100A illustrated in FIG. 1 can be obtained through the steps described above. Here, the supporting substrate 150 may be removed after the thinning of the semiconductor substrate 110S.

Second Embodiment

Figure 22:
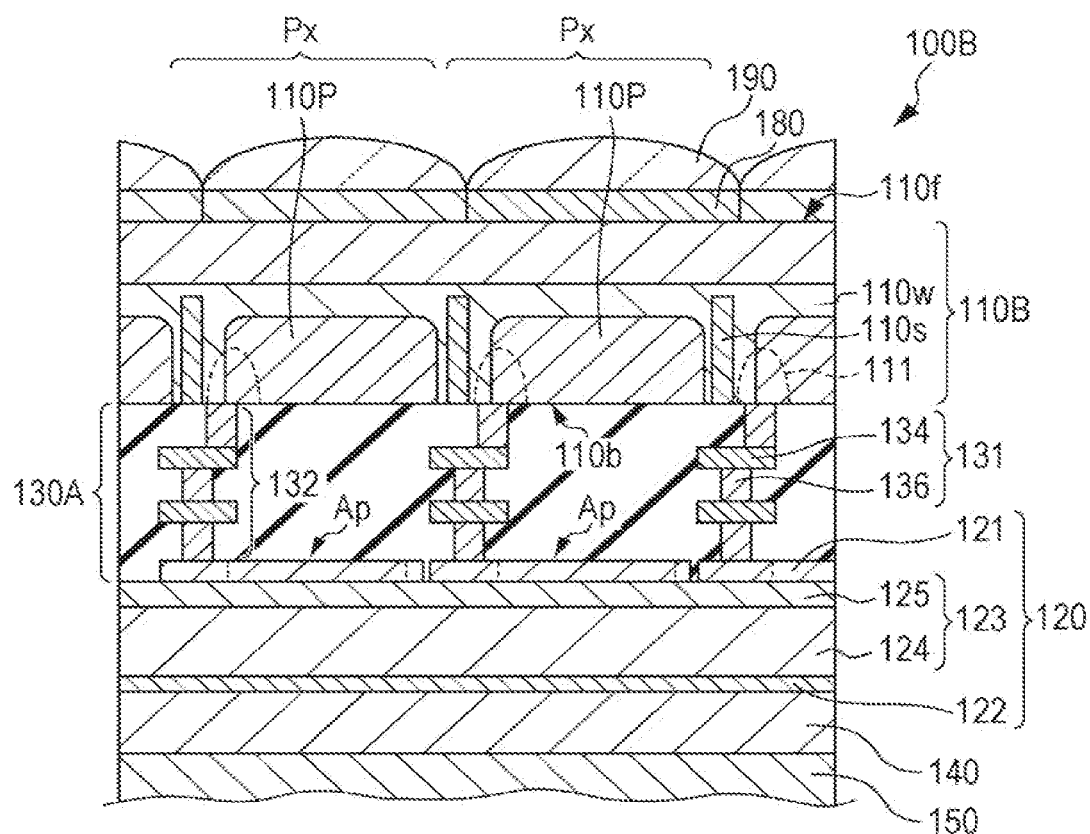
FIG. 22 is a schematic sectional view illustrating a device structure of pixels of an imaging device according to a second embodiment of the present disclosure.

FIG. 22 schematically illustrates a device structure of pixels of an imaging device according to a second embodiment of the present disclosure. As compared with the imaging device 100A described in reference to FIG. 1, an imaging device 100B illustrated in FIG. 22 includes a semiconductor substrate 110B in place of the semiconductor substrate 110A. In addition, the imaging device 100B further includes a color filter 180 between a first surface 110f of the semiconductor substrate 110B and microlenses 190.

As schematically illustrated in FIG. 22, one or more photodiodes 110P are formed in the semiconductor substrate 110B. These photodiodes 110P can be formed by ion implantation or the like before the formation of the insulating layer 130A covering the semiconductor substrate 110B. Here, the first transistors 111 illustrated in FIG. 22 are located in front of or behind the sheet surface (that is, the cross section) with respect to the photodiodes 110P.

In the example illustrated in FIG. 22, one photodiode 110P is provided for each pixel Px. The photodiode 110P in each pixel Px is spatially and electrically isolated by an element isolation region 110s. The element isolation region 110s is formed by, for example, shallow trench isolation (STI) or ion implantation. In the present description, the "pixel Px" means a unit structure including the pixel electrode 121 and the first transistor 111.

As the color filter 180, a filter that transmits light in a wavelength region of longer than or equal to 1.1 μm is used. Thus, light having passed through the color filter 180 is incident on the photodiode 110P in each pixel Px. Of the incident light, a component having a wavelength longer than or equal to 1.1 μm is transmitted through the semiconductor substrate 110B, and reaches a portion of the photoelectric converter 120 below the photodiode 110P. In other words, the photoelectric converter 120 detects the intensity of light having a first wavelength Xi longer than or equal to 1.1 µm in the incident light.

On the other hand, the photodiode 110P in each pixel Px generates charges with incidence of a component having a wavelength shorter than 1.1 µm in the light having passed through the color filter 180. As will be described later, the photodiode 110P in each pixel Px has a connection with a second transistor not illustrated in FIG. 22. The second transistor is a signal detection transistor that reads charges generated by the photodiode 110P. According to the second embodiment of the present disclosure, the second transistor reads the charges generated by the photodiode 110P, so that it is possible to also obtain information on the intensity of a component in a visible region in the incident light.

Figure 23:
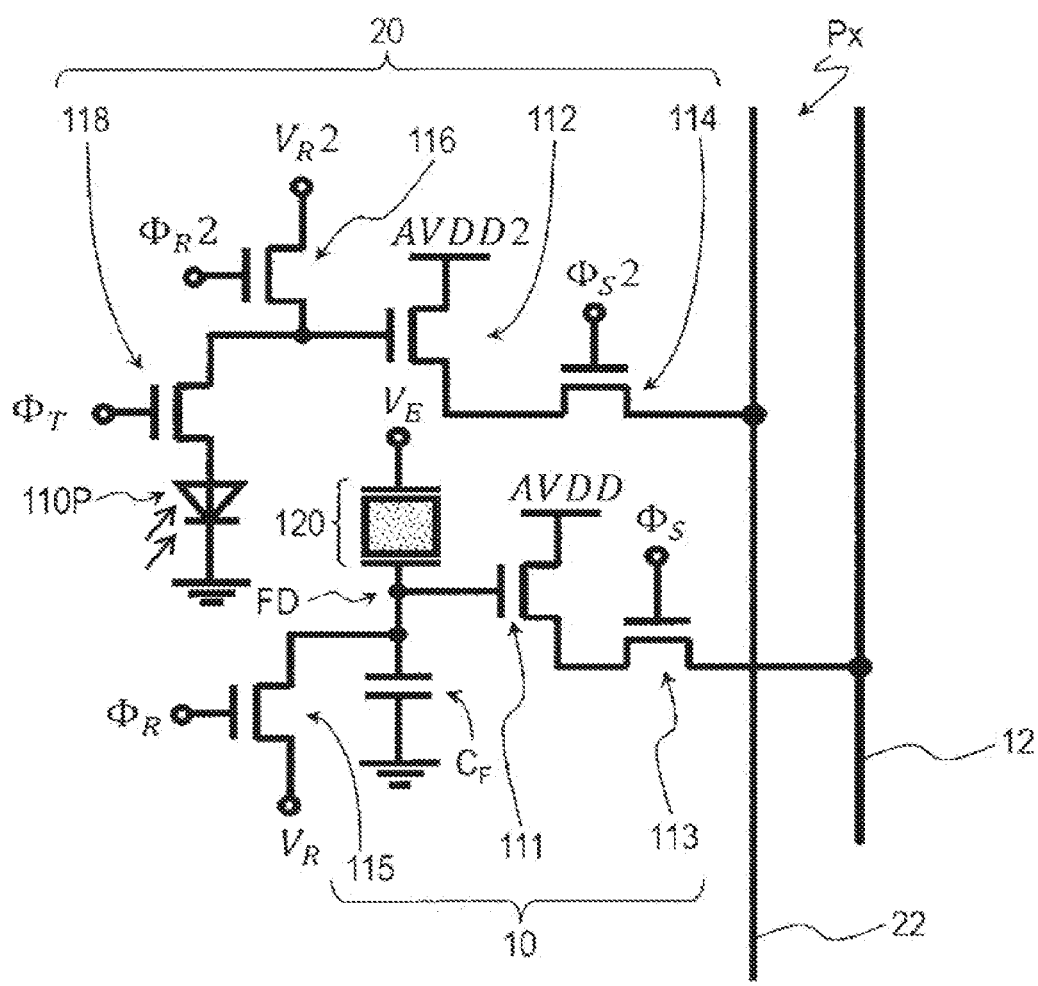
FIG. 23 is a diagram schematically illustrating an exemplary circuit configuration of each pixel in the imaging device illustrated in FIG. 22.

FIG. 23 illustrates an example of a circuit configuration of each pixel Px of the imaging device 100B. In the configuration illustrated in FIG. 23, each pixel Px includes a second detection circuit 20 connected to a second output signal line 22 in addition to the detection circuit 10. As illustrated, the second detection circuit 20 includes a second transistor 112, a second selection transistor 114, and a second reset transistor 116. In this example, the second detection circuit 20 further includes a transfer transistor 118. This transfer transistor 118 is connected between the photodiode 110P and the second transistor 112 as the signal detection transistor. The second transistor 112, the second selection transistor 114, the second reset transistor 116, and the transfer transistor 118 are typically N-channel MOSFETs, and are formed in the second surface 110$b$ of the semiconductor substrate 110B as is the case with the transistors in the detection circuit 10.

The gate of the second transistor 112 is connected to the photodiode 110P via the transfer transistor 118. When the drain of the second transistor 112 is supplied with a predetermined power supply voltage AVDD2, the second transistor 112 functions as a source follower and outputs a signal depending on the voltage applied to the gate to the second output signal line 22 through the second selection transistor 114. The power supply voltage AVDD2 may be a voltage different from or same as the power supply voltage AVDD supplied to the drain of the first transistor 111. Here, the gate electrode of the second transistor 112 may be formed concurrently in the step of forming the gate electrode of the first transistor 111 described above. In other words, the gate electrode of the second transistor 112 may be in the same layer as the gate electrode of the first transistor 111.

The operation of the transfer transistor 118 is controlled by a potential $\Phi_T$ at a transfer control line connected to the gate of the transfer transistor 118. The potential $\Phi_T$ at the transfer control line is controlled by, for example, a vertical scanning circuit. Similarly, a potential $\Phi_S2$ at a second address control line connected to the gate of the second selection transistor 114 may also be controlled by the vertical scanning circuit. In other words, the vertical scanning circuit can perform on/off control of the transfer transistor 118 and on/off control of the second selection transistor 114.

One of the source and the drain of the second reset transistor 116 is electrically connected to the gate of the second transistor 112, and a predetermined reset voltage $V_R2$ is applied to the other one of the source and the drain during operation. A potential $\Phi_R2$ at a second reset control line connected to the gate of the second reset transistor 116 may also be controlled by the vertical scanning circuit.

In this example, the first transistor 111 is connected to the output signal line 12 and the second transistor 112 is connected to the second output signal line 22. Thus, a signal from the first transistor 111 and a signal from the second transistor 112 can be read independently. More specifically, it is possible to individually obtain a signal relating to the intensity of light in the infrared region, in particular, having the first wavelength $\lambda_1$ and a signal relating to the intensity of visible light.

In the configuration illustrated in FIG. 23, column signal processing circuits each including an analog-digital conversion circuit may be connected to the output signal line 12 and the second output signal line 22 independently. The signal relating to the intensity of light in the infrared region, in particular, having the first wavelength $\lambda_1$ obtained by the photoelectric converter 120 and the signal relating to the intensity of visible light obtained by the photodiode 110P may be converted to digital signals at different timings.

Figure 24:
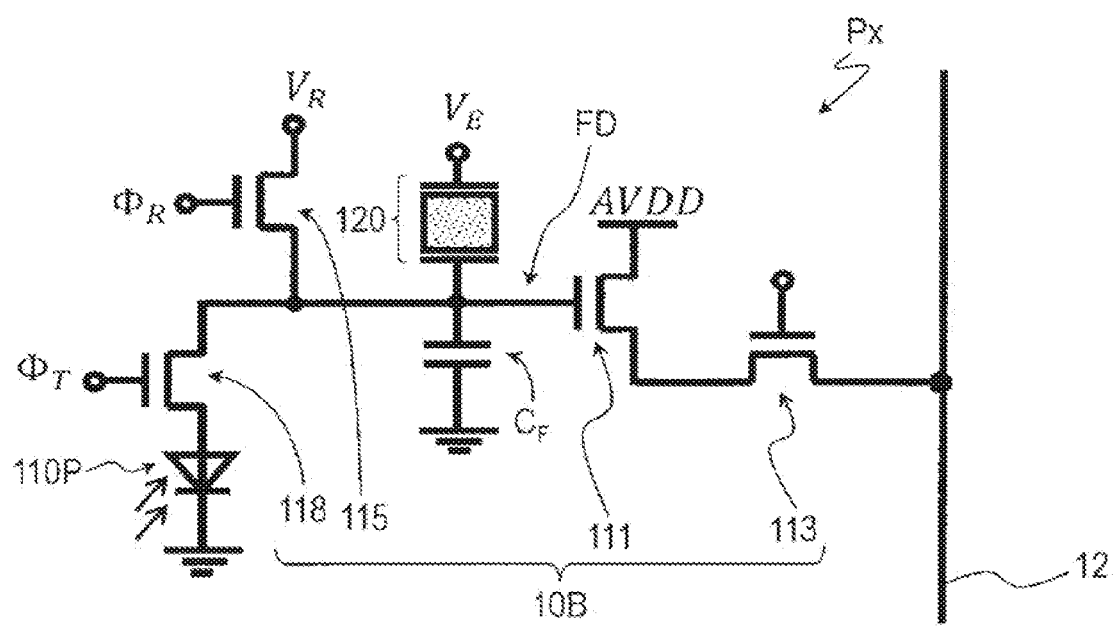
FIG. 24 is a diagram schematically illustrating another exemplary circuit configuration of each pixel in the imaging device illustrated in FIG. 22.

FIG. 24 illustrates another example of a circuit configuration of each pixel Px of the imaging device 100B. In the configuration illustrated in FIG. 24, each pixel Px includes a detection circuit 10B. The detection circuit 10B has a form in which the transfer transistor 118 is further added to the aforementioned detection circuit 10. In this example, the photodiode 110P is further connected to the floating diffusion node FD to which the photoelectric converter 120 is connected.

According to the circuit configuration illustrated in FIG. 24, it is possible to individually obtain a signal relating to the intensity of light having the first wavelength $\lambda_1$ and a signal relating to the intensity of visible light while suppressing an increase in the size of the entire detection circuit. However, from the viewpoint of a flame rate, the circuit configuration illustrated in FIG. 23 is more advantageous because each of the signals can be read independently.

Modification Example 1

Figure 25:
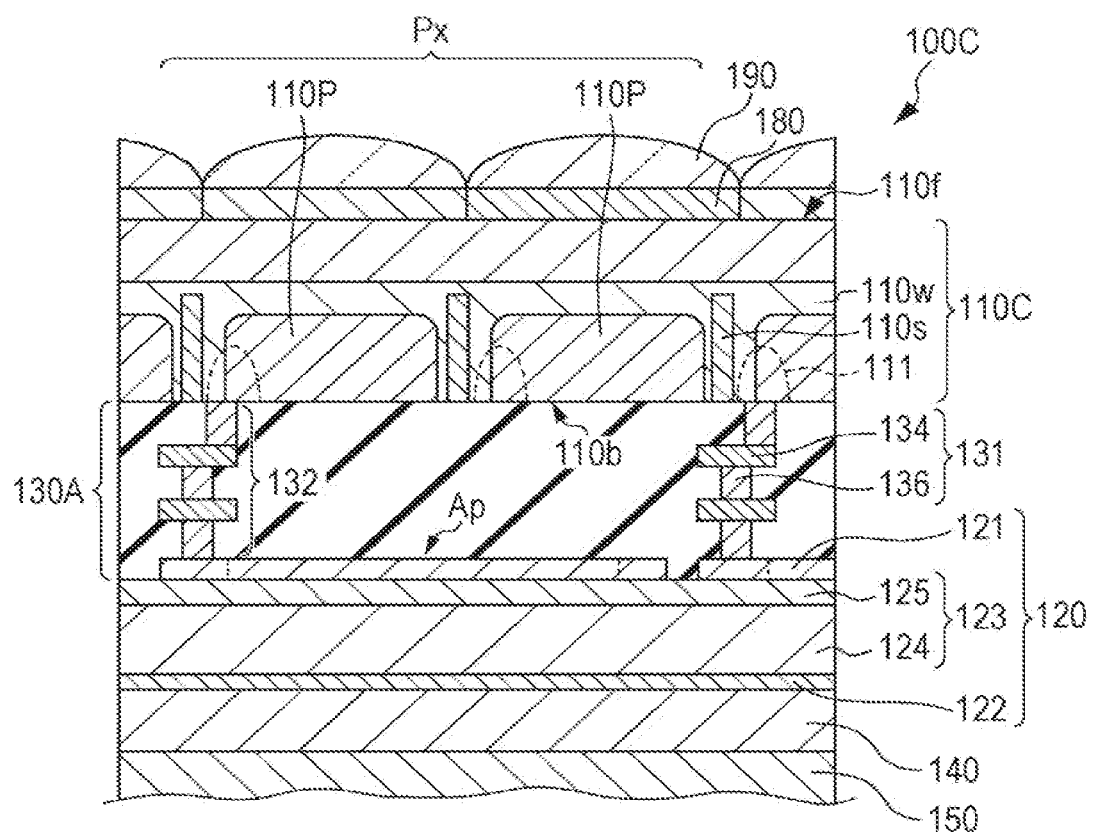
FIG. 25 is a schematic sectional view illustrating a device structure of pixels in an imaging device according to a modification example of the second embodiment.

FIG. 25 schematically illustrates a device structure of pixels of an imaging device according to a modification example of the second embodiment. An imaging device 100C illustrated in FIG. 25 includes a semiconductor substrate 110C located above the photoelectric converter 120. The imaging device 100C is the same as the imaging device 100B illustrated in FIG. 22 in that multiple photodiodes 110P are formed in the semiconductor substrate 110C, and second transistors 112 are connected to the photodiodes 110P. Therefore, also in this example, it is possible to individually obtain a signal relating to the intensity of light having the first wavelength $\lambda_1$ and a signal relating to the intensity of visible light. When the example described in reference to FIG. 22 and the imaging device 100C illustrated in FIG. 25 are compared, the imaging device 100C in the example illustrated in FIG. 25 includes multiple photodiodes 110P for each pixel Px.

Figure 26:
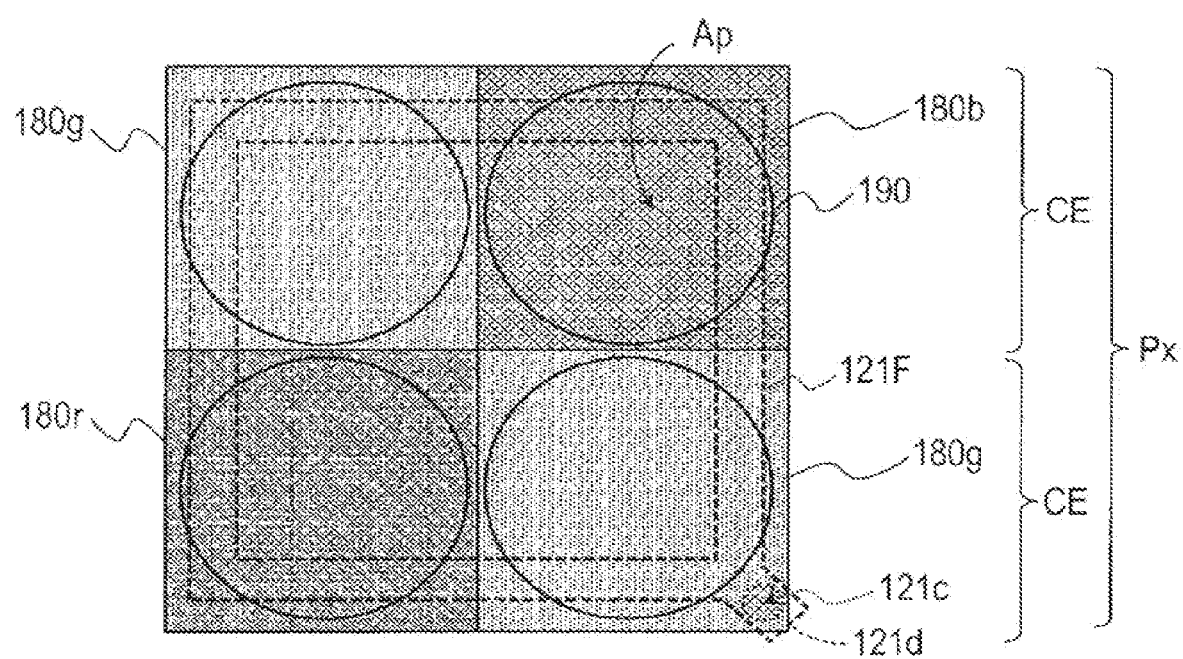
FIG. 26 is a schematic top view illustrating an example of a layout of microlenses, a color filter, and pixel electrodes.

FIG. 26 illustrates an example of the layout of the microlenses 190, the color filter 180, and the pixel electrode 121 when viewed in a direction normal to the semiconductor substrate 110C. In the structure illustrated in FIG. 26, the pixel Px includes four cells CE arrayed in two rows and two columns. Here, each of these cells CE has a structure including one of the aforementioned photodiodes 110P.

In this example, the color filter 180 located above the photoelectric converter 120 in a certain pixel Px includes one first filter area 180$r$, two second filter areas 180$g$, and one third filter area 180$b$. The first filter area 180$r$ selectively transmits light in a red wavelength region. The second filter areas 180g each selectively transmit light in a green wavelength region, and the third filter area 180b selectively transmits light in a blue wavelength region. These first filter area 180r, second filter areas 180g, and third filter area 180b respectively cover the corresponding photodiodes 110P right below them among the multiple photodiodes 110P not illustrated in FIG. 26. This structure is capable of obtaining, for each pixel Px, a signal relating to the intensity of infrared light and additionally, for example, a signal relating to the intensity of red light, a signal relating to the intensity of green light, and a signal relating to the intensity of blue light.

In this example, each pixel Px includes four microlenses 190 corresponding to the four cells CE included in the pixel Px. In the structure illustrated in FIG. 26, a pixel electrode 121F coves the four cells CE and includes one aperture Ap at its center. However, the number of apertures Ap is not limited to one, and four apertures in total may be provided corresponding to the four cells CE included in the pixel Px.

In the example illustrated in FIG. 26, a connecting portion 121c between the pixel electrode and the conductive structure 132 is disposed at the cell CE located at the lower right position in FIG. 26 among the four cells CE. However, the connecting portion 121c may be located at any position as long as the connecting portion 121c is not located on an optical path in the insulating layer 130A. In the structure in which each pixel Px includes multiple cells CE as in the example illustrated in FIG. 26, the connecting portion 121c may be located at the center of the pixel Px. Also in this case, the connecting portion 121c is located outside the outer rims of the microlenses 190 as in the examples described in reference to FIGS. 4 to 8.

Modification Example 2

Figure 27:
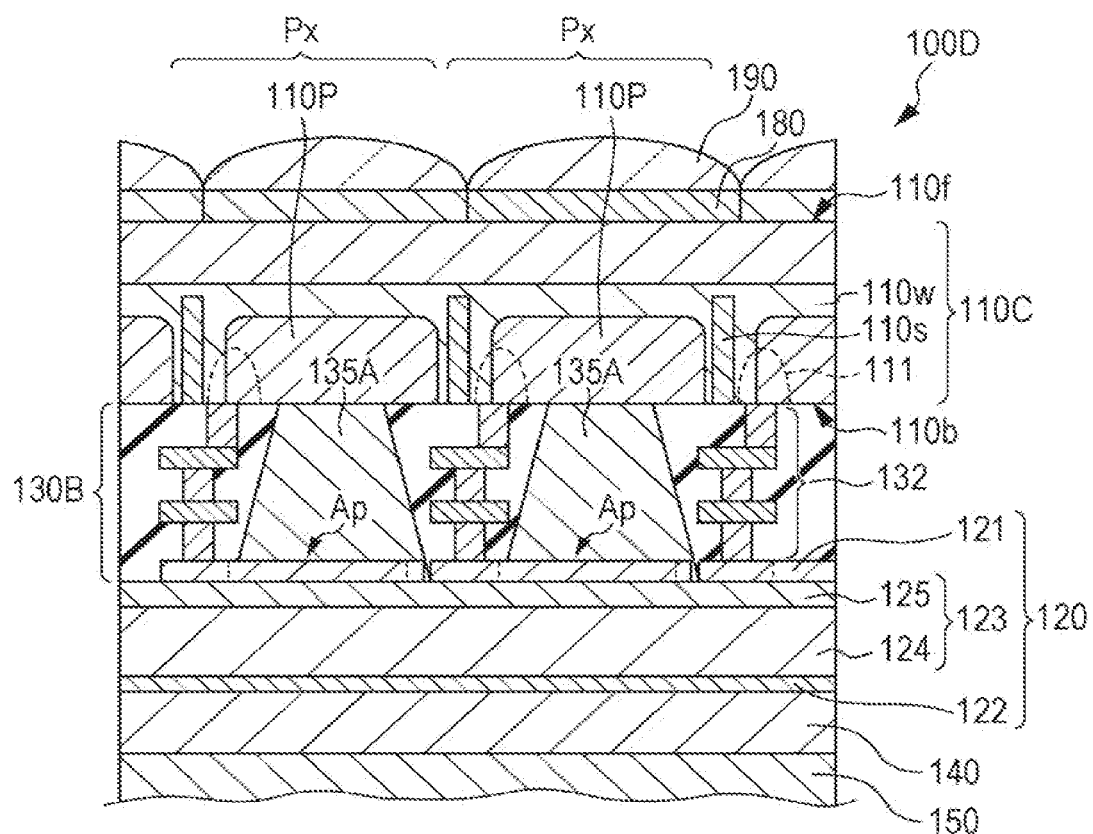
FIG. 27 is a schematic sectional view illustrating a device structure of pixels in an imaging device according to another modification example of the second embodiment.

FIG. 27 schematically illustrates a device structure of pixels of an imaging device according to another modification example of the second embodiment. A main difference between the examples described above and an imaging device 100D illustrated in FIG. 27 is that the structure illustrated in FIG. 27 is provided with an insulating layer 130B in which waveguide structures 135A are formed in place of the insulating layer 130A.

The waveguide structures 135A located between the semiconductor substrate 110C and the photoelectric converter 120 are formed of, for example, an organic material such as polyimide in which TiO is dispersed, a silicon nitride, or the like, and have a higher refractive index than the other part of the insulating layer 130B has. The range of the refractive index of the waveguide structures 135A varies depending on a wavelength desired to be detected through the photoelectric converter 120 but is typically equal to or higher than 1.6.

The waveguide structures 135A can be formed in the following way, for example. First, as in the example described in reference to FIG. 18, an insulating interlayer covering the second surface 110b of the semiconductor substrate 110C and a multilayer wire are formed. Then, multiple recessed portions are formed in the insulating interlayer by reactive ion etching (RIE) or the like such that the portion of the insulating interlayer where the wire is disposed can remain. These recessed portions are provided at positions corresponding to the photodiodes 110P formed in the semiconductor substrate 110C. The depth of the recessed portions formed in this process is within a range of, for example, about 400 nm to 600 nm. Then, a material having a higher refractive index than a material for the insulating interlayer has is deposited. As a result of depositing the high refractive index material, the inside of the recessed portions formed in the insulating interlayer is filled with the high refractive index material. The upper surface of the film of the high refractive index material is smoothed if necessary. The inside of the recessed portions may be filled with the high refractive index material after a film of an infrared reflective material such as a metal is formed on the surfaces of the recessed portions.

As can be seed from FIG. 27, these waveguide structures 135A are provided independently of each other in the insulating layer 130B corresponding to the respective photodiodes 110P formed in the semiconductor substrate 110C. The various control lines such as the address control lines, the output signal lines 12, the second output signal lines 22, and the conductive structures 132 described above are located in areas of the insulating layer 130B other than the areas where the waveguide structures 135A are formed. Protruding portions of the insulating layer 130B that cover the wiring portions of the multilayer wire and the waveguide structures 135A located in the recessed portions formed between these protruding portions function as claddings and cores. The structure illustrated in FIG. 27 is capable of efficiently guiding infrared light transmitted through the semiconductor substrate 110C to the photoelectric converter.

An insulating layer including waveguide structures similar to the foregoing waveguide structures 135A may be interposed between the color filter 180 and the first surface 110f of the semiconductor substrate (the semiconductor substrate 110B or the semiconductor substrate 110C) in which the photodiodes 110P are formed. In this case, a wire to be involved in reading signals from the photodiodes 110P may be disposed at an area, other than the areas provided with the waveguide structures, inside the insulating layer located between the color filter 180 and the first surface 110f. When the waveguide structures are provided inside the insulating layer located between the color filter 180 and the first surface 110f, a component in a visible region in light incident on the imaging device 100B can be efficiently guided to the photodiodes 110P.

A method of forming a waveguide in an insulating interlayer is described in Japanese Unexamined Patent Application Publication Nos. 2012-114155 and 2011-243753, and others. For reference, the entire content disclosed in Japanese Unexamined Patent Application Publication No. 2012-114155 and the entire content disclosed in Japanese Unexamined Patent Application Publication No. 2011-243753 are incorporated in the present description.

Figure 28:
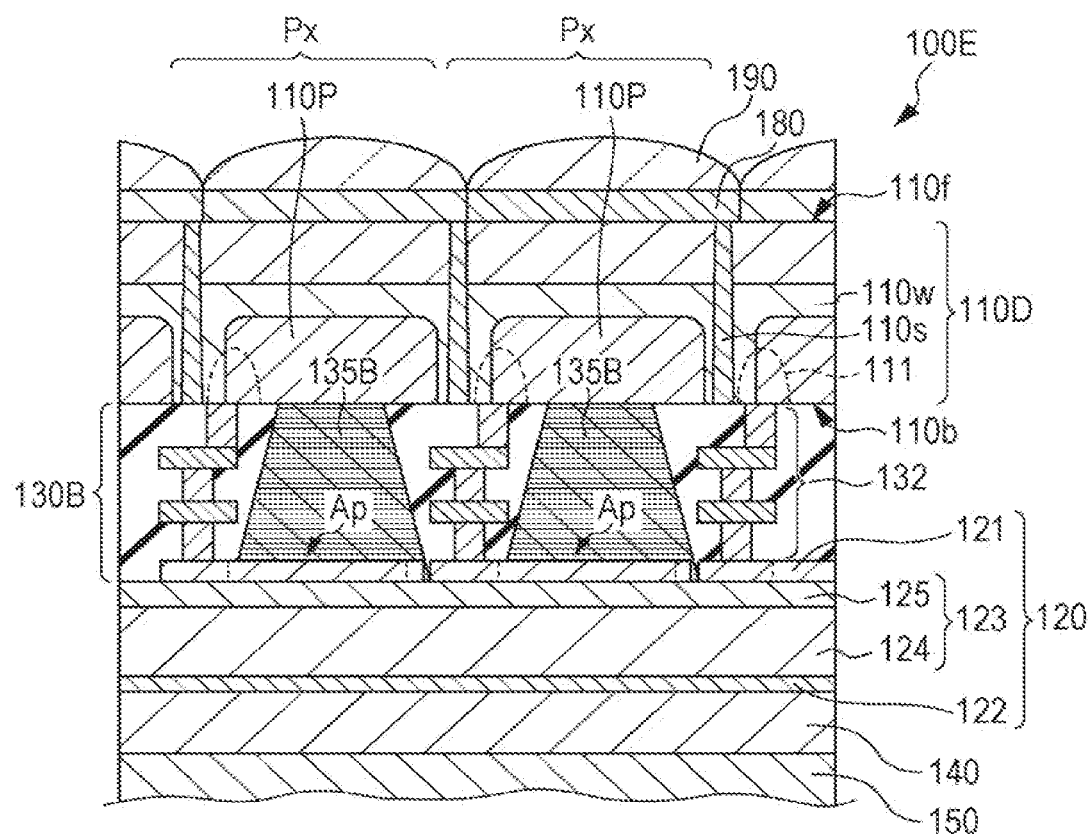
FIG. 28 is a schematic sectional view for explaining a modification example of a waveguide structure.

As illustrated in FIG. 28, the waveguide structures 135B may be formed by forming multiple recessed portions in the insulating interlayer covering the second surface 110b of the semiconductor substrate, and thereafter stacking an insulating film, a metal film, and so on inside these recessed portions. When the waveguide structure 135B is formed in the form of the stacked films of the insulating film, the metal film, and so on, the waveguide structure 135B can be equipped with a function as an interference-type band pass filter. The waveguide structure 135B having a band pass filter function can complement the long pass filter function of the semiconductor substrate.

In an imaging device 100E illustrated in FIG. 28, an element isolation region 110s that isolates multiple photodiodes 110P from each other is formed in the form of a deep trench inside a semiconductor substrate 110D. In this case, each photodiode 110P surrounded by the element isolation region 110s may additionally function as a waveguide structure, so that an effect of improving the sensitivity for the visible region can be expected. In addition, light incident on a certain cell CE can be efficiently guided to an area of the photoelectric converter 120 corresponding to that cell CE, so that the sensitivity for the infrared region can also be improved. Furthermore, the effect of compensating for spot spreading due to the aberration of the microlens can be expected.

Such an element isolation region 110s may be formed by, for example, forming a through hole in the semiconductor substrate and thereafter filling the inside of the through hole with tetraethoxysilane (TEOS). With this structure, light incident on the semiconductor substrate 110D can be reflected at the position of the side surface defining the through hole. After the formation of the through hole, for example, a SiN film may be formed on the side surface defining the through hole. As another option, the surface of the element isolation region 110s may be covered with a metal material that reflects visible light and/or infrared light such as Au, Al, or Ti by, for example, physical vapor deposition, so that the even higher effect can be expected. Such a structure is particularly advantageous for a structure in which one photodiode 110P is provided for each pixel Px as in the imaging device 100B illustrated in FIG. 22.

As schematically illustrated in FIG. 28, the element isolation region 110s may extend from the second surface 110b to an area deeper than the well 110w in the semiconductor substrate 110D. In FIG. 28, the element isolation region 110s is depicted such that the element isolation region 110s is tapered from the second surface 110b toward the first surface 110f in the semiconductor substrate 110D. Instead, the element isolation region 110s may have a shape tapered from the first surface 110f toward the second surface 110b in the semiconductor substrate 110D.

Third Embodiment

Figure 29:
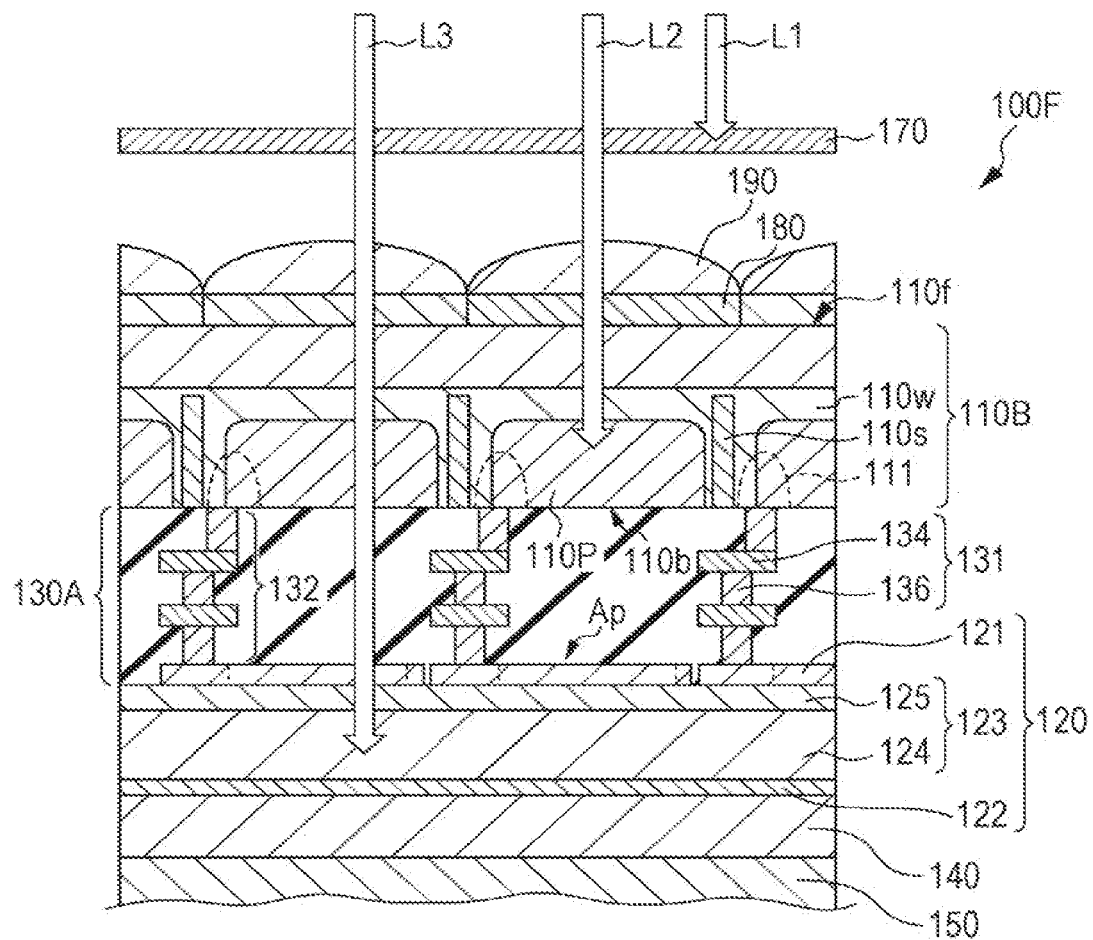
FIG. 29 is a schematic sectional view illustrating a device structure of an imaging device according to a third embodiment of the present disclosure.

FIG. 29 schematically illustrates a device structure of pixels of an imaging device according to a third embodiment of the present disclosure. An imaging device 100F illustrated in FIG. 29 has almost the same structure as the imaging device 100B described in reference to FIG. 22 except that the imaging device 100F further includes a band stop filter 170 located on the first surface 110f side of the semiconductor substrate 110B. In this example, one photodiode 110P is disposed for each pixel Px, but it goes without saying that each pixel Px may include multiple photodiodes 110P.

The band stop filter 170 has spectral transmission characteristics transmitting substantially no light in a wavelength region of longer than or equal to 0.75 μm and shorter than 1.1 μm, and transmitting light having a wavelength longer than or equal to 1.1 μm. Here, "transmitting substantially no light" means that the transmittance to light having a concerned wavelength is within a range of less than or equal to 5%. For example, a filter commercially available under the name of a band stop filter is typically capable of cutting light having a particular wavelength down to about 1% to 5%. In other words, the band stop filter 170 selectively blocks a component within a band which silicon can absorb in infrared light.

As the band stop filter 170, an absorption-type filter, a film with a surface on which a dielectric multilayer film is formed (for example, a dichroic filter), or the like can be used. In addition, some of optical filters commercially available under the names of short-pass filters or IR-cut filters transmit a component having a wavelength longer than or equal to 1.1 μm. Such an optical filter can also be used as the band stop filter 170 if the optical filter has a property of transmitting substantially no light in a wavelength region of longer than or equal to 0.75 μm and shorter than 1.1 μm. The absorption-type filter is advantageous for wide angle imaging because it does not have a dependence on the light incident angle. On the other hand, when the band stop filter 170 is formed in the form of a dielectric multilayer film, it is easy to obtain a sharp step-like change between a region at which high transmittance is demonstrated and a region at which almost no transmittance is demonstrated.

As schematically illustrated with a thick arrow L1 in FIG. 29, a component having a wavelength longer than or equal to 0.75 μm and shorter than 1.1 μm in light incident on the imaging device 100F is blocked by the band stop filter 170. Meanwhile, a component having a wavelength shorter than 0.75 μm and a component having a wavelength longer than or equal to 1.1 μm in the light incident on the imaging device 100F are transmitted through the band stop filter 170 and reach the semiconductor substrate 110B. Of these components, the former component (schematically illustrated with a thick arrow L2 in FIG. 29) is photoelectrically converted by the photodiodes 110P in the semiconductor substrate 110B. Then, of these components, the latter component (schematically illustrated with a thick arrow L3 in FIG. 29), that is, infrared light having a wavelength longer than or equal to 1.1 μm is transmitted even through the semiconductor substrate 110B and the insulating layer 130A and reaches the photoelectric converter 120.

According to the third embodiment, the light in the wavelength region of longer than or equal to 0.75 μm and shorter than 1.1 μm at which silicon demonstrates absorption in the infrared light is cut by the band stop filter 170 before reaching the photodiodes 110P. This enables suppression of the generation of unnecessary charges due to photoelectric conversion of infrared light by the photodiodes 110P, and accordingly avoidance of inclusion of noise into signals relating to the intensity of visible light. In other words, it is possible to prevent the white balance from being lost due to photoelectric conversion of infrared light by the photodiodes 110P. The disposition of the band stop filter 170 is not limited to the example illustrated in FIG. 29, and the band stop filter 170 may be disposed between the color filter 180 and the microlenses 190.

Instead of disposing the band stop filter 170 on the first surface 110f side of the semiconductor substrate, an absorption-type filter that transmits substantially no light in the wavelength region of longer than or equal to 0.75 μm and shorter than 1.1 μm may be used as the color filter 180. A general color filter is produced by curing a material in which a dye is dispersed in an organic material. For example, when a phthalocyanine-based near-infrared absorbing dye or the like is further dispersed in an organic material, a color filter can be obtained which selectively transmits light in a wavelength region of shorter than 0.75 μm and light in a wavelength region of longer than or equal to 1.1 μm. Instead of disposing the band stop filter 170 on the first surface 110f side of the semiconductor substrate, the application of such a color filter also produces the same effect of preventing the white balance from being lost as in the foregoing example.

Fourth Embodiment

Figure 30:
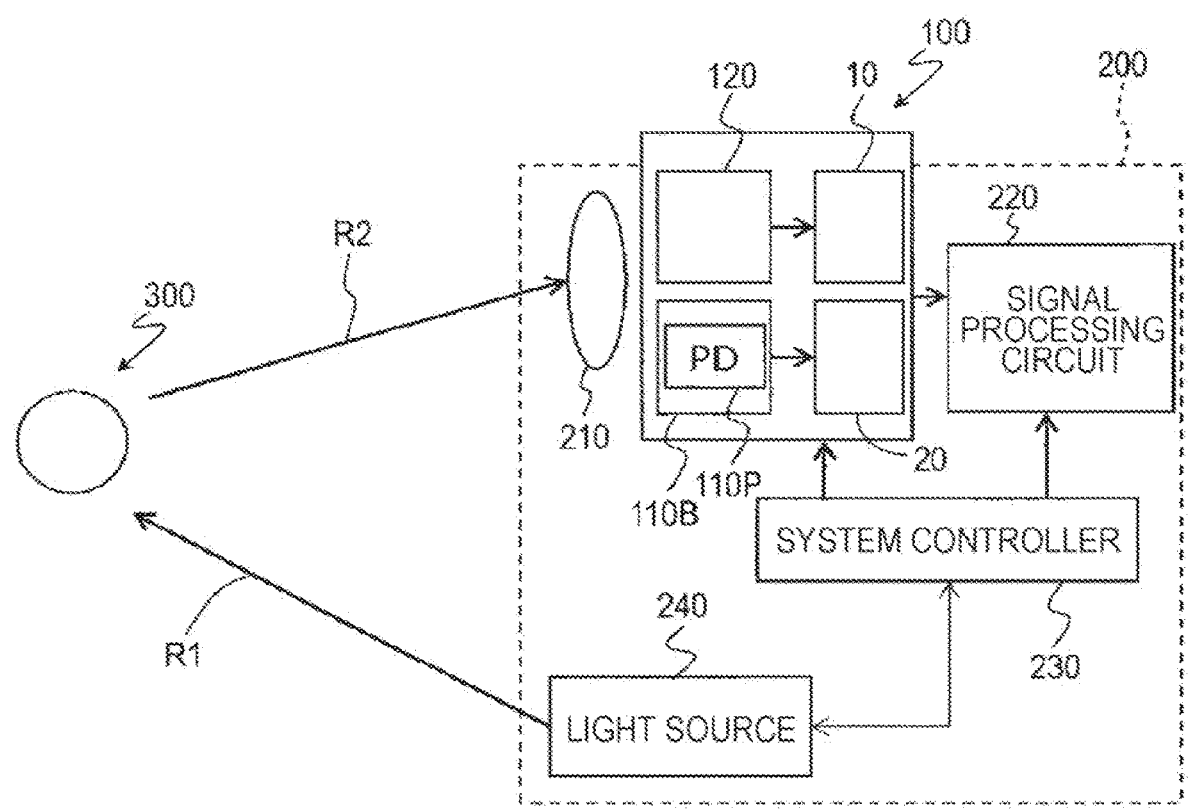
FIG. 30 is a schematic block diagram illustrating an overall configuration of an imaging system according to a fourth embodiment of the present disclosure.

FIG. 30 schematically illustrates an imaging system according to a fourth embodiment of the present disclosure. An imaging system 200 illustrated in FIG. 30 includes an imaging device 100, a lens optical system 210, a signal processing circuit 220, a system controller 230, and a light source 240. As the imaging device 100, any of the foregoing imaging devices 100B, 100C, 100D, 100E, and 100F may be applied. In the structure illustrated in FIG. 30, the imaging device 100 includes a photoelectric converter 120, a semiconductor substrate 110B including one or more photodiodes 110P, a detection circuit 10, and a second detection circuit 20.

The lens optical system 210 includes, for example, an auto-focus lens, a zoom lens, and an aperture stop. The lens optical system 210 focuses light on an image plane of the imaging device 100. The signal processing circuit 220 processes output signals from the detection circuit 10 and the second detection circuit 20. The signal processing circuit 220 performs processing such for example as gamma correction, color interpolation processing, spatial interpolation processing, and automatic white balancing. Depending on the use purpose of the imaging system 200, the signal processing circuit 220 also executes processing such as distance measurement calculation and wavelength information separation. The signal processing circuit 220 may be implemented by a digital signal processor (DSP), an image signal processor (ISP), a field-programmable gate array (FPGA), or the like. The signal processing circuit 220 may include one or more memories.

The system controller 230 controls the entire imaging system 200. In this example, in particular, the system controller 230 causes the light source 240 and the imaging device 100 to operate in synchronization with each other. The system controller 230 may be implemented by, for example, a microcontroller. The system controller 230 may include one or more memories.

The light source 240 is an infrared light source that emits light in a wavelength region of longer than or equal to 1.1 µm. An infrared laser may be used as the light source 240. In particular, a light source that emits light in a wavelength region around 1.4 µm, called an eye safe region, may be advantageously used as the light source 240. As described above, the light source 240 and the imaging device 100 operate in synchronization with each other according to instructions from the system controller 230. In some application of the imaging system 200, the light source 240 emits illumination light R1 toward a subject 300, and the imaging device 100 performs imaging based on reflected light R2 from the subject 300.

As schematically illustrated in FIG. 30, the detection circuit 10 has a connection with the photoelectric converter 120, thereby outputting signals based on signal charges generated by the photoelectric converter 120, while the second detection circuit 20 has a connection with the photodiodes 110P, thereby outputting signals based on signal charges generated by the photodiodes 110P. That is, the imaging system 200 can obtain an image based on light with a particular wavelength in an infrared region and an image based on visible light. In the following description, the image based on the light in the particular wavelength in the infrared region is simply referred to as the "infrared image" and the image based on the visible light is simply referred to as the "visible image". In FIG. 30, the semiconductor substrate 110B, the detection circuit 10, and the second detection circuit 20 are drawn separately from each other, but the detection circuit 10 and the second detection circuit 20 may be formed on the semiconductor substrate 110B. The detection circuit 10B illustrated in FIG. 24 may be applied instead of a set of the detection circuit 10 and the second detection circuit 20.

Figure 31:
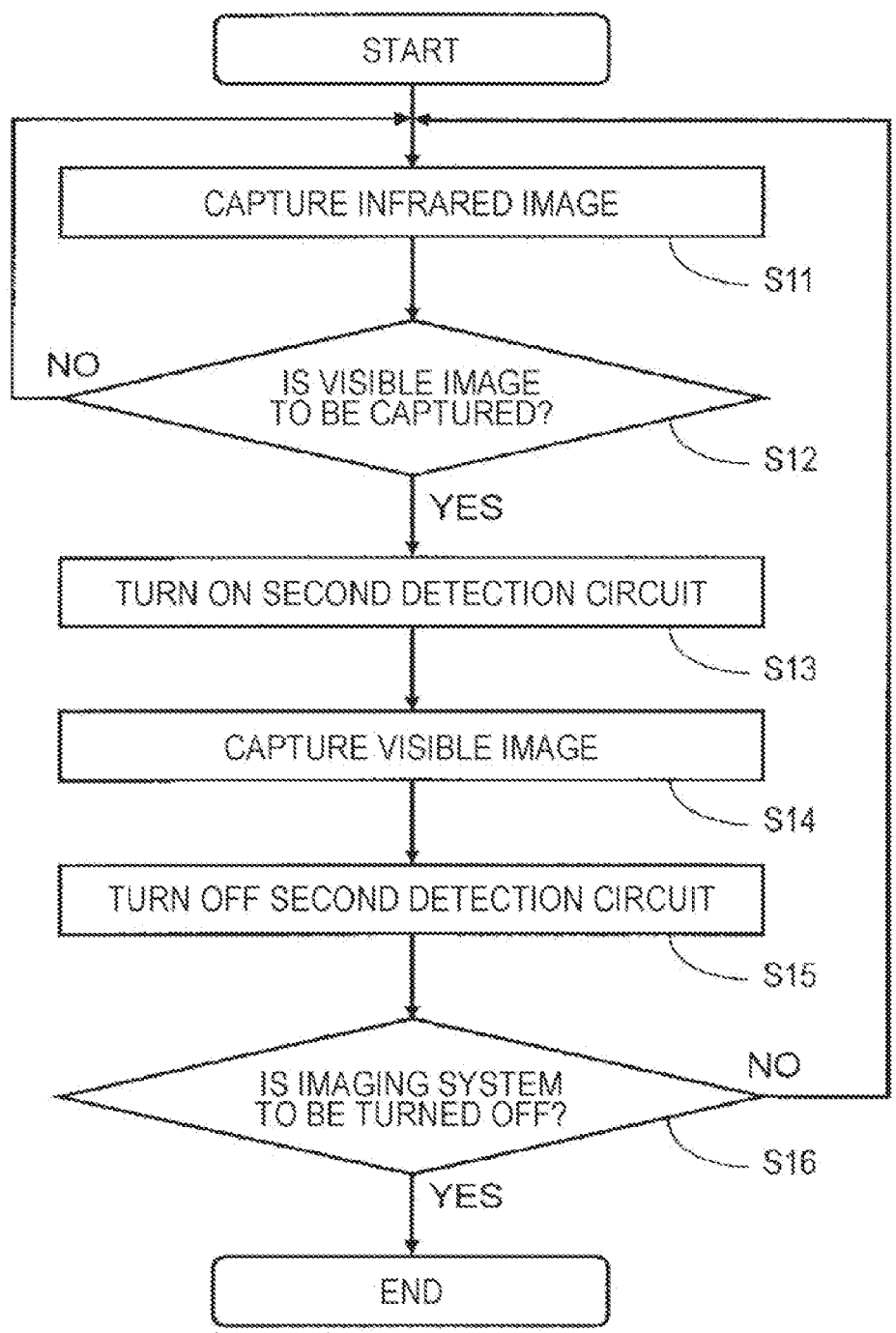
FIG. 31 is a flowchart illustrating an example of an operation of an imaging system.

FIG. 31 presents an example of an operation of the imaging system 200. FIG. 31 is the example in which the imaging system 200 operates according to an event-driven program.

In this example, first at step S11, the detection circuit 10 captures an infrared image by reading signal charges from the photoelectric converter 120. The image signal obtained in this step is a signal representing an image based on light having the first wavelength $\lambda_1$. If necessary, the imaging may be executed by causing the light source 240 to emit light having the first wavelength $\lambda_1$ and operating the photoelectric converter 120 in synchronization with the light source 240. The light source 240 does not have to be always turned on, but has to be turned on only during the execution of imaging.

Next, at step S12, the obtained image signal based on the infrared light is analyzed to determine whether to capture a visible image. For example, a preset threshold and a pixel value may be compared, and the processing may be advanced to step S13 if the pixel value exceeds the threshold, or be returned to step S11 if the pixel value is equal to or less than the threshold. Instead, a difference from the infrared image captured in the previous flame may be obtained or pattern matching may be executed to detect a moving object such as a person. Then, if such an object is detected, the processing may be advanced to step S13. The distance to the subject may be calculated based on a signal from the detection circuit 10, and the processing may be advanced to step S13 if the distance does not exceed a predetermined threshold. Such determination may be executed by the signal processing circuit 220.

Next, the second detection circuit 20, which has been turned off, is turned on at step S13, and captures a visible image by reading signal charges from the photodiodes 110P at step S14. After capturing the visible image, the second detection circuit 20 is again turned off at step S15. The imaging system 200 may include a circuit that determines whether to operate the photodiodes 110P based on an analysis result of the image signal based on infrared light as described above. The circuits on the photodiode 110P side are activated selectively when capturing of a visible image is determined at step S12, which leads to saving of power consumption.

Thereafter, whether a turning-off command is inputted by a user is determined at step S16, and the processing is terminated if the turning-off of the imaging system 200 is selected. If the command to turn off the imaging system 200 is not given, the processing is returned to step S11, and the above steps S12 to S16 are iterated.

In the example illustrated in FIG. 31, the photoelectric converter 120 and the detection circuit 10 are used as an infrared sensor, and whether to capture a visible image is determined according to an output therefrom. In this way, the circuits on the photodiode 110P side are operated as needed based on information on the distance to the subject or information on a movement of the subject, which is obtained by the photoelectric converter 120 and the detection circuit 10, so that the imaging system 200 can capture an image containing information on colors when necessary while saving power consumption.

Such an application is particularly useful for nighttime surveillance. The imaging system may be further equipped with a light source that emits visible light, and may turn on the light source when determining to capture a visible image. Turning on the light source that emits light in the visible region makes it possible to capture a clearer visible image containing information on colors or to give a warning to a suspicious person. The captured visible image may be transmitted to an external server. Here, the capturing of the infrared image at step S11 may be executed in certain cycles such as every minute or every hour.

Here, if carbon nanotubes having different chiralities are mixed in the photoelectric conversion film 124 of the photoelectric converter 120, the wavelength region of light to be emitted from the light source 240 may be selected depending on the chiralities of the carbon nanotubes used in the photoelectric conversion film 124. For example, if carbon nanotubes having an absorption peak at a wavelength of 1.2 μm and carbon nanotubes having an absorption peak at a wavelength of 1.4 μm are mixed in the photoelectric conversion film 124, any one of 1.2 μm and 1.4 μm may be selected as the wavelength of light to be emitted from the light source 240. In the case of indoor imaging or nighttime imaging, artificial illumination does not basically contain light in a wavelength region of longer than or equal to 1 μm. For this reason, even when the photoelectric conversion film 124 absorbs both light at the wavelength of 1.2 μm and light at the wavelength of 1.4 μm, the light source 240 is set to emit light at the wavelength of, for example, 1.2 μm, so that the generation of charges due to the absorption of light at the wavelength of 1.4 μm can be avoided and thereby a decrease in the SNR can be avoided.

The determination on whether to capture a visible image may be executed outside the imaging system 200. For example, the data of the captured infrared image may be transmitted to an external server or the like, and the external server may execute the determination on whether to capture a visible image. If the imaging system 200 is installed in a vehicle such as an automobile, a visible image may be captured when a headway (time headway) to an obstacle, a preceding vehicle, a person, or the like falls down below a predetermined threshold.

Figure 32:
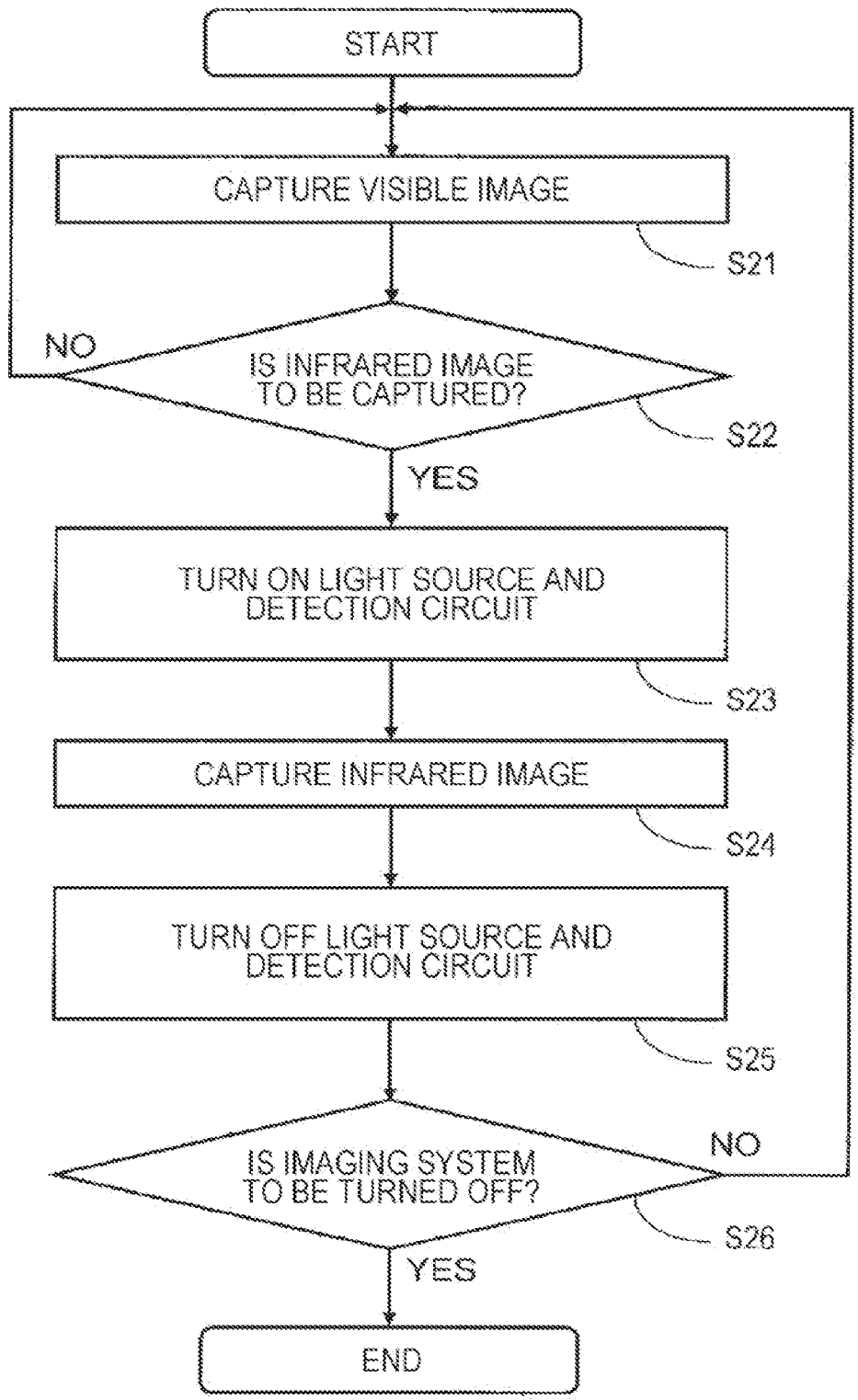
FIG. 32 is a flowchart illustrating another example of an operation of the imaging system.

FIG. 32 presents another example of an operation of the imaging system 200. The operation presented in FIG. 32 is an example where visible images are captured in a normal operation and an infrared image is captured if necessary.

In this example, first at step S21, the second detection circuit 20 reads signal charges from the photodiodes 110P. In other words, a visible image is captured herein. The capturing of the visible image is executed, for example, in certain cycles.

Next, at step S22, whether to capture an infrared image is determined by analyzing the obtained image signals based on the visible light. For example, a preset threshold and a pixel value are compared, and the processing is advanced to step S23 if the pixel value falls below the threshold, or is returned to step S21 if the pixel value is equal to or more than the threshold. In the case where such a criterion is applied, capturing of an infrared image is determined, for example, when the brightness of the image decreases over all due to approaching nightfall. Such determination may be executed by the signal processing circuit 220 or the system controller 230.

Next, at step S23, the light source 240 is turned on and the detection circuit 10, which has been turned off, is turned on. When the light source 240 is turned on, the photoelectric converter 120 receives infrared light emitted from the light source 240 and then reflected by a subject. Since the detection circuit 10 is turned on, an infrared image based on a signal from the photoelectric converter 120 is captured at step S24. After the infrared image is captured, the processing is advanced to step S25, at which the light source 240 and the detection circuit 10 are again turned off.

Thereafter, whether a turning-off command is inputted by a user, for example, is determined at step S26. If the command to turn off the imaging system 200 is not given, the processing is returned to step S21.

In such an operation, when the brightness of the visible image decreases, the imaging system 200 is transitioned into an infrared imaging mode, so that a bright image based on infrared light can be more surely captured. In addition, unless capturing of an infrared image is determined at step S22, the circuits on the photoelectric converter 120 side and the light source 240 are not turned on. This enables saving of power consumption. Such an application is useful for switching between daytime and nighttime imaging modes in a surveillance camera. Thus, the imaging system 200 may include a control circuit or the like that determines whether to operate the light source 240 based on outputs from the photodiodes 110P.

Other Modification Examples

Figure 33:
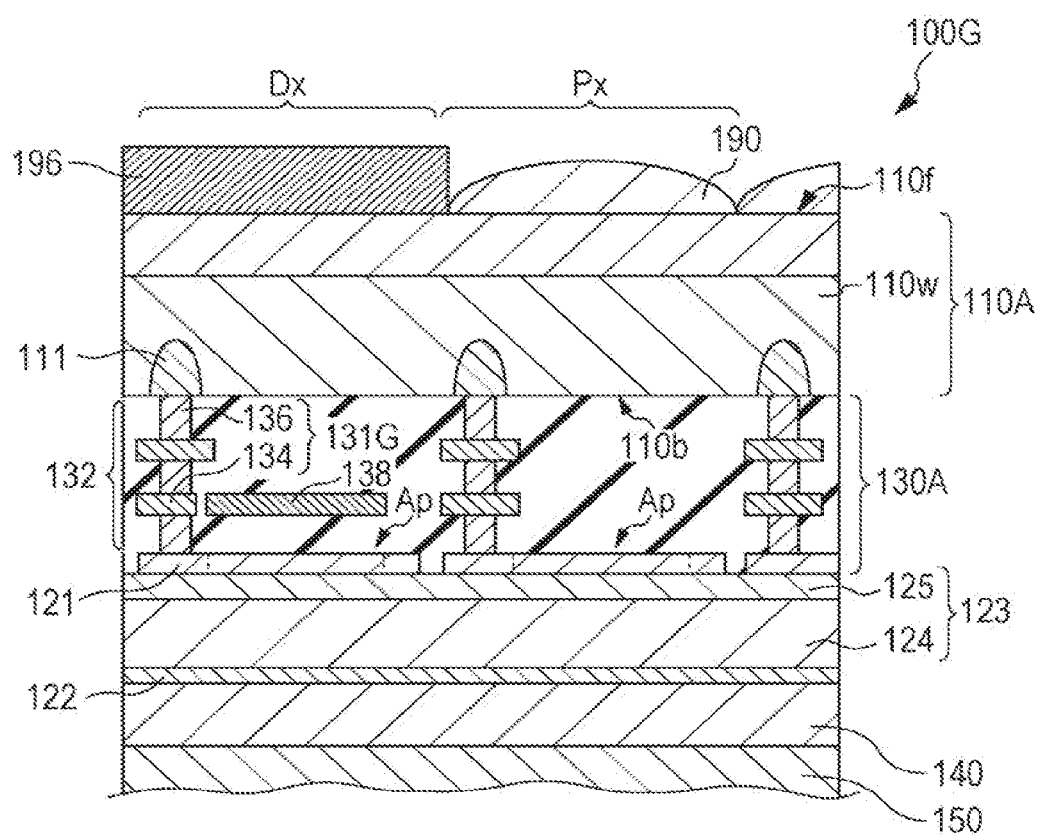
FIG. 33 is a schematic sectional view illustrating another modification example of a device structure of pixels.

FIG. 33 schematically illustrates another modification example of a device structure of pixels. An imaging device 100G illustrated in FIG. 33 includes the aforementioned pixels Px and additionally a pixel Dx provided with a light-shielding film 196 on the first surface 110f side of the semiconductor substrate 110A. The light-shielding film 196 is typically formed of a metal material that does not transmit visible light such as Ti, or a metal compound material that does not transmit visible light such as TiN. Here, instead of the semiconductor substrate 110A, the semiconductor substrate 110B, 110C, or 110D including the photodiodes 110P may be applied to the pixels Px and the pixel Dx.

For example, when the imaging device 100G includes multiple pixels Px two-dimensionally arrayed, the pixel Dx is disposed outside an imaging area formed of the two-dimensional array of the pixels Px. As illustrated, the pixel Dx basically has the same photoelectric conversion structure as the pixels Px except that the light-shielding film 196 is disposed on the first surface 110f in place of the microlens 190. For this reason, the first transistor 111 of the pixel Dx is capable of outputting a signal according to an amount of signal charges collected by the pixel electrode 121 of the pixel Dx. Since the light-shielding film 196 is disposed on an area for the pixel Dx in the first surface 110f of the semiconductor substrate 110A, the imaging device provided with the pixel Dx is enabled to obtain a signal level under dark conditions from the first transistor 111 of the pixel Dx.

In the structure illustrated in FIG. 33, a multilayer wire 131G disposed in the insulating layer 130A includes, at a portion thereof, a light-shielding portion 138 that substantially covers the pixel electrode 121 of the pixel Dx. The light-shielding portion 138 is provided at a position at least partially overlapping the light-shielding film 196 in plan view. Here, "substantially covers the pixel electrode 121" means to cover, in plan view, a portion of the pixel electrode 121 located above an area of the photoelectric conversion film 124 which contributes to the generation of signal charges. For example, as in the example illustrated in FIG. 33, when the pixel electrode 121 includes an aperture Ap, the light-shielding portion 138 may be located right above the aperture Ap of the pixel electrode 121 of the pixel Dx.

In the example illustrated, the light-shielding portion 138 is composed of a part of a wiring layer 134, which is one layer above the pixel electrode 121. When the pixel electrode 121 is formed of a material that transmits light in the infrared region as in the example described in reference to FIGS. 6 to 8, the light-shielding portion 138 is formed in the insulating layer 130A such that the light-shielding portion 138 covers the area of the pixel electrode 121 excluding the extended portion 121d provided with the connecting portion 121c to which the conductive structure 132 is connected.

As described above, the multilayer wire 131G is formed of, for example, Cu, and the light-shielding portion 138, which is a part of the multilayer wire 131G, does not transmit infrared light transmitted through the semiconductor substrate 110A. As in this example, the structure in which the light-shielding portion 138 is preliminarily disposed between the photoelectric converter 120 and the semiconductor substrate located in front of the photoelectric converter 120 makes it possible to suppress incidence of the infrared light onto a portion of the photoelectric converter 120 inside the pixel Dx even when the shielding of the infrared light by the light-shielding film 196 is insufficient. The suppression of incidence of infrared light makes it possible to prevent the signal level under dark conditions from varying due to the generation of charge pairs attributable to the incidence of infrared light.

The light-shielding portion 138 may be a part of the conductive structure 132 or a part of the other wire, or may be electrically floating by being isolated from the other wire and the like. The light-shielding portion 138 is not limited to one composed of a single member, but may include multiple portions disposed so as to substantially cover the pixel electrodes 121 as a whole in plan view.

Figure 34:
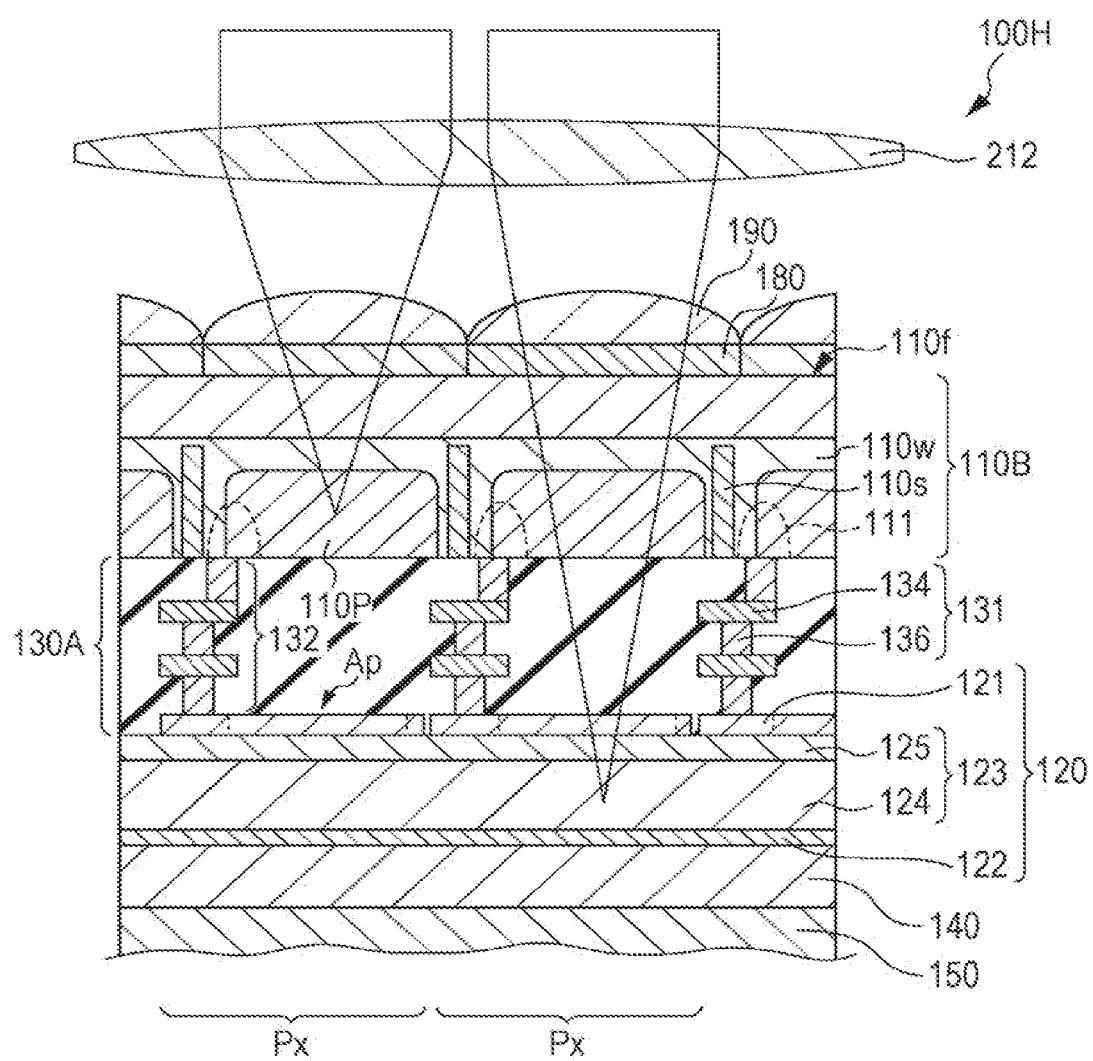
FIG. 34 is a schematic sectional view illustrating still another modification example of a device structure of pixels.

FIG. 34 schematically illustrates still another modification example of a device structure of pixels. An imaging device 100H illustrated in FIG. 34 includes, for example, one or more pixels Px two-dimensionally arrayed, and a lens 212 dispose in further front of microlenses 190 provided corresponding to the respective pixels Px. The lens 212 may be one of lenses in a group constituting the lens optical system 210 (see FIG. 30).

In the structure illustrated in FIG. 34, each of the pixels Px has the same structure as the pixels Px of the imaging device 100B illustrated in FIG. 22. More specifically, each of the pixels Px includes the photodiode 110P formed in the semiconductor substrate 110B at a portion thereof, and is configured to be capable of obtaining information on the intensity of the component in the visible region in incident light though, for example, the second transistor 112 not illustrated in FIG. 34 (see FIG. 23, for example).

As is well known, the focus position of parallel light incident on a lens in parallel to the optical axis differs depending on the wavelength. In other words, chromatic aberration occurs. Here, the "focus position" means a position of a screen on which a beam has a minimum diameter. Due to the axial chromatic aberration, the longer the wavelength of light, the farther from the lens the position at which the light converges. More specifically, infrared light having a wavelength longer than or equal to 1100 nanometers is focused on a deeper position in the pixel Px than visible light (for example, light having a wavelength of 400 nanometers to 700 nanometers) is.

As described above, according to the second embodiment of the present disclosure, it is possible to obtain information on the intensity of the component in the infrared region in incident light through the first transistor 111 having the connection with the photoelectric converter 120 and additionally obtain information on the intensity of the component in the visible region in the incident light through the second transistor 112. In a typical embodiment of the present disclosure, both of the component in the infrared region and the component in the visible region in incident light enter the photoelectric converter 120 or the photodiodes 110P through the common lens optical system and microlenses. At this time, the gap between the focus position of the visible light and the focus position of the infrared light may be longer than or equal to 1 micrometer. In an embodiment to be described later in which the substrate in which the photodiodes 110P are formed and the substrate on which the photoelectric converter 120 is stacked are different substrates, the distance between the focus position of the visible light and the focus position of the infrared light may be longer than or equal to 30 micrometers.

The lens 212 is designed such that the component in the visible region in incident light is focused on the photodiodes 110P and the component in the infrared region is focused on the photoelectric conversion film 124 located farther from the first surface 110f of the semiconductor substrate 110B. For example, the lens 212 may be designed to converge light having a wavelength longer than or equal to 1.1 μm at a position apart from the focus position of visible light by longer than or equal to 1 μm.

In an embodiment of the present disclosure, the photoelectric converter 120 that generates signals relating to the intensity of infrared light is located farther from a subject than the photodiodes 110P that detect visible light. With the structure in which the photoelectric converter 120 is disposed at a deeper position in the pixel Px than the photodiodes 110P are as described above, the axial chromatic aberration is utilized rather advantageously such that the focus position of visible light can be set inside the photodiodes 110P, while the focus position of infrared light can be set inside the photoelectric conversion film 124 as schematically illustrated in FIG. 34 or inside the waveguide structures in the insulating layer 130B (see FIGS. 27 and 28).

The lenses in the group including the lens 212 in the lens optical system may be each formed of glass or a polymer. The lens optical system may include a combination of an optical member formed of glass and an optical member formed of a polymer. With the structure in which the photoelectric converter 120 is disposed at the deeper position in the pixel Px than the photodiodes 110P are, it is possible to select a combination of materials having a small difference in refractive index as materials for different optical members in the lens optical system. This contributes to reductions in design cost and manufacturing cost of the lens optical system. In addition, since the band of infrared light is broader than the band of visible light, the focus position of infrared light may spread in a wider range than in the case of visible light. For this reason, the disposition of the photoelectric converter 120 at the deeper position in the pixels Px also produces an effect of giving a larger allowance in the optical design of the microlenses 190 regarding chromatic aberration. Note that the optical members in the lens optical system may be disposed apart from each other or some or all of them may be cemented together.

Figure 35:
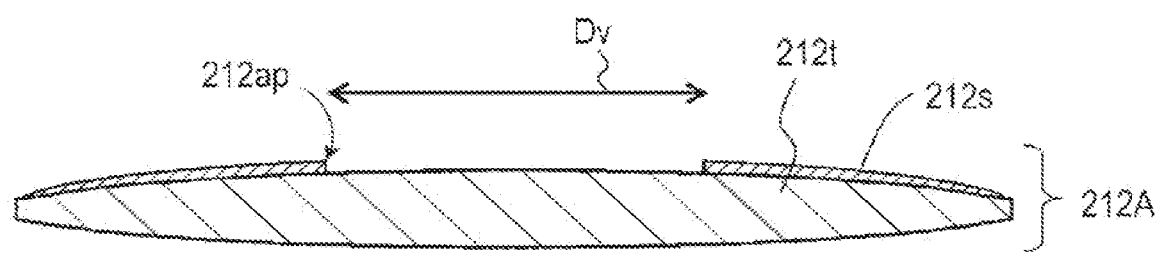
FIG. 35 is a schematic sectional view illustrating an example of a lens disposed in front of microlenses on a semiconductor substrate.

FIG. 35 illustrates an example of a lens structure of a lens disposed in front of the microlenses 190. A lens 212A illustrated in FIG. 35 is an example of the lens 212 illustrated in FIG. 34, and includes a transparent lens portion 212t and an infrared transmissive film 212s disposed on a light incident surface of the lens portion 212t. The infrared transmissive film 212s selectively transmits infrared light while blocking visible light by reflecting or absorbing the visible light. The infrared transmissive film 212s is a functional film formed in the form of an infrared transmissive material film or a dielectric multilayer film.

As illustrated in FIG. 35, the infrared transmissive film 212s includes an aperture 212ap in the center, and annularly covers the light incident surface of the lens portion 212t. In other words, an area around the center of the light incident surface of the lens portion 212t is exposed from the infrared transmissive film 212s. Since the infrared transmissive film 212s reflects or absorbs visible light, the substantial size of the aperture stop for the component in the visible region in incident light is determined by the diameter of the aperture 212*ap*, which is indicated by a double-sided arrow Dv in FIG. 35. On the other hand, the infrared transmissive film 212*s* transmits infrared light. Thus, when the lens 212A is applied to the lens optical system, the aperture stop for the component in the infrared region in incident light is substantially an open aperture. In other words, use of the lens 212A makes it unnecessary to prepare individual optical systems respective for visible light and infrared light in the wavelength region of, for example, longer than or equal to 1.1 µm, and enables different F values to be obtained for these types of light with a static structure.

The structure capable of obtaining different F values for visible light and infrared light as in this example is particularly useful for application in an imaging system or the like including an active light source 240 that emits infrared light to a subject in synchronization with the imaging device as illustrated in FIG. 30. For example, when the lens 212A is applied, the F value obtained for infrared light is smaller than that for visible light, and accordingly a brighter image can be captured, which is advantageous for long-distance sensing. Here, it is generally known that the diffraction limit is proportional to the wavelength and the magnitude of the F value. The wavelength of infrared light is longer than that of visible light. Therefore, even though the aperture stop for the component in the infrared region is substantially the open aperture, it can be said that the influence on a decrease in the diffraction limit is small.

The larger the aperture stop, in other words, the smaller the F value, the smaller the depth of field in close-range imaging where the distance to a subject is short. However, imaging with infrared light is often used for long-range sensing rather than close-range imaging. In the imaging in which the focus is set for a long distance in advance, the brightness may be prioritized over the resolution. For this reason, it is acceptable that the depth of field becomes small due to the small F value. If a light source that emits eye-safe light is used as the light source 240, a relatively large output can be easily achieved, and thus a brighter image can be easily obtained. From this viewpoint, imaging with infrared light is advantageous for long-range imaging.

On the other hand, imaging based on visible light is usually executed under ambient light. By using a lens including the infrared transmissive film 212*s* as illustrated in FIG. 35, it is possible to obtain a large F value for the visible region while obtaining the open aperture for infrared light. In other words, a large diffraction limit for visible light can be maintained. In this case, as cells including the photodiodes 110P are disposed more densely, the resolution is enhanced. For example, as in the imaging device 100C described in reference to FIGS. 25 and 26, the form in which multiple cells CE are disposed in each pixel Px is advantageous from the viewpoint of achieving a higher resolution for visible light. In the structure illustrated in FIGS. 25 and 26, the size of the area of the photoelectric converter 120 that contributes to imaging in the infrared region in each pixel Px is larger than the size of the photodiode 110P, which is also advantageous for capturing bright images. In this way, the imaging in the infrared region using the photoelectric converter 120 or the imaging in the visible region using the photodiodes 110P, which can easily achieve relatively high resolution without relying on a particular light source, may be selectively used depending on a distance to a subject.

Figure 36:
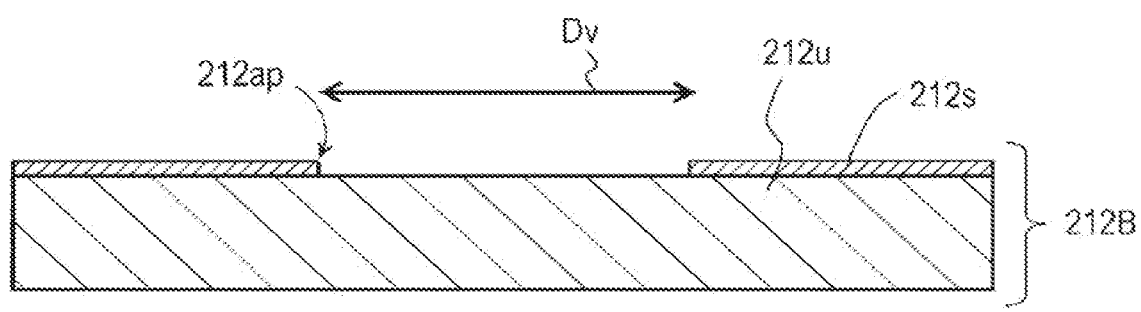
FIG. 36 is a schematic sectional view illustrating another example of an optical member having an infrared transmissive film on a light incident surface thereof.

Instead of the lens 212A, a plate-shaped optical member 212B including an infrared transmissive film 212*s* on a light incident side as illustrated in FIG. 36 may be applied to the lens optical system. In the structure illustrated in FIG. 36, the infrared transmissive film 212*s* is disposed on a transparent support member 212*u* formed of glass or the like, and is also provided with an aperture 212*ap* in the center as in the example of the lens 212A illustrated in FIG. 35. An outer shape of the optical member 212B may be any, and may be, for example, a rectangular shape or a circular shape. Even with this structure, it is possible to obtain different F values for visible light and infrared light. For example, the aperture stop for the component in the infrared region in incident light may be substantially set to an open aperture.

Figure 37:
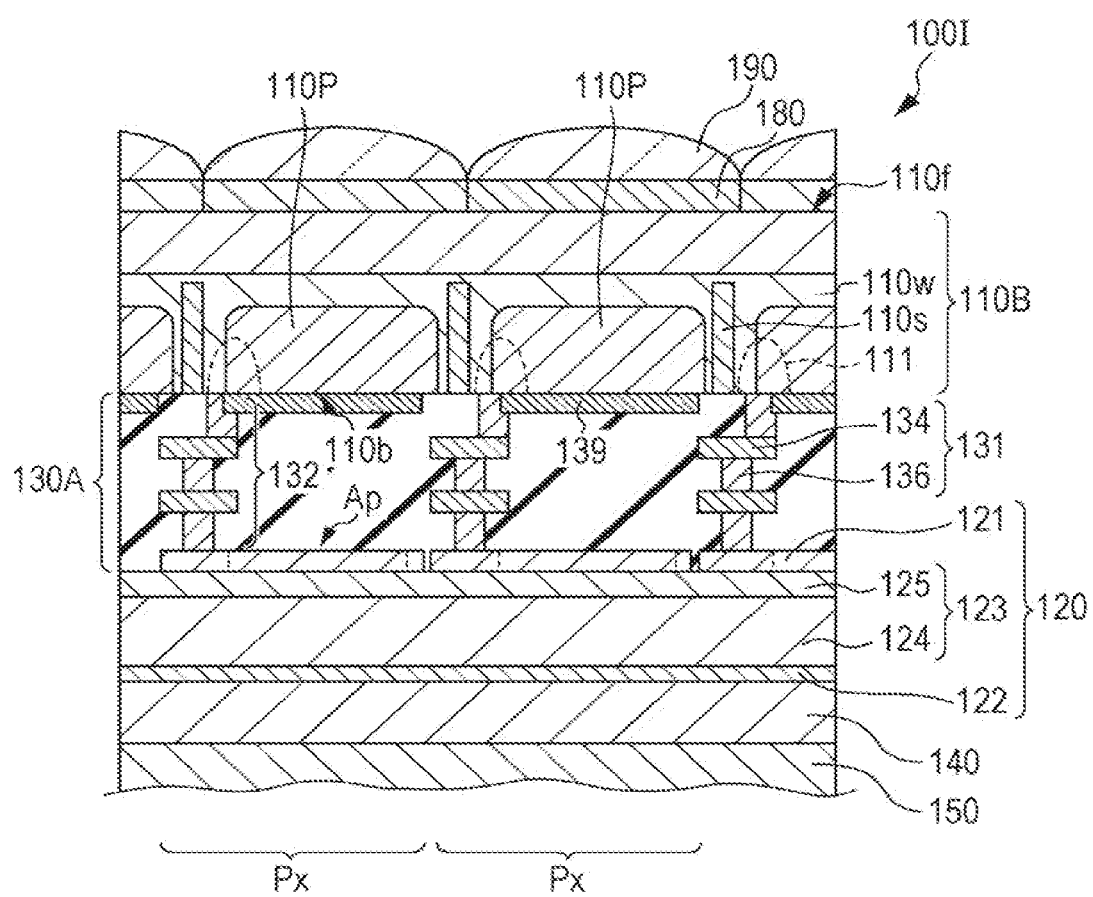
FIG. 37 is a schematic sectional view illustrating still another example of a device structure of pixels.

FIG. 37 schematically illustrates still another modification example of a device structure of pixels. An imaging device 100I illustrated in FIG. 37 has almost the same structure as the imaging device 100B illustrated in FIG. 22 in that the imaging device 100I includes a semiconductor substrate 110B in which one or more photodiodes 110P are formed, a photoelectric converter 120 disposed on a second surface 110*b* side of the semiconductor substrate 110B, and an insulating layer 130A located between the semiconductor substrate 110B and the photoelectric converter 120. The imaging device 100B illustrated in FIG. 22 and the imaging device 100I illustrated in FIG. 37 are mainly different in that the imaging device 100I further includes a reflective film 139 provided on the second surface 110*b* of the semiconductor substrate 110B and configured to selectively transmit infrared light while reflecting visible light.

The reflective film 139 reflects visible light while transmitting infrared light having a wavelength, for example, longer than or equal to 1.1 µm. When the reflective film 139 is disposed between the second surface 110*b* of the semiconductor substrate 110B and the photoelectric converter 120, at least part of a component in the visible region transmitted through the semiconductor substrate 110B is reflected and returned to the photodiodes 110P. In other words, an effect of improving an external quantum efficiency for visible light can be expected. In the structure illustrated in FIG. 37, the reflective film 139 is disposed on each of areas corresponding to the respective photodiodes 110P in the second surface 110*b* of the semiconductor substrate 110B.

The reflective film 139 is typically a dielectric multilayer film, and, for example, a thin film for use in an optical member which is commercially available under the name of "cold mirror" may be applied. Before the step of forming the insulating layer 130A (see FIG. 18), the reflective film 139 to be interposed between the semiconductor substrate 110B and the insulating layer 130A may be formed by depositing a material for the reflective film 139 on the second surface 110*b* of the semiconductor substrate 110S and then patterning the deposited material. Needless to say, the semiconductor substrate 110C (see FIG. 25) in which multiple photodiodes 110P are formed in each pixel Px may be applied instead of the semiconductor substrate 110B, and the insulating layer 130B internally including the waveguide structures 134A or 135B may be applied instead of the insulating layer 130A.

Figure 38:
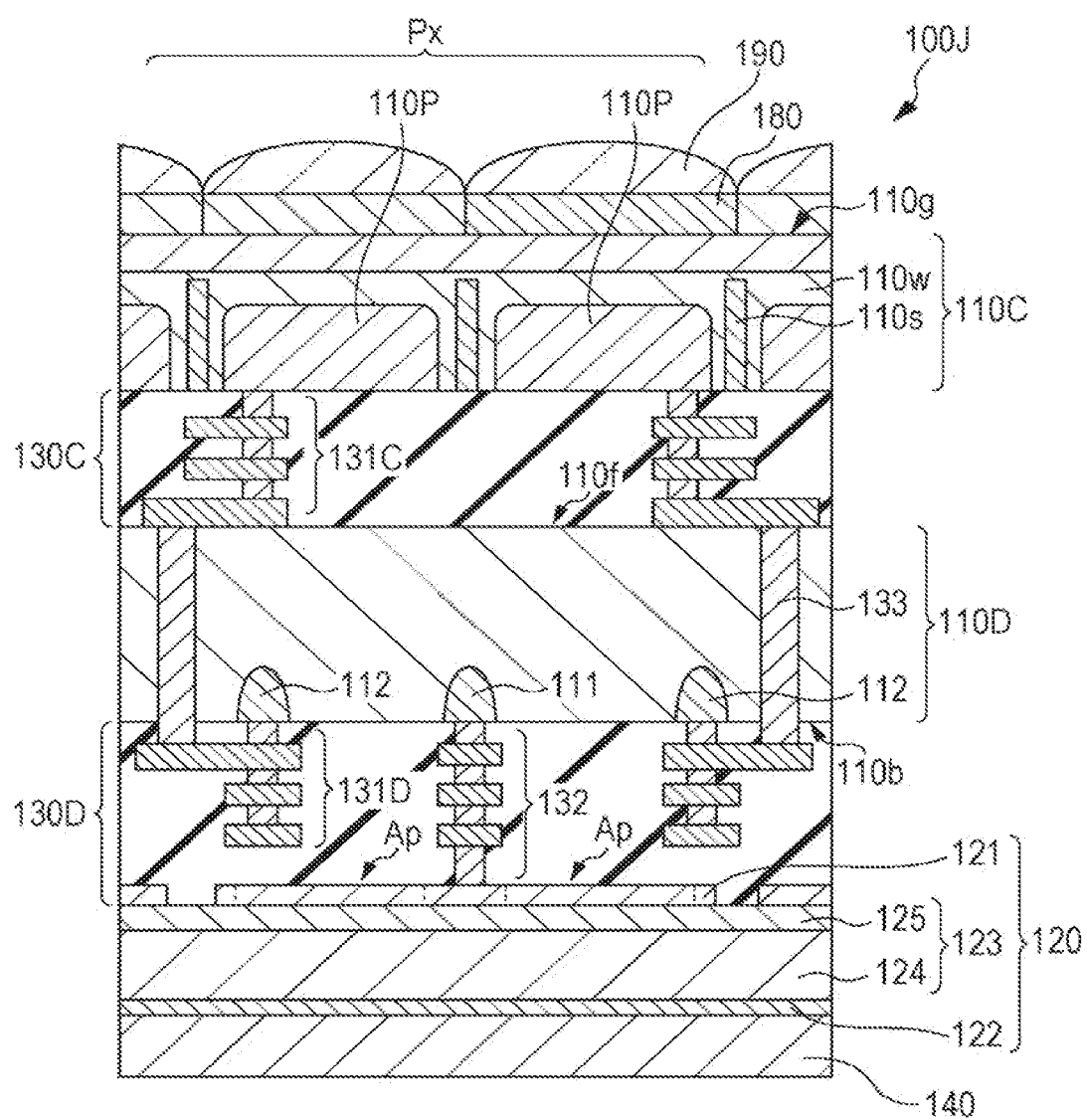
FIG. 38 is a schematic sectional view illustrating still another example of a device structure of pixels in an imaging device according to an embodiment of the present disclosure.

FIG. 38 illustrates still another embodiment of the imaging device according to the embodiment of the present disclosure. A pixel Px of an imaging device 100J illustrated in FIG. 38 includes a part of a photoelectric converter 120 and a part of a semiconductor substrate 110C located in front of the photoelectric converter 120 and in which multiple photodiodes 110P are formed.

In the structure illustrated in FIG. 38, the imaging device 100J includes the semiconductor substrate 110C, and a semiconductor substrate 110D internally including multiple through electrodes 133. Multiple microlenses 190 are disposed, for example, corresponding to the respective multiple photodiodes 110P above one main surface 110g of the semiconductor substrate 110C opposite to the semiconductor substrate 110D. In other words, light from a subject is incident on the imaging device 100J from the one main surface 110g side of the semiconductor substrate 110C.

An insulating layer 130C is located between the semiconductor substrate 110C and the semiconductor substrate 110D. The insulating layer 130C internally includes a multilayer wire 131C. As schematically illustrated in FIG. 38, the multilayer wire 131C in the insulating layer 130C has a conductive structure that electrically connects each photodiode 110P in the semiconductor substrate 110C to the corresponding through electrode 133 in the semiconductor substrate 110D. In addition, an insulating layer 130D in which a multilayer wire 131D is disposed is located between the semiconductor substrate 110D and the photoelectric converter 120. As illustrated, the through electrode 133 electrically connects the conductive structure at the first surface 110f side, which is beside the semiconductor substrate 110C, of the semiconductor substrate 110D to the multilayer wire 131D at the second surface 110b side opposite to the first surface 110f.

In the example illustrated in FIG. 38, multiple first transistors 111 and second transistors 112 are formed in the second surface 110b of the semiconductor substrate 110D. The multilayer wire 131D in the insulating layer 130D includes, at portions thereof, a conductive structure 132 that electrically connects each pixel electrode 121 of the photoelectric converter 120 to the corresponding first transistor 111, and a portion that electrically connects each through electrode 133 to the corresponding second transistor 112. In this example, the first transistors 111 and the second transistors 112 are formed in the semiconductor substrate 110D. Alternatively, it does not matter that the detection circuits including the first transistors 111, the second transistors 112, and so on are formed in the semiconductor substrate 110C.

As will be described later, roughly speaking, the structure illustrated in FIG. 38 can be obtained by bonding together a first semiconductor substrate 110C including multiple photodiodes 110P and a second semiconductor substrate 110D supporting a photoelectric converter 120. It can be said that a portion drawn under the insulating layer 130C in FIG. 38 has a structure similar to that of the imaging device 100A illustrated in FIG. 1, except that the through electrodes 133 are formed in the semiconductor substrate 110D and the second transistors 112 are formed on the second surface 110b side.

As the semiconductor substrates 110C and 110D, semiconductor substrates mainly containing silicon such as Si substrates are used as is the case with the foregoing semiconductor substrates 110A and 110B. Out of light incident on the main surface 110g of the semiconductor substrate 110C, a component having a wavelength shorter than 1.1 μm enters the photodiodes 110P and thereby generates signal charges based on the intensity of the light having the wavelength shorter than 1.1 μm (typically, the intensity of visible light). The second transistors 112 electrically connected to the photodiodes 110P detect the signal charges based on the intensity of the light having the wavelength shorter than 1.1 μm.

Here, the semiconductor substrate 110C may typically have a thickness smaller than that of the semiconductor substrate 110B in the structure described in reference to FIG. 22. For this reason, the distance between the main surface 110g and the photodiodes 110P in the semiconductor substrate 110C of the structure illustrated in FIG. 38 is typically smaller than the distance between the first surface 110f and the photodiodes 110P in the semiconductor substrate 110B of the structure illustrated in FIG. 22. In other words, the photodiodes 110P of the imaging device 100J illustrated in FIG. 38 are located at relatively shallow portions that are closer to the surface of the semiconductor substrate on which the color filter 180 and so on are disposed than in the imaging device 100B illustrated in FIG. 22. Thus, with the structure illustrated in FIG. 38, the reduced thickness of the semiconductor substrate makes it possible to suppress attenuation in the amount of light incident on the photodiodes 110P. In other words, the sensitivity for the visible region can be improved.

With the reduced thickness of the semiconductor substrate, a portion passing through the photodiodes 110P out of light having the wavelength shorter than 1.1 μm may be increased. However, such a component is sufficiently attenuated in the course of passing through the insulating layer 130C, the semiconductor substrate 110D, and the insulating layer 130D before reaching the photoelectric converter 120. In particular, having a thickness of, for example, about 30 μm or more, the semiconductor substrate 110D functions as a filter that blocks light having a wavelength shorter than 1.1 μm.

On the other hand, out of light incident on the main surface 110g of the semiconductor substrate 110C, a component having a wavelength longer than or equal to 1.1 μm is transmitted through the semiconductor substrate 110C, the insulating layer 130C, the semiconductor substrate 110D, and the insulating layer 130D and reaches the photoelectric conversion layer 123 through the apertures Ap of the pixel electrodes 121. The main photoelectric conversion material for the photoelectric conversion layer 123 absorbs light having the first wavelength Xi, so that an image signal relating to the intensity, in particular, the first wavelength Xi longer than or equal to 1.1 μm can be obtained as in the examples described above.

Figure 39:
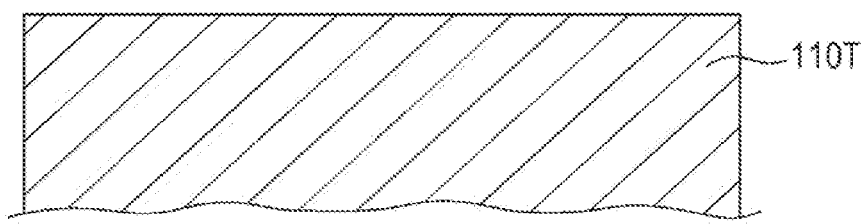
FIG. 39 is a schematic sectional view for explaining an exemplary method of manufacturing the imaging device illustrated in FIG. 38.

Hereinafter, a method of manufacturing the imaging device 100J illustrated in FIG. 38 will be briefly described. First, as illustrated in FIG. 39, a semiconductor substrate 110T mainly containing silicon is prepared. Here, a P-type Si substrate is illustrated as the semiconductor substrate 110T.

Figure 40:
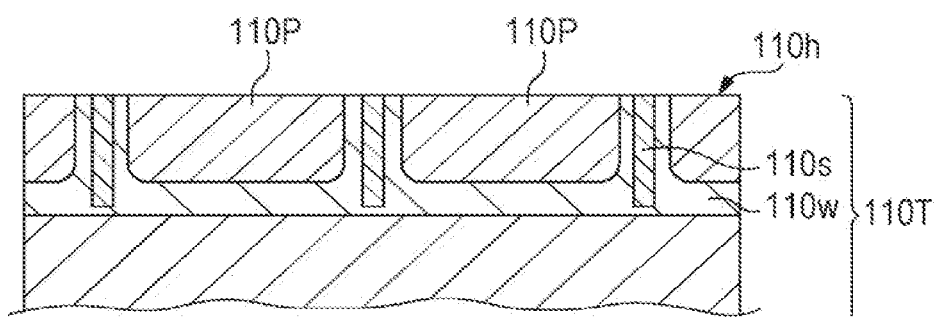
FIG. 40 is a schematic sectional view for explaining the exemplary method of manufacturing the imaging device illustrated in FIG. 38.

Next, by ion implantation or the like from one main surface 110h side of the semiconductor substrate 110T, the well 110W, the photodiodes 110P, and the element isolation regions 110s, and so on are formed on the main surface 110h side as schematically illustrated in FIG. 40. In this process, the first transistors 111 and/or the second transistors 112 may be formed on the main surface 110h side.

Figure 41:
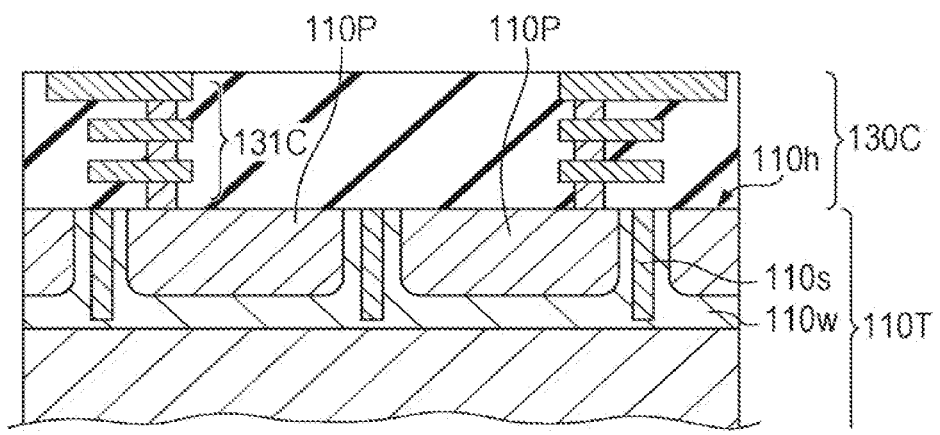
FIG. 41 is a schematic sectional view for explaining the exemplary method of manufacturing the imaging device illustrated in FIG. 38.

Next, the insulating layer 130C covering the main surface 110h of the semiconductor substrate 110T is formed as illustrated in FIG. 41 in the same way as in the step of forming the insulating layer 130A described in reference to FIG. 18. In this process, the multilayer wire 131C having electric connections with the photodiodes 110P is formed inside the insulating layer 130C. As in the example of the imaging device 100I described in reference to FIG. 37, a reflective layer that reflects visible light while transmitting infrared light having a wavelength longer than or equal to 1.1 μm may be provided on the main surface 110h of the semiconductor substrate 110T. In this case, the reflective film 139 may be formed on the main surface 110h of the semiconductor substrate 110T before the insulating layer 130C and the multilayer wire 131C are formed.

Figure 42:
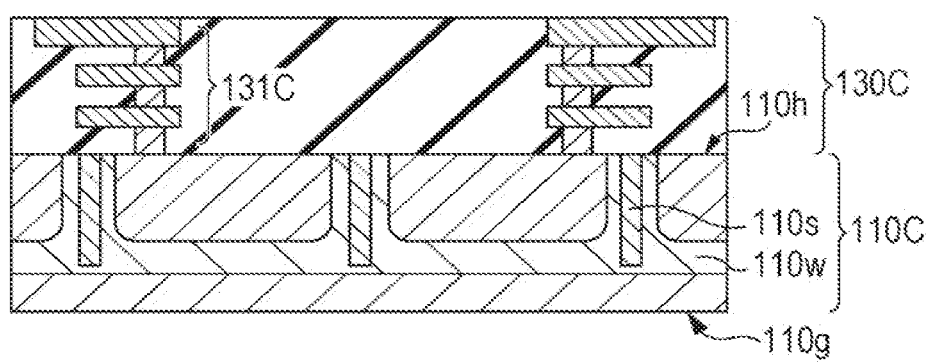
FIG. 42 is a schematic sectional view for explaining the exemplary method of manufacturing the imaging device illustrated in FIG. 38.

Subsequently, the thickness of the semiconductor substrate 110T is reduced by grinding or polishing the semiconductor substrate 110T from the main surface side opposite to the main surface 110h as schematically illustrated in FIG. 42. The thinned semiconductor substrate 110T, in other words, the semiconductor substrate 110C may have a thickness smaller than that of the semiconductor substrate 110D. By thinning the semiconductor substrate 110T, the above-mentioned main surface 110g is formed on the side opposite to the main surface 110h. After that, if necessary, a passivation film is formed on the insulating layer 130C. In this process, for electric connections with the through electrodes 133 to be described later, parts of the passivation film are removed by patterning and parts of the multilayer wire 131C are exposed from the passivation film.

Figure 43:
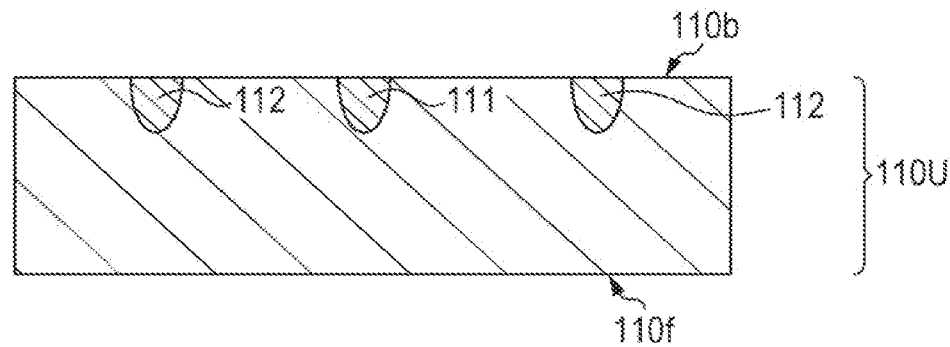
FIG. 43 is a schematic sectional view for explaining the exemplary method of manufacturing the imaging device illustrated in FIG. 38.

Further, separately from the semiconductor substrate 110T, a semiconductor substrate 110U is prepared which has a first surface 110f and a second surface 110b opposite to the first surface 110f, and mainly contains silicon. Here, a P-type Si substrate is illustrated as the semiconductor substrate 110U. Next, as illustrated in FIG. 43, the well, the first transistors 111, the second transistors 112, the element isolation regions, and so on are formed on the second surface 110b side of the semiconductor substrate 110U as in the example described in reference to FIG. 17. Thus, the aforementioned semiconductor substrate 110D is obtained from the semiconductor substrate 110U. In this process, a junction capacitance for temporarily holding signal charges generated by the photoelectric converter 120 may be formed on the second surface 110b side of the semiconductor substrate 110U.

Figure 44:
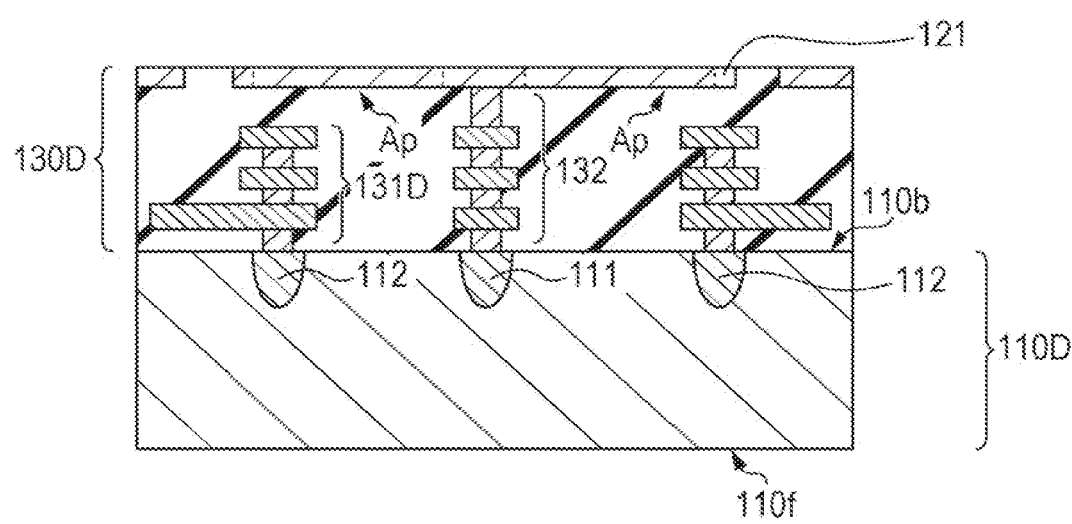
FIG. 44 is a schematic sectional view for explaining the exemplary method of manufacturing the imaging device illustrated in FIG. 38.

Next, as in the example described in reference to FIG. 18, the insulating layer 130D covering the transistors and the like on the second surface 110b of the semiconductor substrate 110D and the multilayer wire 131D having electric connections with the first transistors 111 and the second transistors 112 are formed on the second surface 110b as illustrated in FIG. 44. Further, the pixel electrodes 121 are formed in the vicinity of the upper surface of the insulating layer 130D.

Figure 45:
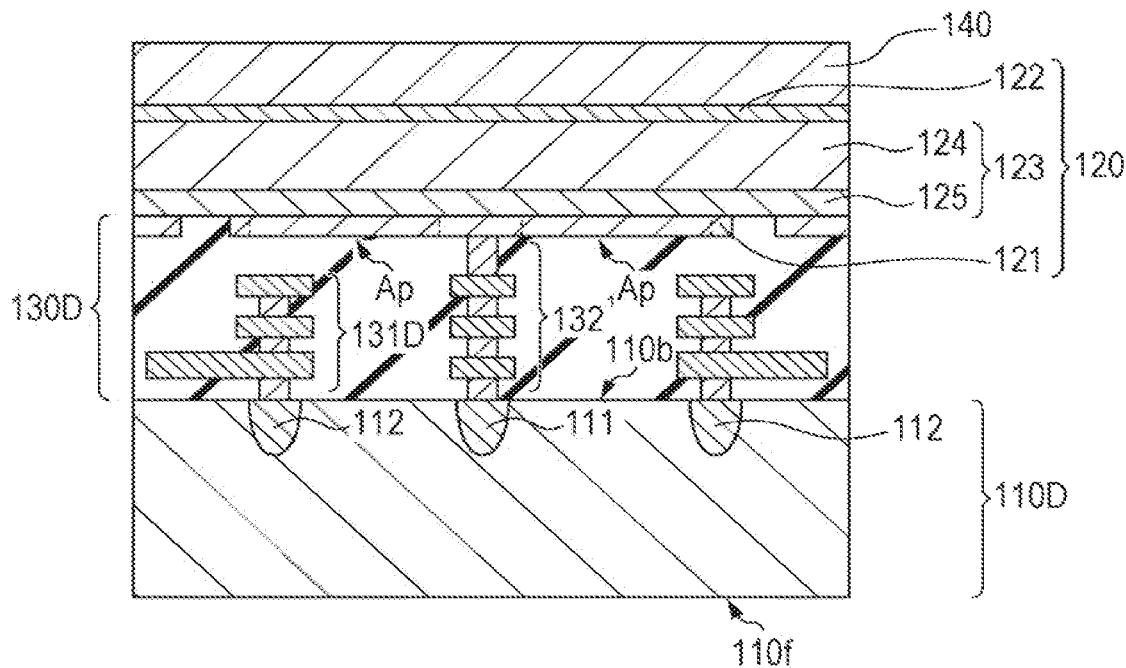
FIG. 45 is a schematic sectional view for explaining the exemplary method of manufacturing the imaging device illustrated in FIG. 38.

Subsequently, the photoelectric conversion layer 123 and the counter electrode 122 are formed in this order on the pixel electrodes 121 as in the example described in reference to FIG. 19, so that the photoelectric converter 120 is formed on the insulating layer 130D as illustrated in FIG. 45. Typically, the sealing film 140 covering the counter electrode 122 is further formed in the form of an insulating film or a metal film.

Figure 46:
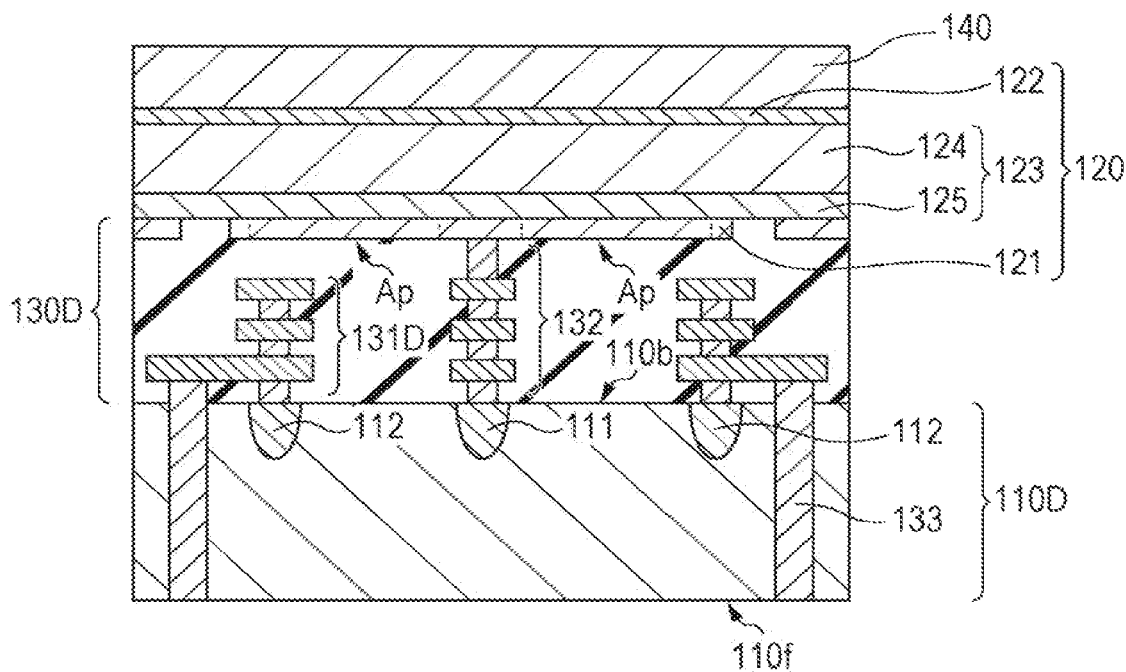
FIG. 46 is a schematic sectional view for explaining the exemplary method of manufacturing the imaging device illustrated in FIG. 38.

Subsequently, as illustrated in FIG. 46, the through electrodes 133 are formed in the semiconductor substrate 110D. A known semiconductor process may be applied to the formation of the through electrodes 133. Note that the through electrodes 133 may be disposed inside the pixels Px or the through electrodes 133 may be disposed in an area outside an array of multiple pixels Px instead of being provided inside the pixels Px.

Figure 47:
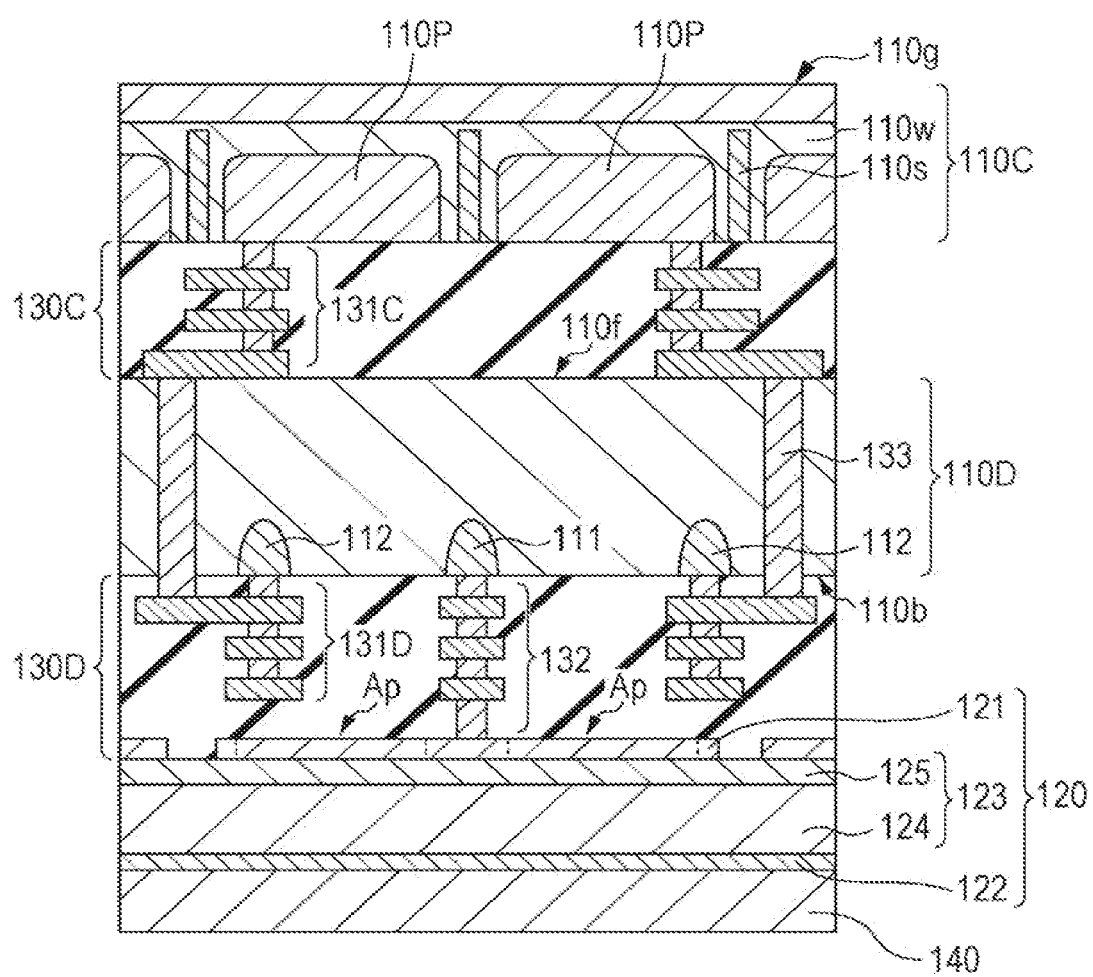
FIG. 47 is a schematic sectional view for explaining the exemplary method of manufacturing the imaging device illustrated in FIG. 38.

Next, as illustrated in FIG. 47, the structure illustrated in FIG. 42 and the structure illustrated in FIG. 46 are united together by bonding. In the bonding, the first surface 110f of the semiconductor substrate 110D is opposed to the insulating layer 130C, and the multilayer wire 131C in the insulating layer 130C is electrically connected to the through electrodes 133 provided in the semiconductor substrate 110D. Thus, the photodiodes 110P in the semiconductor substrate 110C are electrically connected to the corresponding second transistors 112 through the multilayer wire 131C in the insulating layer 130C, the through electrodes 133 in the semiconductor substrate 110D, and the multilayer wire 131D in the insulating layer 130D. The bonding of the structure illustrated in FIG. 42 and the structure illustrated in FIG. 46 may use any of known methods such as diffusion bonding, normal temperature bonding, or anodic bonding. Here, the electric connections between the photodiodes 110P in the semiconductor substrate 110C and the second transistors 112 are not limited to the bonding via the through electrodes 133 but may be connections via Cu bonding or the like. Also, the way of connecting the structure illustrated in FIG. 42 and the structure illustrated in FIG. 46 is not limited to a particular method.

Typically, the color filter 180 and the microlenses 190 are further disposed on the main surface 110g side of the semiconductor substrate 110C. Through the aforementioned steps, the imaging device 100J illustrated in FIG. 38 is obtained.

Figure 48:
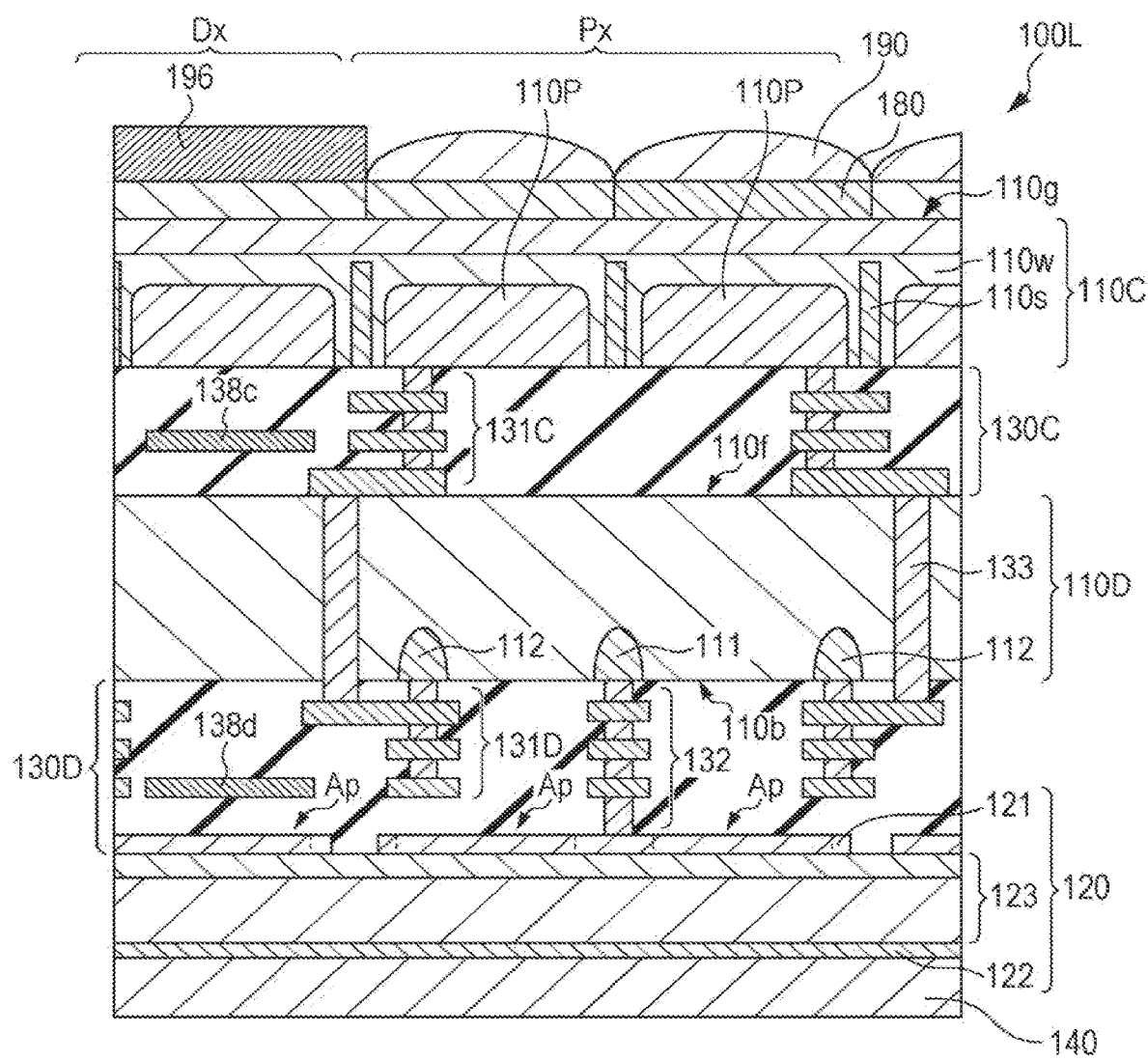
FIG. 48 is a schematic sectional view illustrating still another example of a device structure of pixels in an imaging device according to an embodiment of the present disclosure.

As in an imaging device 100L illustrated in FIG. 48, the pixel Dx having the light-shielding film 196 may be formed on the main surface 110g side of the semiconductor substrate 110C. As in the example described in reference to FIG. 33, the light-shielding film 196 has a function to block visible light.

In the structure illustrated in FIG. 48, in addition to the light-shielding film 196 located above the semiconductor substrate 110C, a light-shielding portion 138c and a light-shielding portion 138d substantially covering the pixel electrode 121 of the pixel Dx in plan view are further disposed in the insulating layer 130C and the insulating layer 130D, respectively. The light-shielding portion 138c is, for example, a part of the multilayer wire 131C, and the light-shielding portion 138d is, for example, a part of the multilayer wire 131D. The multilayer wires 131C and 131D are formed of, for example, Cu, and therefore these light-shielding portions 138c and 138d neither transmit infrared light transmitted through the semiconductor substrate 110C nor typically transmit visible light either.

When the light-shielding portion(s) is disposed in the insulating layer 130C and/or the insulating layer 130D in addition to the light-shielding film 196 located above the semiconductor substrate 110C, the incidence of infrared light on the portion inside the pixel Dx in the photoelectric converter 120 can be suppressed, which makes it possible to avoid variations in the signal level under dark conditions. When the light-shielding portion 138c and the light-shielding portion 138d are formed in the insulating layer 130C and the insulating layer 130D, respectively, and these light-shielding portions are disposed one on top of the other when viewed in plan view, infrared light transmitted through the semiconductor substrate 110C can be more effectively prevented from entering the portion inside the pixel Dx in the photoelectric converter 120.

What is claimed is:

1. An imaging device comprising:
   a semiconductor substrate including a first surface that receives light from outside, and a second surface opposite to the first surface;
   a first transistor located on the second surface; and
   a photoelectric converter that faces the second surface and that receives light transmitted through the semiconductor substrate, wherein
   the semiconductor substrate is a silicon substrate or a silicon compound substrate,
   the photoelectric converter includes
      a first electrode electrically connected to the first transistor,
      a second electrode, and a photoelectric conversion layer that is located between the first electrode and the second electrode and that contains a material which absorbs light having a first wavelength longer than or equal to 1.1 μm, and the material has a quantum nanostructure.

2. The imaging device according to claim 1, wherein the material has spectral sensitivity characteristics that demonstrate an absorption peak at the first wavelength.

3. The imaging device according to claim 1, wherein the material is carbon nanotubes.

4. The imaging device according to claim 1, wherein the material contains at least one selected from the group consisting of a Group III element, a Group IV element, a Group V element, and a Group VI element.

5. The imaging device according to claim 1, wherein
the material absorbs light having a second wavelength shorter than 1.1 μm, and
the semiconductor substrate absorbs the light having the second wavelength.

6. The imaging device according to claim 1, wherein the semiconductor substrate has a thickness of greater than or equal to 30 μm and less than or equal to 800 μm.

7. The imaging device according to claim 1, further comprising a microlens facing the first surface.

8. The imaging device according to claim 7, further comprising a conductive structure that is located between the photoelectric converter and the semiconductor substrate, and that electrically connects the first electrode to the first transistor, wherein
a connecting portion between the first electrode and the conductive structure is located outside an outer edge of the microlens when viewed in a direction normal to the first surface.

9. The imaging device according to claim 1, further comprising an insulating layer that is located between the photoelectric converter and the semiconductor substrate and that includes a waveguide structure.

10. The imaging device according to claim 1, wherein
the first electrode is located between the second surface and the photoelectric conversion layer,
the first electrode has a transmittance of more than or equal to 80% for the light having the first wavelength.

11. The imaging device according to claim 1, wherein
the first electrode is located between the second surface and the photoelectric conversion layer,
the second electrode has a reflectance of more than or equal to 80% for the light having the first wavelength.

12. The imaging device according to claim 1, further comprising a sealing film that covers the photoelectric converter.

13. The imaging device according to claim 1, further comprising a pixel, wherein
the pixel includes the photoelectric converter and the first transistor.

14. The imaging device according to claim 13, further comprising one or more photodiodes that are disposed in the semiconductor substrate and that include a first photodiode, wherein
the pixel further includes the first photodiode.

15. The imaging device according to claim 14, further comprising a second transistor that is located on the second surface and that is electrically connected to the first photodiode.

16. The imaging device according to claim 14, wherein
the one or more photodiodes include a plurality of photodiodes, and
the pixel includes the plurality of photodiodes.

17. The imaging device according to claim 13, further comprising a color filter that faces the first surface, wherein
the color filter transmits substantially no light in a wavelength region of longer than or equal to 0.75 μm and shorter than 1.1 μm.

18. The imaging device according to claim 1, further comprising a band stop filter that faces the first surface and that transmits substantially no light in a wavelength region of longer than or equal to 0.75 μm and shorter than 1.1 μm.

19. The imaging device according to claim 1, further comprising a plurality of pixels, wherein
each of the plurality of pixels includes the photoelectric converter and the first transistor, and
the photoelectric conversion layer included in the plurality of pixels is a continuous single layer.

20. An imaging system comprising:
the imaging device according to claim 1; and
a light source that emits light in a wavelength region of longer than or equal to 1.1 μm.

* * * * *